United States Patent
Takeuchi et al.

(10) Patent No.: US 12,347,721 B2
(45) Date of Patent: Jul. 1, 2025

(54) SEMICONDUCTOR DEVICE AND METHOD OF PRODUCING THE SAME, AND ELECTRONIC DEVICE

(71) Applicant: SONY SEMICONDUCTOR SOLUTIONS CORPORATION, Kanagawa (JP)

(72) Inventors: Katsuhiko Takeuchi, Kanagawa (JP); Keita Takahashi, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 381 days.

(21) Appl. No.: 17/757,182

(22) PCT Filed: Oct. 29, 2020

(86) PCT No.: PCT/JP2020/040699
§ 371 (c)(1),
(2) Date: Jun. 10, 2022

(87) PCT Pub. No.: WO2021/124706
PCT Pub. Date: Jun. 24, 2021

(65) Prior Publication Data
US 2023/0014905 A1    Jan. 19, 2023

(30) Foreign Application Priority Data
Dec. 20, 2019 (JP) .................. 2019-230359

(51) Int. Cl.
*H01L 21/768* (2006.01)
*H01L 21/67* (2006.01)
(Continued)

(52) U.S. Cl.
CPC ...... *H01L 21/768* (2013.01); *H01L 21/67063* (2013.01); *H10D 64/511* (2025.01); *H10D 84/83* (2025.01); *H10D 30/015* (2025.01)

(58) Field of Classification Search
CPC .................................... H01L 21/28026–28114
See application file for complete search history.

(56) References Cited

U.S. PATENT DOCUMENTS

| | | | |
|---|---|---|---|
| 2007/0099368 A1* | 5/2007 | Ahn | H10D 64/411 257/E29.127 |
| 2018/0182854 A1* | 6/2018 | Ozaki | H01L 29/7787 |
| 2018/0277657 A1* | 9/2018 | Yang | H10D 30/4755 |

FOREIGN PATENT DOCUMENTS

| | | |
|---|---|---|
| JP | 02-140942 A | 5/1990 |
| JP | 09-027505 A | 1/1997 |

(Continued)

OTHER PUBLICATIONS

International Search Report and Written Opinion of PCT Application No. PCT/JP2020/040699, issued on Jan. 19, 2021, 09 pages of ISRWO.

*Primary Examiner* — Amar Movva
*Assistant Examiner* — Eric Manuel Mulero Flores
(74) *Attorney, Agent, or Firm* — CHIP LAW GROUP

(57) ABSTRACT

The on-resistance of each of field effect transistors having different planar sizes is reduced. A semiconductor device includes first and second field effect transistors mounted on a semiconductor substrate and an insulating layer provided on a main surface of the semiconductor substrate. Here, each of the first and second field effect transistors includes a pair of main electrodes which are separated from each other and provided on the main surface of the semiconductor substrate, a cavity part which is provided in the insulating layer between the pair of main electrodes, and a gate electrode which has a head part positioned on the insulating layer and (Continued)

a body part that penetrates the insulating layer from the head part and protrudes toward the cavity part and in which the head part is wider than the body part. Here, the width of the cavity part of the second field effect transistor is different from the width of the cavity part of the first field effect transistor.

16 Claims, 36 Drawing Sheets

(51) Int. Cl.
*H10D 30/01* (2025.01)
*H10D 64/27* (2025.01)
*H10D 84/83* (2025.01)

(56) References Cited

FOREIGN PATENT DOCUMENTS

| JP | 11-354542 A | 12/1999 |
| JP | 2018-107372 A | 7/2018 |
| WO | 2019/176434 A1 | 9/2019 |

* cited by examiner

SEMICONDUCTOR DEVICE AND METHOD OF PRODUCING THE SAME, AND ELECTRONIC DEVICE

CROSS REFERENCE TO RELATED APPLICATIONS

This application is a U.S. National Phase of International Patent Application No. PCT/JP2020/040699 filed on Oct. 29, 2020, which claims priority benefit of Japanese Patent Application No. JP 2019-230359 filed in the Japan Patent Office on Dec. 20, 2019. Each of the above-referenced applications is hereby incorporated herein by reference in its entirety.

TECHNICAL FIELD

The present technology (technology according to the present disclosure) relates to a semiconductor device and a method of producing the same, and specifically, to a semiconductor device including a field effect transistor and a method of producing the same, and a technology that is effective when applied to an electronic device.

BACKGROUND ART

As a semiconductor device, a semiconductor device in which a field effect transistor is mounted on a compound semiconductor substrate has been focused on. PTL 1 and 2 disclose a field effect transistor in which a cavity part as a low-dielectric-constant region is provided in an insulating layer on both sides of a gate electrode in a gate length direction between a pair of main electrodes that function as a source electrode and a drain electrode. According to this field effect transistor, since it is possible to reduce a parasitic capacitance (Cgs) added between the gate electrode and one main electrode (source electrode) and a parasitic capacitance (Cgd) added between the gate electrode and the other main electrode (drain electrode), it is possible to reduce the on-resistance of the field effect transistor.

CITATION LIST

Patent Literature

[PTL 1]
JP H09-027505 A
[PTL 2]
JP H11-354542 A

SUMMARY

Technical Problem

Incidentally, in a wireless communication device in a mobile communication system or the like, a first field effect transistor constituting a high frequency switch and a second field effect transistor constituting a high frequency power amplifier have different planar sizes, and the second field effect transistor has a larger planar size. Specifically, the length between the main electrodes of the second field effect transistor and the length of the gate electrode in the gate width direction are longer. This is because, in the first field transistor constituting a high frequency switch, a low on-resistance obtained by shortening the separation distance between the pair of main electrodes is required, and in the second field effect transistor constituting a high frequency power amplifier, a high device withstand voltage obtained by increasing the separation distance between the pair of main electrodes is required. It is desired to mount such field effect transistors having different planar sizes together on the same semiconductor substrate and reduce the size of the wireless communication device.

However, a process of mounting field effect transistors having a cavity part and having different planar sizes together has not been achieved, and it has been difficult to reduce the on-resistance of each of field effect transistors having different planar sizes.

An object of the present technology is to provide a semiconductor device that can reduce an on-resistance of each of field effect transistors having different planar sizes, a method of producing the same, and an electronic device including the semiconductor device.

Solution to Problem

A semiconductor device according to an aspect of the present technology includes:
a first field effect transistor and a second field effect transistor mounted on a semiconductor substrate, and an insulating layer provided on a main surface of the semiconductor substrate,
wherein each of the first field effect transistor and the second field effect transistor includes
a pair of main electrodes which are separated from each other and provided on the main surface of the semiconductor substrate,
a cavity part which is provided in the insulating layer between the pair of main electrodes, and
a gate electrode which has a head part positioned on the insulating layer and a body part that penetrates the insulating layer from the head part and protrudes toward the cavity part and in which the head part is wider than the body part, and
wherein the width of the cavity part of the second field effect transistor is different from the width of the cavity part of the first field effect transistor.

An electronic device according to another aspect of the present technology includes the above semiconductor device.

A method of producing a semiconductor device according to still another aspect of the present technology includes:
forming a second insulating film on a first active region on a main surface of a semiconductor substrate and on a second active region different from the first active region with a first insulating film therebetween;
forming a first opening in the second insulating film on the first active region and forming a second opening in the second insulating film on the second active region;
forming a first cavity part wider than the first opening by etching the first insulating film through the first opening, and forming a second cavity part wider than the second opening by etching the first insulating film through the second opening; and
extending the width of the second cavity part by selectively etching the first insulating film through the second opening.

A method of producing a semiconductor device according to yet another aspect of the present technology includes:
forming a second insulating film on a first active region of a main surface of a semiconductor substrate and on a second active region different from the first active region with a first insulating film therebetween;

forming a pair of first etching stopper parts on one end side and the other end side of the first insulating film on the first active region in a width direction, and forming a pair of second etching stopper parts which are provided on one end side and the other end side of the first insulating film on the second active region in the width direction and between which a separation distance is longer than a separation distance between the pair of first etching stopper parts;

forming a first opening in the second insulating film on the first active region and forming a second opening in the second insulating film on the second active region; and forming a first cavity part wider than the first opening by etching the first insulating film through the first opening, and forming a second cavity part wider than the first cavity part by etching the first insulating film through the second opening.

DESCRIPTION OF EMBODIMENTS

Figure 1:
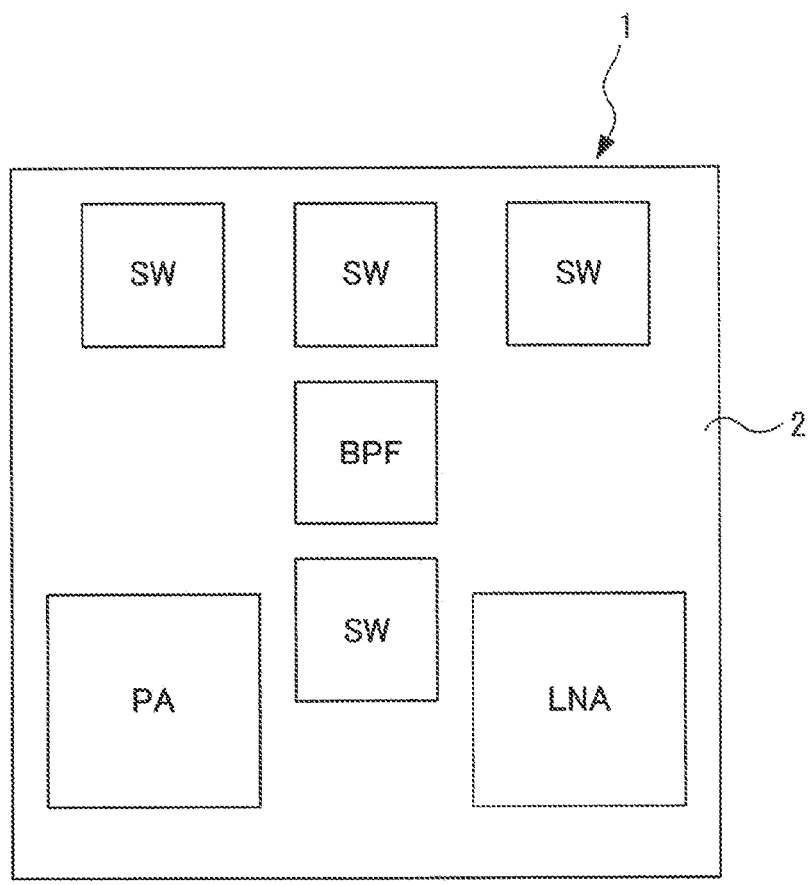
FIG. 1 is a chip layout diagram showing one configuration example of a semiconductor device according to a first embodiment of the present technology.

Embodiments of the present technology will be described below with reference to the drawings.

Here, in all drawings for describing embodiments of the present technology, those having the same function are denoted with the same reference numerals, and repeated description thereof will be omitted.

In addition, the drawings are schematic, and may differ from actual components. In addition, the following embodiments exemplify devices and methods for embodying the technical ideas of the present technology, and the configurations are not limited to those described below. That is, the technical ideas of the present technology can be variously modified within the technical scope described in the claims First Embodiment In the first embodiment, an example in which the present technology is applied to a semiconductor device in which, as field effect transistors having different separation distances between a source electrode and a drain electrode, a first field effect transistor used in a high frequency switch and a second field effect transistor used in a high frequency power amplifier are mounted together on the same semiconductor substrate will be described.

<Configuration of Semiconductor Device>

Figure 2:
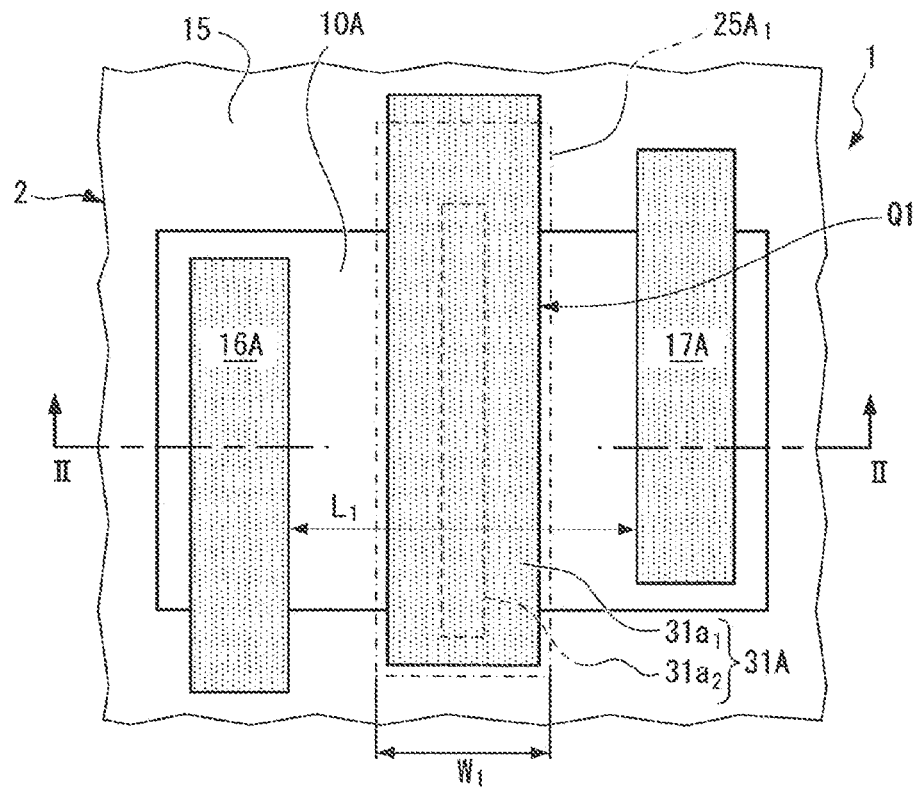
FIG. 2 is a plan view schematically showing one configuration example of a first transistor mounted on the semiconductor chip in FIG. 1.
Figure 3:
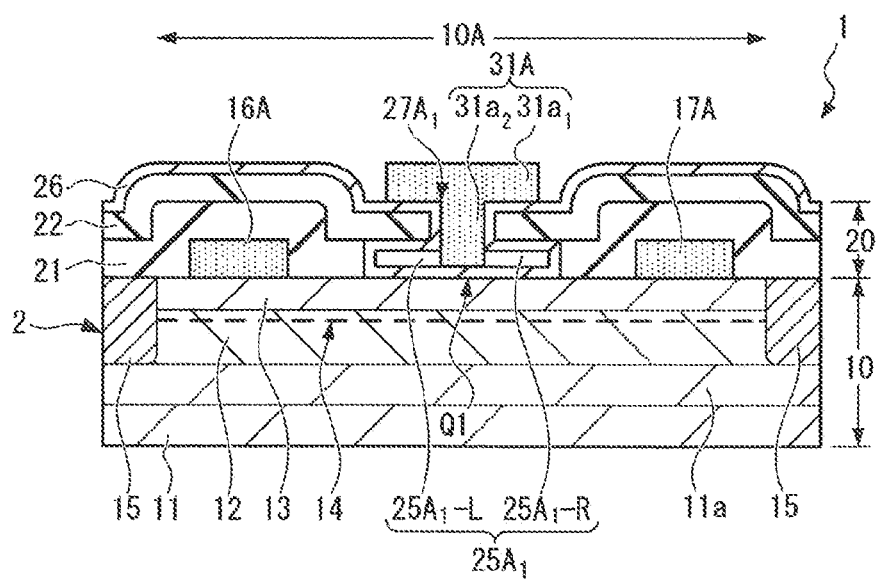
FIG. 3 is a cross-sectional view schematically showing one configuration example of a cross-sectional structure along the cutting line II-II in FIG. 1.
Figure 4:
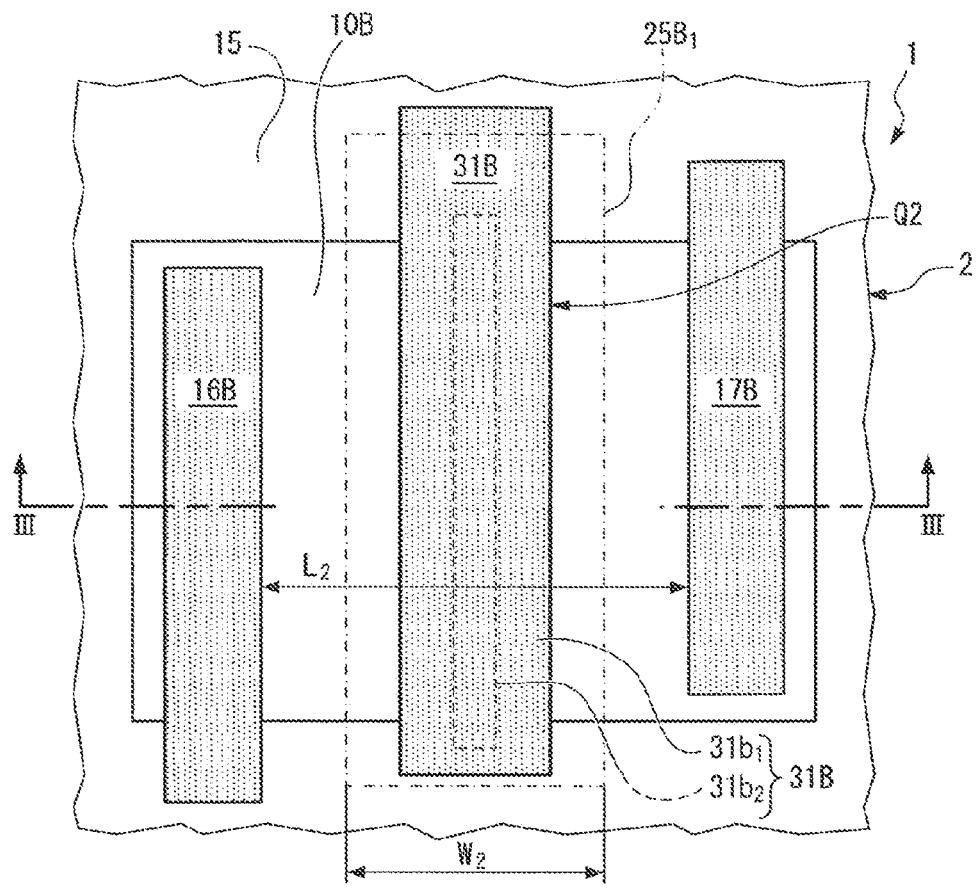
FIG. 4 is a plan view schematically showing one configuration example of a second transistor mounted on the semiconductor chip in FIG. 1.

As shown in FIG. 1, a semiconductor device 1 according to the first embodiment of the present technology is mainly composed of a semiconductor chip 2 having a rectangular two dimensional planar shape when viewed in a plan view. The semiconductor chip 2 includes a high frequency power amplifier part PA, a high frequency low noise amplifier part LNA, a high frequency filter part BPF and a high frequency switch part SW. In the high frequency switch part SW, as an element constituting a high frequency switch, a first field effect transistor Q1 shown in FIG. 2, FIG. 3 and FIG. 6 is mounted. In the high frequency power amplifier part PA, as an element constituting a high frequency power amplifier, a second field effect transistor Q2 shown in FIG. 4, FIG. 5 and FIG. 6 is mounted.

The first field effect transistor Q1 and the second field effect transistor Q2 have different planar sizes, and the planar size of the second field effect transistor Q2 is larger than the planar size of the first field effect transistor Q1. Specifically, as shown in FIG. 4 and FIG. 2, a separation distance $L_2$ between a pair of second main electrodes 16B and 17B functioning as a source electrode and a drain electrode of the second field effect transistor Q2 is longer than a separation distance $L_1$ between a pair of first main electrodes 16A and 17A functioning as a source electrode and a drain electrode of the first field effect transistor Q1.

Figure 5:
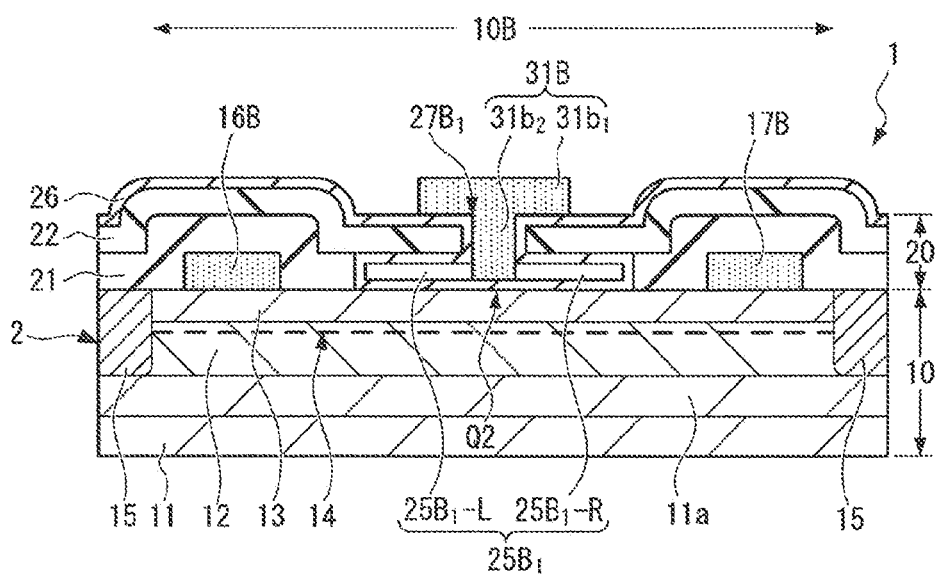
FIG. 5 is a cross-sectional view schematically showing one configuration example of a cross-sectional structure along the cutting line III-III in FIG. 4.
Figure 6:
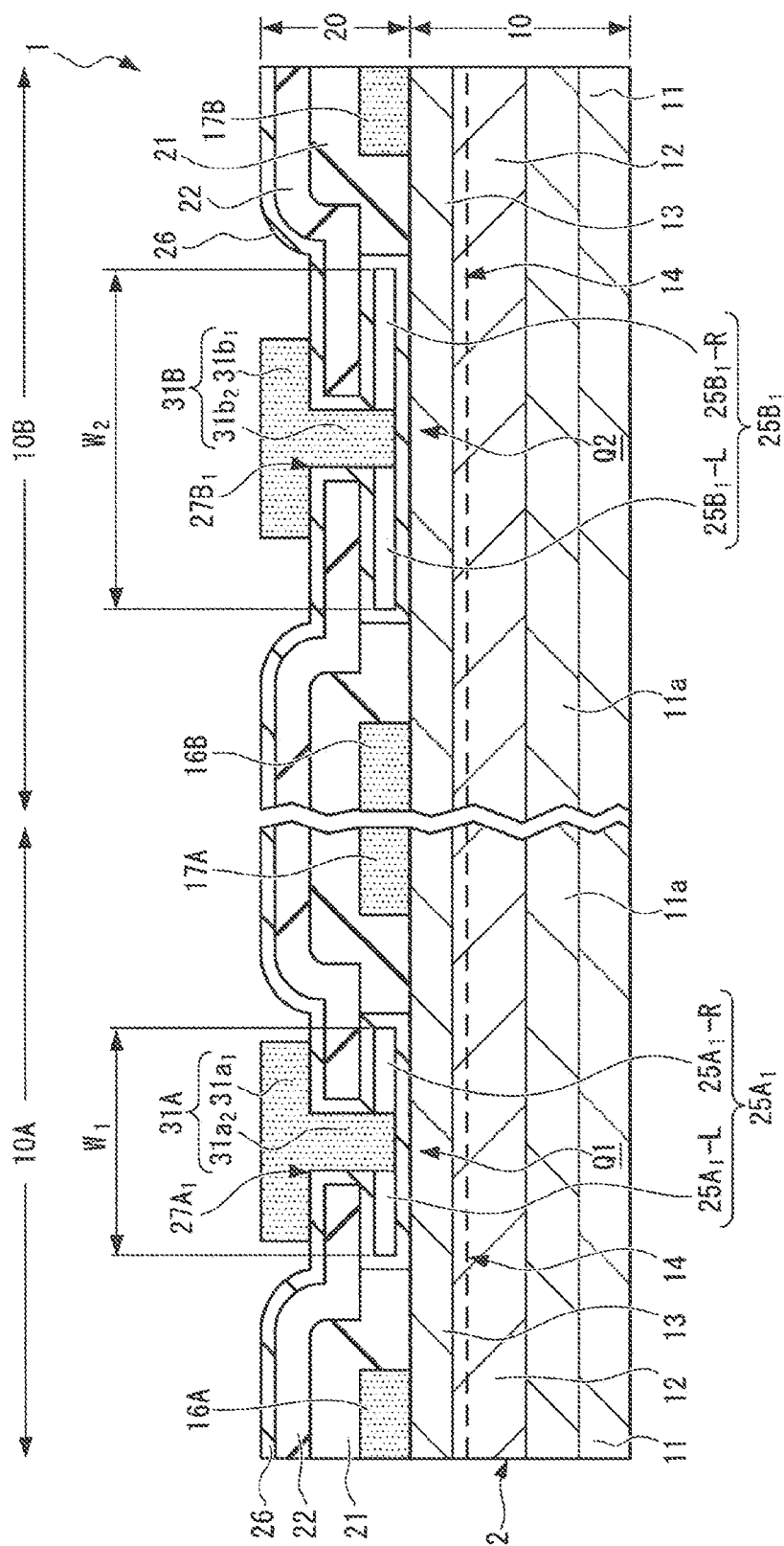
FIG. 6 is a cross-sectional view schematically showing a state in which the first transistor in FIG. 3 and the second transistor in FIG. 5 are mounted on the same semiconductor substrate.

As shown in FIG. 3, FIG. 5 and FIG. 6, the semiconductor chip 2 includes a semiconductor substrate 10 and an insulating layer 20 provided on the main surface of the semiconductor substrate 10.

The semiconductor substrate 10 includes a substrate 11, a buffer layer 11a provided on the substrate 11, a channel layer 12 provided on the buffer layer 11a, and a barrier layer 13 provided on the channel layer 12. Here, on the main surface of the semiconductor substrate 10, a first active region 10A and a second active region 10B which are partitioned by an inactive region 15 and are insulated and separated from each other are provided. The inactive region 15 is composed of, for example, an impurity diffusion region into which boron ($B^+$) ions are diffused as impurities. Here, as shown in FIG. 3 and FIG. 5, the inactive region 15 is formed deeper than a two dimensional electron gas (2DEG) layer 14 to be described below in a depth direction from the main surface of the semiconductor substrate 10. Insulation separation (element separation) between the active regions may be performed by a method other than ion implantation. For example, the channel layer 12 may be divided by dry etching and insulation separation between the active regions may be performed.

The substrate 11 is composed of a semiconductor material. Such a substrate 11 is composed of, for example, a Group III-V compound semiconductor material. Regarding the substrate 11, for example, a semi-insulating single crystal GaN (gallium nitride) substrate is used. A substrate material having a lattice constant different from a lattice constant of the channel layer 12 can be used for the substrate 11. Examples of such a material constituting the substrate 11 include SiC (silicon carbide), sapphire and Si (silicon). In this case, the lattice constant is adjusted by the buffer layer 11a between the substrate 11 and the channel layer 12. The buffer layer 11a is composed of, for example, a compound semiconductor layer epitaxially grown on the substrate 11, and is composed using a compound semiconductor having favorable lattice matching to the substrate 11. For example, on the substrate 11 composed of a single crystal GaN substrate, an epitaxially grown layer of u⁻GaN (u⁻ indicates that no impurities are added; the same applies hereinafter) to which no impurities are added is provided. When the lattice constant of the substrate 11 is different from the lattice constant of the channel layer 12, if the buffer layer 11a is provided between the substrate 11 and the channel layer 12, it is possible to improve the crystalline state of the channel layer 12 and prevent warping of the wafer. For example, when the substrate 11 is composed of Si and the channel layer 12 is composed of GaN, for example, AlN (aluminum nitride), AlGaN (aluminum gallium nitride) or GaN can be used for the buffer layer 11a. The buffer layer 11a may be composed of a single layer or may have a laminated structure. When the buffer layer 11a is composed of a three dimensional material, each composition may gradually change in the buffer layer 11a.

The channel layer 12 between the buffer layer 11a and the barrier layer 13 is a current passage between the source electrode and the drain electrode. Carriers are accumulated in the channel layer 12 due to polarization with respect to the barrier layer 13, and the two dimensional electron gas (2DEG: Two Dimensional Electron gas) layer 14 is provided in the vicinity of a bonding surface (hetero bonding interface) with respect to the barrier layer 13. It is preferable that such a channel layer 12 be composed of a compound semiconductor material in which carriers are easily accumulated by polarization with respect to the barrier layer 13. For example, the channel layer 12 is composed of GaN epitaxially grown on the buffer layer 11a. The channel layer 12 may be composed of u⁻GaN to which no impurities are added. In the channel layer 12 composed of u⁻GaN, since distribution of impurities of carriers in the channel layer 12 is restricted, it is possible to improve the mobility of carriers.

As shown in FIG. 3, FIG. 5 and FIG. 6, the insulating layer 20 includes a first insulating film 21 provided on the main surface of the semiconductor substrate 10, a second insulating film 22 provided on the first insulating film 21, and a third insulating film 26 provided on the second insulating film 22. As the first insulating film 21, for example, an aluminum oxide ($Al_3O_2$) film is used. As the second insulating film 22, for example, a silicon oxide ($SiO_2$) film having a high etching selectivity with respect to the first insulating film 21 is used. The first insulating film 21 and the second insulating film 22 are formed with, for example, a film thickness of about 50 nm.

The third insulating film 26 is formed to cover the first insulating film 21, the second insulating film 22, and the main surface (the barrier layer 13) of the semiconductor substrate 10 in a first cavity part 25A₁ and a second cavity part 25B₁ to be described below. The third insulating film 26 has an insulating property with respect to the barrier layer 13, the first insulating film 21 and the second insulating film 22 exposed to the first cavity part 25A₁ and the second cavity part 25B₁, protects the barrier layer 13 from impurities such as ions, and is formed of a material that forms a favorable interface with the barrier layer 13 and prevents deterioration of device characteristics. For example, the third insulating film 26 is formed of a laminated film in which an $Al_2O_3$ film and a hafnium oxide ($HfO_2$) film having a film thickness of about 10 nm are laminated in that order from the side of the main surface of the semiconductor substrate 10. The third insulating film 26 may be formed of a single $Al_2O_3$ film or $HfO_2$ film.

As shown in FIG. 2, FIG. 3 and FIG. 6, the first field effect transistor Q1 is formed in the first active region 10A of the main surface of the semiconductor substrate 10. The first field effect transistor Q1 includes the buffer layer 11a, the channel layer 12, the barrier layer 13, and the two dimensional electron gas layer 14. In addition, the first field effect transistor Q1 includes the pair of first main electrodes 16A and 17A which are separated from each other and provided on the first active region 10A of the main surface of the semiconductor substrate 10 and function as the source electrode and the drain electrode, and the first cavity part 25A₁ provided in the insulating layer 20 between the pair of first main electrode 16A and first main electrode 17A. In addition, the first field effect transistor Q1 includes a first gate electrode 31A which has a head part 31a₁ positioned on the insulating layer 20 and a body part 31a₂ that penetrates the insulating layer 20 from the head part 31a₁ and protrudes toward the first cavity part 25A₁, and in which the head part 31a₁ is wider than the body part 31a₂. That is, the first field effect transistor Q1 of the first embodiment is a GaN-based hetero FET (HFET: Hetero Field Effect Transistor).

As shown in FIG. 2, the first gate electrode 31A has a long shape when viewed in a plan view, and the gate width (Wg) is longer than the gate length (Lg). Here, the first gate electrode 31A extends over the first active region 10A and the inactive region 15. Here, as shown in FIG. 3 and FIG. 6, in the first gate electrode 31A, the head part 31a₁ is positioned on the third insulating film 26, and the body part 31a₂ integrated with the head part 31a₁ protrudes toward the first cavity part 25A₁ through a first gate opening 27A₁ provided in the insulating layer 20.

As shown in FIG. 2, FIG. 3 and FIG. 6, the pair of first main electrodes 16A and 17A with the first gate electrode 31A therebetween are separated from each other in the gate length direction of the first gate electrode 31A (the short direction and the width direction of the first gate electrode 31A). Here, the pair of first main electrodes 16A and 17A extend over the first active region 10A and the inactive region 15 in the gate width direction of the first gate electrode 31A (the longitudinal direction and the length direction of the first gate electrode 31A).

As shown in FIG. 2, the plane pattern of the first cavity part 25A₁ when viewed in a plan view is a circular plane pattern surrounding the body part 31a₂ of the first gate electrode 31A. Therefore, as shown in FIG. 3, the first cavity part 25A₁ includes a first part 25A₁-L positioned on one side (left side) of the body part 31a₂ and a second part 25A₁-R positioned on the other side (right side) of the body part 31a₂ in the gate length direction of the first gate electrode 31A. Here, in the first embodiment, the first cavity part 25A₁ has a bilaterally symmetrical configuration in which the first part $25A_1$-L and the second part $25A_1$-R have substantially the same width. In the gate length direction of the first gate electrode 31A, the first cavity part $25A_1$ is wider than the body part $31a_2$ of the first gate electrode 31A and the first gate opening $27A_1$.

As shown in FIG. 4, FIG. 5 and FIG. 6, the second field effect transistor Q2 is formed in the second active region 10B different from the first active region 10A of the main surface of the semiconductor substrate 10. The second field effect transistor Q2 includes the buffer layer 11a, the channel layer 12, the barrier layer 13, and the two dimensional electron gas layer 14. In addition, the second field effect transistor Q2 includes the pair of second main electrodes 16B and 17B which are separated from each other and provided on the second active region 10B of the main surface of the semiconductor substrate 10 and in which the separation distance $L_2$ (refer to FIG. 4 and FIG. 6) is longer than the separation distance $L_1$ (refer to FIG. 2 and FIG. 6) between the pair of first main electrodes 16A and 17A of the first field effect transistor Q1, and the second cavity part $25B_1$ provided in the insulating layer 20 between the pair of second main electrodes 16B and 17B. The pair of second main electrodes 16B and 17B function as a source electrode and a drain electrode. In addition, the second field effect transistor Q2 includes a second gate electrode 31B which has a head part $31b_1$ positioned on the insulating layer 20 and a body part $31b_2$ that penetrates the insulating layer 20 from the head part $31b_1$ and protrudes toward the second cavity part $25B_1$, and in which the head part $31b_1$ is wider than the body part $31b_2$. That is, the second field effect transistor Q2 of the first embodiment is also a GaN-based hetero FET like the first field effect transistor Q1.

As shown in FIG. 4, the second gate electrode 31B has a long shape when viewed in a plan view, and the gate width is longer than the gate length. Here, the second gate electrode 31B extends over the second active region 10B and the inactive region 15. Here, in the second gate electrode 31B, the head part $31b_1$ is positioned on the third insulating film 26, and the body part $31b_2$ integrated with the head part $31b_1$ protrudes toward the second cavity part $25B_1$ through a second gate opening 27B1 provided in the insulating layer 20.

As shown in FIG. 4, FIG. 5 and FIG. 6, the pair of second main electrodes 16B and 17B with the second gate electrode 31B therebetween are separated from each other in the gate length direction (the short direction and the width direction of the second gate electrode 31B) of the second gate electrode 31B. Here, the pair of second main electrodes 16B and 17B extend over the second active region 10B and the inactive region 15 in the gate width direction of the second gate electrode 31B (the longitudinal direction and the length direction of the second gate electrode 31B).

As shown in FIG. 4, the plane pattern of the second cavity part $25B_1$ when viewed in a plan view is a circular plane pattern surrounding the body part $31b_2$ of the second gate electrode 31B. Therefore, like the first cavity part $25A_1$, as shown in FIG. 5, the second cavity part $25B_1$ also includes a first part $25B_1$-L positioned on one side (left side) of the body part $31b_2$ and a second part $25B_1$-R positioned on the other side (right side) of the body part $31b_2$ in the gate length direction of the second gate electrode 31B. In the first embodiment, although not limited to this, the second cavity part $25B_1$ has a bilaterally symmetrical configuration in which the first part $25B_1$-L and the second part $25B_1$-R have substantially the same width.

The second cavity part $25B_1$ is wider than the body part $31b_2$ of the second gate electrode 31B and the second gate opening 27B1 in the gate length direction of the second gate electrode 31B. Here, as shown in FIG. 6, the width W2 of the second cavity part $25B_1$ is wider than the width $W_1$ of the first cavity part $25A_1$. That is, the second cavity part $25B_1$ is wider than the first cavity part $25A_1$.

Here, the width W2 of the second cavity part $25B_1$ is a length of the second gate electrode 31B in the gate length direction, and the width $W_1$ of the first cavity part $25A_1$ is a length of the first gate electrode 31A in the gate length direction. In the first embodiment, although not limited to this, the first gate electrode 31A and the second gate electrode 31B extend in the same direction, and as shown in FIG. 6, respective short directions of the first gate electrode 31A and the second gate electrode 31B are the same direction.

The inside of each of the first cavity part $25A_1$ and the second cavity part $25B_1$ is filled with an inert gas or is in a vacuum state, and is a low-dielectric-constant region having a lower dielectric constant than the surrounding first insulating film 21, second insulating film 22 and third insulating film 26.

As shown in FIG. 6, the first gate electrode 31A and the second gate electrode 31B are provided on the third insulating film 26. The first gate electrode 31A and the second gate electrode 31B are composed of, for example, a laminated film in which a nickel (Ni) film and a gold (Au) film are sequentially laminated from the side of the semiconductor substrate 10.

The pair of first main electrodes 16A and 17A are ohmic-bonded to the barrier layer 13 in the first active region 10A. The pair of second main electrodes 16B and 17B are ohmic-bonded to the barrier layer 13 in the second active region 10B. The pair of first main electrodes 16A and 17A and the pair of second main electrodes 16B and 17B are composed of, for example, a laminated film in which a titanium (Ti) film, an Al film, a Ni film, and an Au film are sequentially laminated from the side of the semiconductor substrate 10.

For example, when the first and second field effect transistors Q1 and Q2 are of a depression type in which the threshold voltage is a negative voltage, if a gate voltage Vg is applied to the gate electrodes 31A and 31B, the number of carriers in a carrier-deficient region in the surface layer part of the channel layer 12 directly below the gate electrodes 31A and 31B decreases, the number of electrons in the channel layer 12 decreases, and the drain current Id hardly flows. Here, if a positive gate voltage Vg is applied to the gate electrodes 31A and 31B, the carrier-deficient region disappears, the number of electrons in a buffer layer 12 increases, and the drain current Id is modulated.

As described above, in the semiconductor device 1 according to the first embodiment, the first field effect transistor Q1 and the second field effect transistor Q2 having a larger planar size than the first field effect transistor Q1 are mounted together on the same semiconductor substrate 10. Here, as shown in FIG. 6, since the first field effect transistor Q1 includes the first cavity part $25A_1$, compared with a conventional field effect transistor which has the same planar size as the first field effect transistor Q1 and does not include the first cavity part $25A_1$, it is possible to reduce the parasitic capacitance Cgs added between the first gate electrode 31A and one first main electrode 16A (for example, a source electrode), and the parasitic capacitance Cgd added between the first gate electrode 31A and the other first main electrode 17A (for example, a drain electrode), and thereby it is possible to reduce the on-resistance and improve the isolation characteristics. Here, as shown in FIG. 6, since the second field effect transistor Q2 includes the second cavity part 25B$_1$ wider than the first cavity part 25A$_1$, compared with a conventional field effect transistor which has the same planar size as the second field effect transistor Q2 and includes a cavity part having the same width as the first cavity part 25A$_1$, it is possible to reduce the parasitic capacitance Cgs added between the second gate electrode 31B and one second main electrode 16B (for example, a source electrode) and the parasitic capacitance Cgd added between the second gate electrode 31B and the other second main electrode 17B (for example, a drain electrode), and thereby it is possible to reduce the on-resistance and improve high frequency characteristics. Therefore, according to the semiconductor device 1 of the first embodiment, it is possible to reduce the on-resistance of the first field effect transistor Q1 and the second field effect transistor Q2 which have different planar sizes, and improve characteristics according to each application.

In addition, the first field effect transistor Q1 is used as an element constituting the high frequency switch part SW. In this case, according to the first field effect transistor Q1, the planar size is reduced by reducing the separation distance L$_1$ between the pair of first main electrodes 16A and 17A, and thus the on-resistance can be reduced, and it is possible to improve high frequency characteristics. On the other hand, the second field effect transistor Q2 is used as an element constituting the high frequency power amplifier part PA. In this case, in the second field effect transistor Q2, it is necessary to increase the separation distance L$_2$ between the pair of second main electrodes 16B and 17B and increase a device withstand voltage (withstand voltage between gate/drain), and the planar size is larger than that of the first field effect transistor Q1. Therefore, like the semiconductor device 1 of the first embodiment, when the second cavity part 25B$_1$ of the second field effect transistor Q2 is made wider than the first cavity part 25A$_1$ of the first field effect transistor Q1, it is possible to secure the device withstand voltage of the second field effect transistor Q2 and reduce the on-resistance.

Here, a wiring layer and other insulating layers are provided above the insulating layer 20, but in FIG. 3, FIG. 5 and FIG. 6, the wiring layer and other insulating films above the insulating layer 20 are not shown.

In addition, in the first embodiment, the first field effect transistor Q1 and the second field effect transistor Q2 are arranged so that respective short directions of the gate electrodes 31A and 31B are the same direction, but respective short directions of the gate electrodes 31A and 31B may be different directions.

<Method of Producing Semiconductor Device>

Next, a method of producing the semiconductor device 1 will be described with reference to FIGS. 7A, 7B, 8A, 8B, 9A, 9B, 10A, 10B, 11A, 11B, 12A, 12B, 13A, 13B, 14A, 14B, 15A, and 15B. FIGS. 7A, 8A, 9A, 10A, 11A, 12A, 13A, 14A and 15A show processes of forming the first field effect transistor Q1 in the first active region 10A of the semiconductor substrate 10. FIGS. 7B, 8B, 9B, 10B, 11B, 12B, 13B, 14B and 15B show processes of forming the second field effect transistor Q2 in the second active region 10B of the semiconductor substrate 10. The first field effect transistor Q1 and the second field effect transistor Q2 are formed by the same process.

Figure 7A:
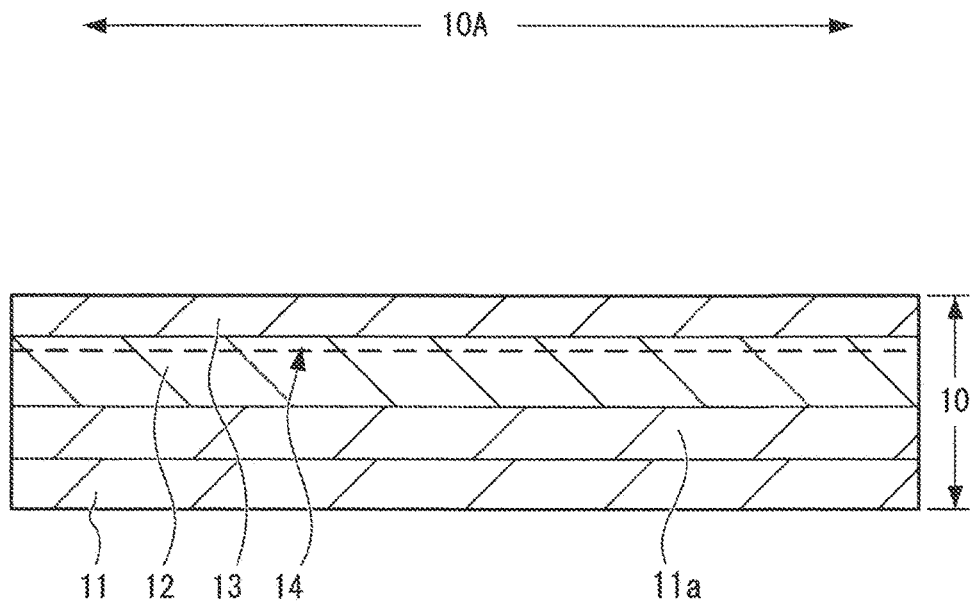
FIG. 7A is a process cross-sectional view of a method of producing a semiconductor device according to the first embodiment of the present technology.
Figure 7B:
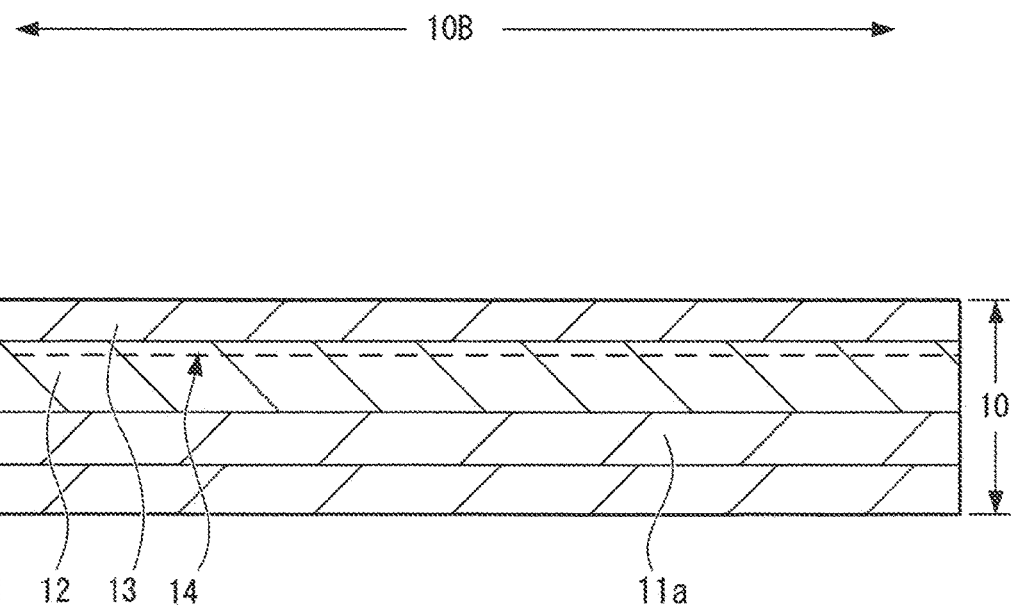
FIG. 7B is a process cross-sectional view of the method of producing a semiconductor device according to the first embodiment of the present technology.

First, as shown in FIGS. 7A and 7B, the semiconductor substrate 10 is prepared. The semiconductor substrate 10 has a laminated structure in which the buffer layer 11a, the channel layer 12 and the barrier layer 13 are laminated in that order on the substrate 11. Here, the two dimensional electron gas layer 14 is provided in the vicinity of the bond interface between the channel layer 12 and the barrier layer 13.

Figure 8A:
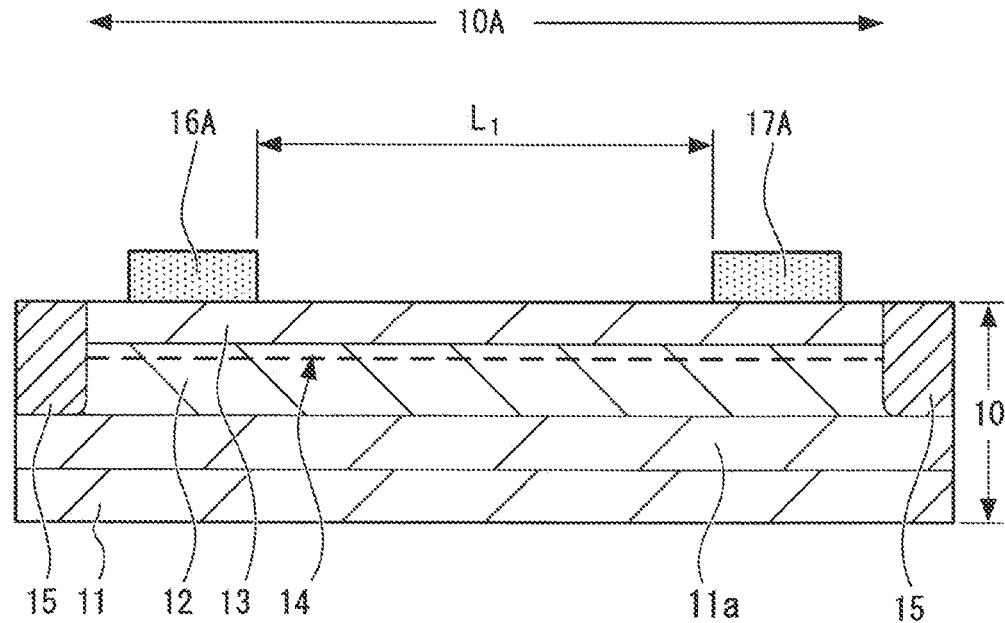
FIG. 8A is a process cross-sectional view continuing FIG. 7A.
Figure 8B:
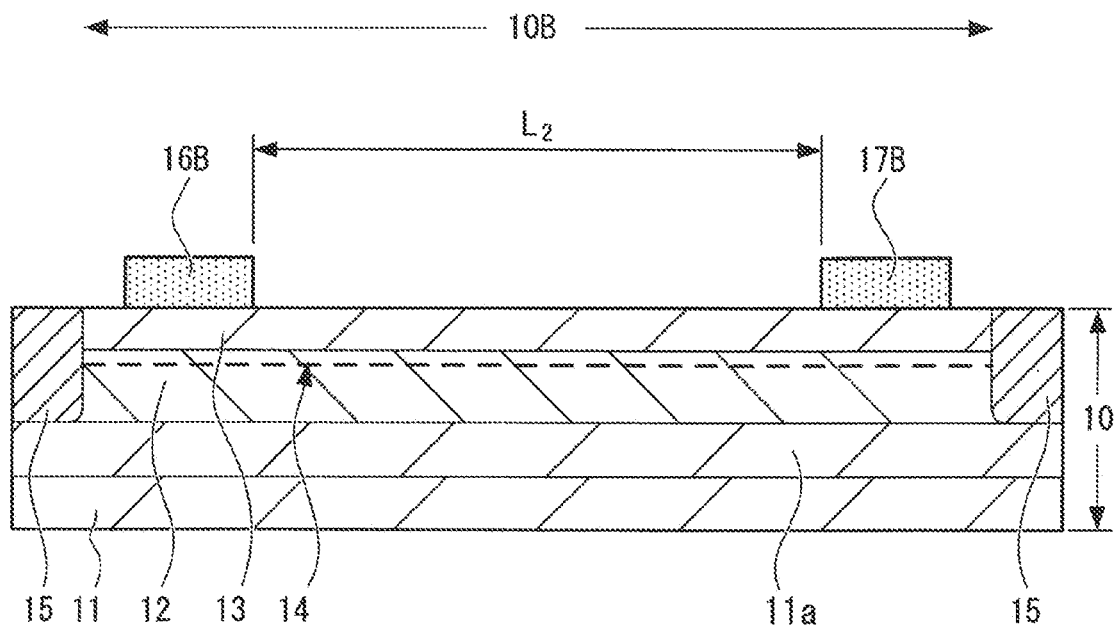
FIG. 8B is a process cross-sectional view continuing FIG. 7B.

Next, as shown in FIGS. 8A and 8B, on the main surface of the semiconductor substrate 10, the inactive region 15 that partitions and insulated and separates the first active region 10A and the second active region 10B is formed, and also, the pair of first main electrodes 16A and 17A that function as a source electrode and a drain electrode are formed on the first active region 10A of the main surface of the semiconductor substrate 10, and the pair of second main electrodes 16B and 17B that function as a source electrode and a drain electrode are formed on the second active region 10B of the main surface of the semiconductor substrate 10.

The inactive region 15 is formed by selectively injecting, for example, boron (B+) ions as impurities ions, into the surface layer part on the side of the main surface of the semiconductor substrate 10, and then performing a heat treatment in order to activate the injected B+ ions.

The pair of first main electrodes 16A and 17A and the pair of second main electrodes 16B and 17B are formed when a conductive film having a multi-layer structure is formed by sequentially laminating, for example, a Ti film, an Al film, a Ni film, and an Au film from the side of the semiconductor substrate 10, on the entire main surface of the semiconductor substrate 10 including the first active region 10A and the second active region 10B by a CVD method or a sputtering method, and the conductive film is then patterned using a well-known photolithography technique and a dry etching technique having high directivity. The pair of first main electrodes 16A and 17A are formed in a long shape, and are formed apart from each other in the short direction (width direction) orthogonal to the longitudinal direction. The pair of second main electrodes 16B and 17B are also formed in a long shape, and are formed apart from each other in the short direction (width direction) orthogonal to the longitudinal direction. Here, the pair of second main electrodes 16B and 17B between which the separation distance L2 is longer than the separation distance L1 between the pair of first main electrodes 16A and 17A is formed apart from each other.

Figure 9A:
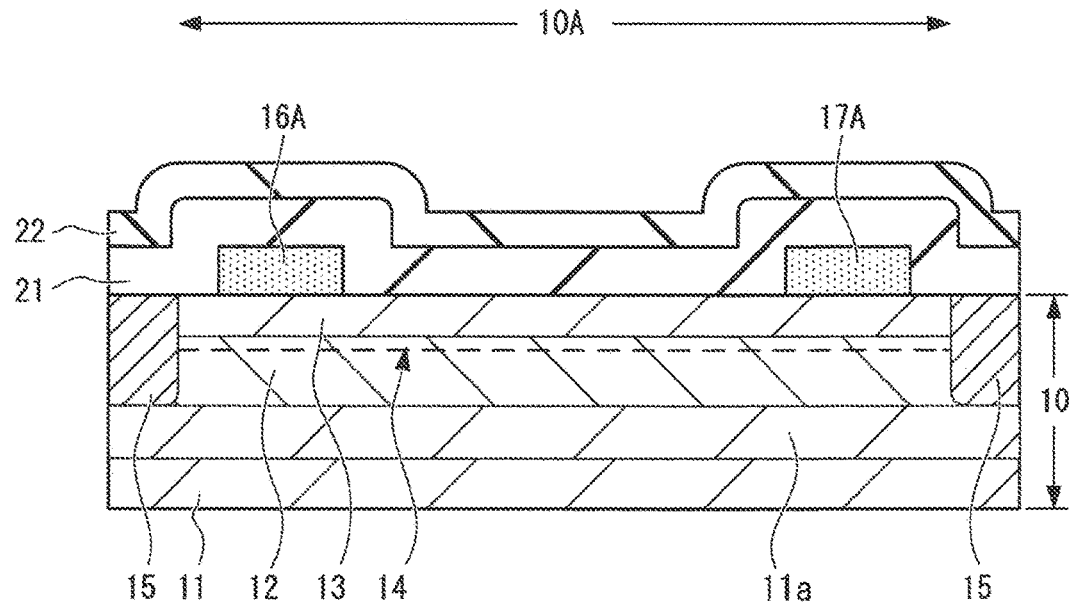
FIG. 9A is a process cross-sectional view continuing FIG. 8A.
Figure 9B:
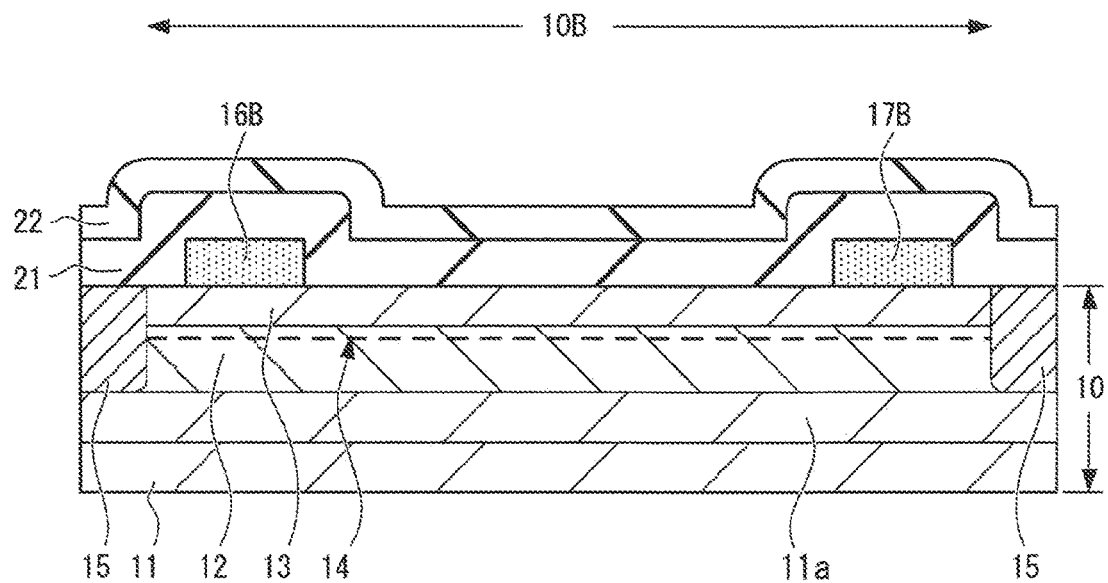
FIG. 9B is a process cross-sectional view continuing FIG. 8B.

Next, as shown in FIGS. 9A and 9B, the first insulating film 21 is formed on the entire main surface of the semiconductor substrate 10 including the above first active region 10A and second active region 10B, and then, as shown in FIGS. 9A and 9B, the second insulating film 22 is formed on the entire main surface of the semiconductor substrate 10 including the above first active region 10A and second active region 10B with the first insulating film 21 therebetween. The second insulating film 22 is formed of an insulating film having a high etching selectivity with respect to the first insulating film 21. In other words, the first insulating film 21 is formed of an insulating film having a low etching selectivity with respect to the second insulating film 22. For example, an aluminum oxide (Al2O3) film is filmed as the first insulating film 21 by an atomic vapor deposition (ALD) method, and a silicon oxide (SiO2) film is formed as the second insulating film 22 by a chemical vapor deposition (CVD) method.

According to this process, the first active region 10A and the second active region 10B of the main surface of the semiconductor substrate 10 are covered with the first insulating film 21 and the second insulating film 22.

Figure 10A:
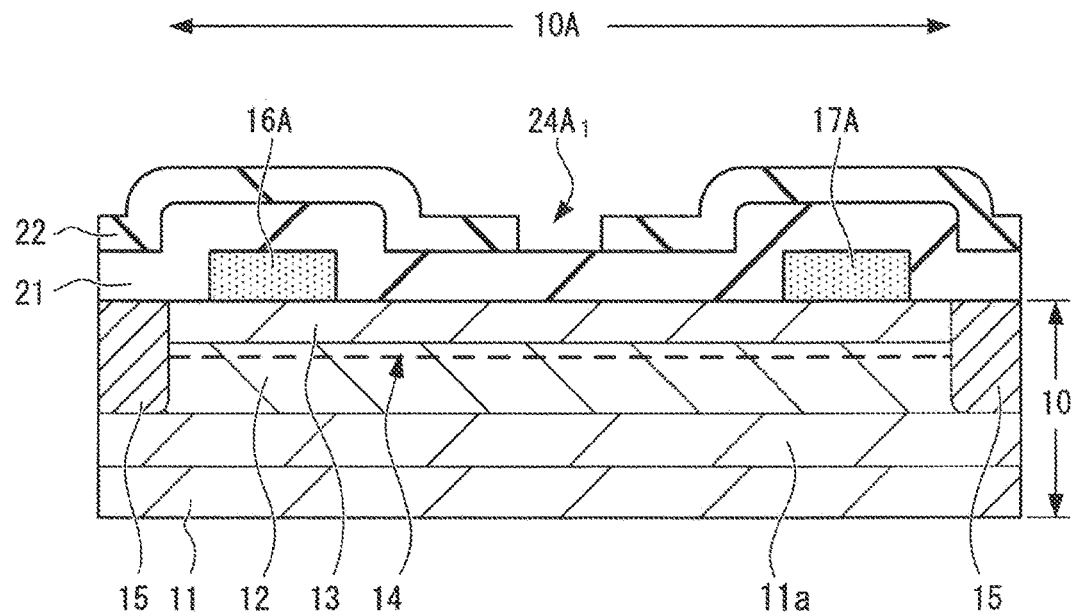
FIG. 10A is a process cross-sectional view continuing FIG. 9A.
Figure 10B:
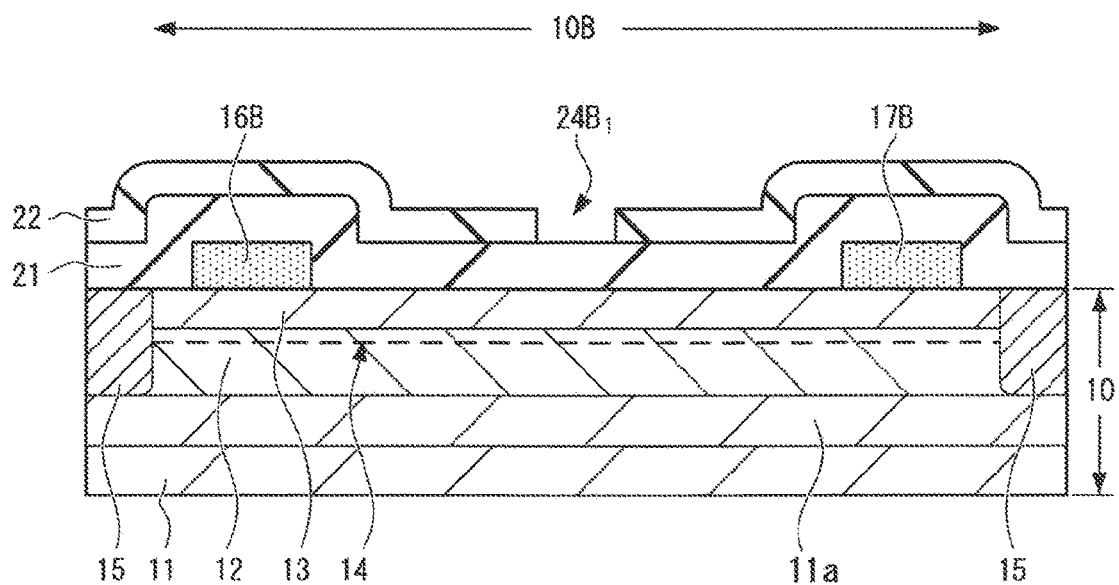
FIG. 10B is a process cross-sectional view continuing FIG. 9B.

Next, as shown in FIGS. 10A and 10B, a first opening 24A1 is formed in the second insulating film 22 on the first active region 10A of the main surface of the semiconductor substrate 10, and a second opening 24B1 is formed in the second insulating film 22 on the second active region 10B of the main surface of the semiconductor substrate 10. The first opening 24A1 and a second opening 24B1 are formed by selectively etching the second insulating film 22 using a well-known photolithography technique and well-known dry etching having high directivity as an anisotropic etching technique.

The first opening 24A1 is formed between the pair of first main electrode 16A and first main electrode 17A in a plan view, and are formed with a long plane pattern in the longitudinal direction of the pair of first main electrodes 16A and 17A. The second opening 24B1 is formed between the pair of second main electrode 16B and second main electrode 17B in a plan view, and are formed with a long plane pattern that extends in the longitudinal direction of the pair of second main electrodes 16B and 17B.

Figure 11A:
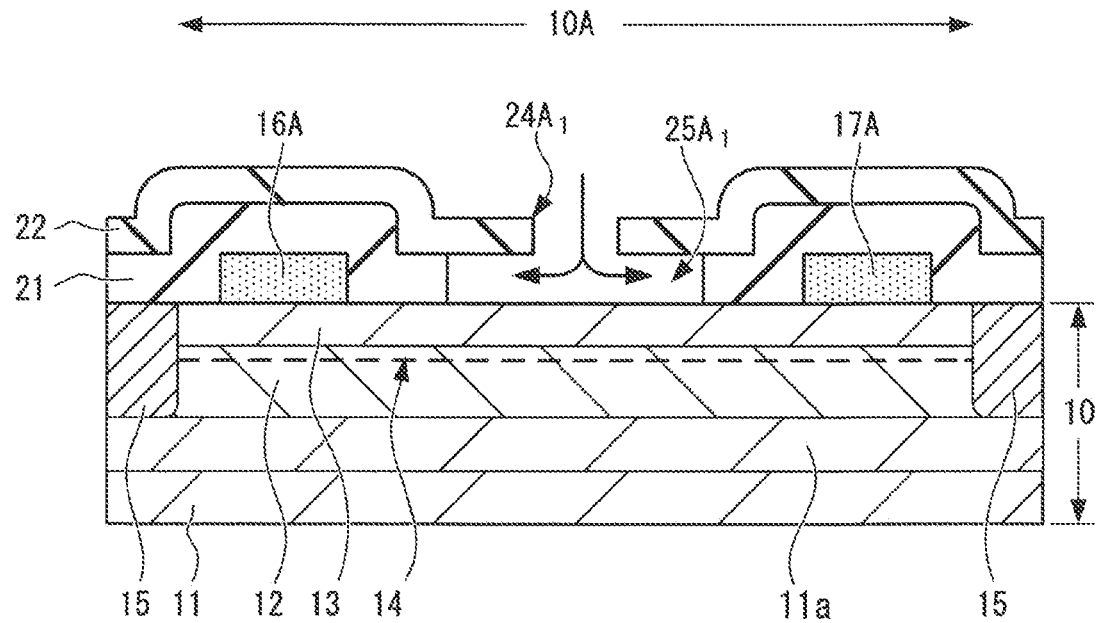
FIG. 11A is a process cross-sectional view continuing FIG. 10A.
Figure 11B:
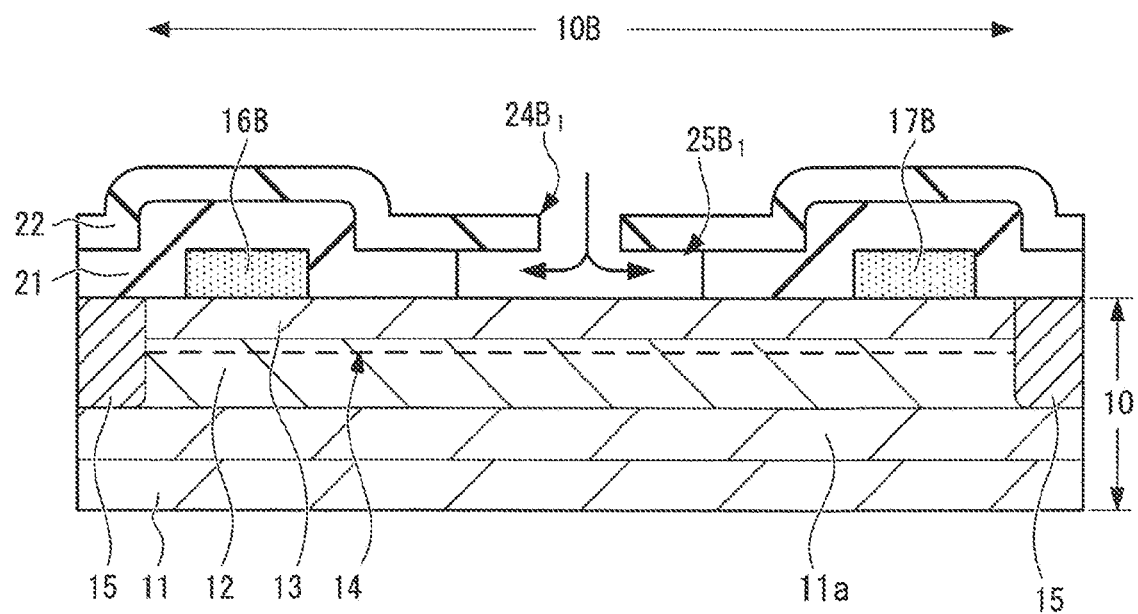
FIG. 11B is a process cross-sectional view continuing FIG. 10B.

Next, as shown in FIGS. 11A and 11B, the first cavity part 25A1 wider than the first opening 24A1 is formed by etching the first insulating film 21 on the first active region 10A of the semiconductor substrate 10 through the first opening 24A1, and the second cavity part 25B1 wider than the second opening 24B1 is formed by etching the first insulating film 21 on the second active region 10B of the semiconductor substrate 10 through the second opening 24B1.

The first cavity part 25A1 and the second cavity part 25B1 are formed by etching the first insulating film 21 by performing isotropic wet etching with less damage on the main surface of the semiconductor substrate 10, that is, the surface of the barrier layer 13. Wet etching of the first insulating film 21 is performed under conditions in which an etching selectivity with respect to the second insulating film 22 is obtained. That is, etching is performed under conditions in which a wet etching rate is higher for the first insulating film 21 than for the second insulating film 22. A higher selectivity is more preferable, but for example, etching is performed under conditions in which the etching selectivity between the first insulating film 21 and the second insulating film 22 is 10 or more:1.

Figure 12A:
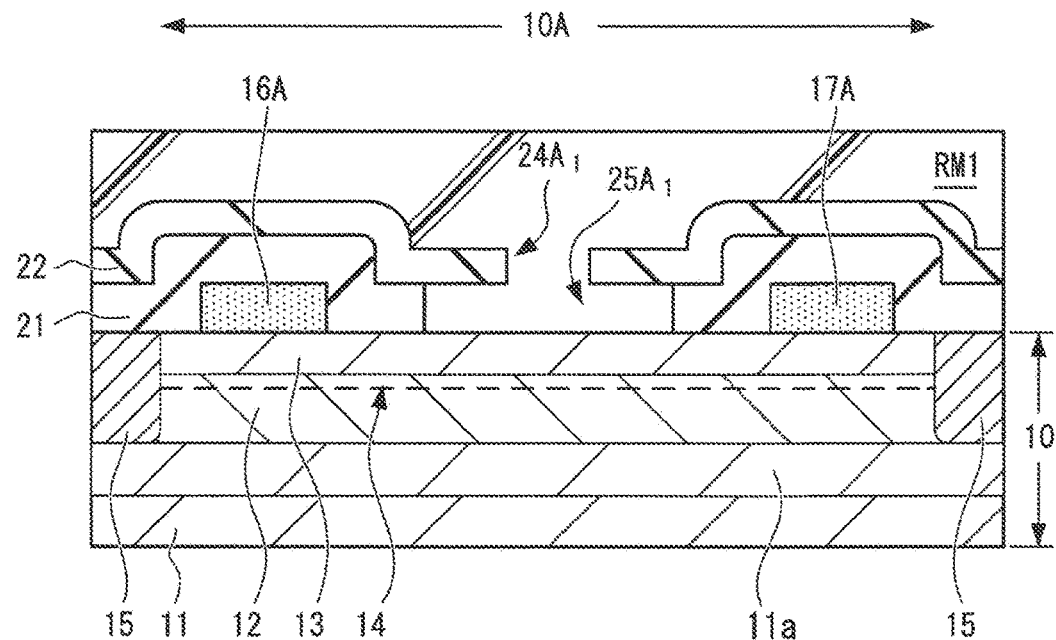
FIG. 12A is a process cross-sectional view continuing FIG. 11A.
Figure 12B:
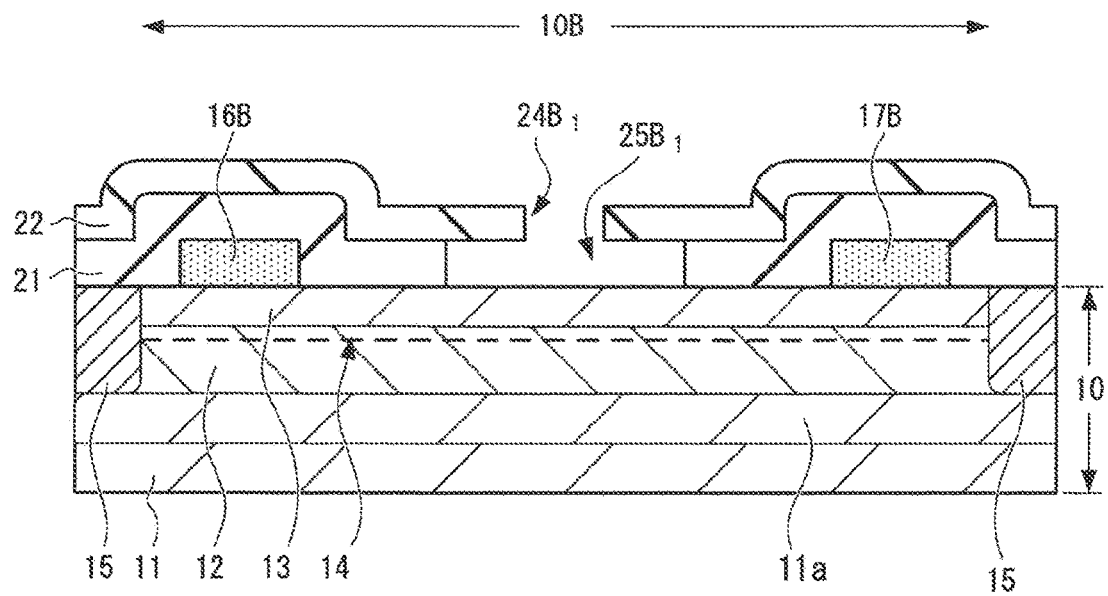
FIG. 12B is a process cross-sectional view continuing FIG. 11B.

Next, as shown in FIGS. 12A and 12B, a mask RM1 is formed to cover the first opening 24A1 on the first active region 10A of the semiconductor substrate 10 except for the second opening 24B1 on the second active region 10B of the semiconductor substrate 10. The mask RM1 is formed by forming a photosensitive resist film on the entire main surface of the semiconductor substrate 10 including the above first active region 10A and second active region 10B and then subjecting the photosensitive resist film to a photosensitivity and developing treatment or the like to form a predetermined pattern.

Figure 13A:
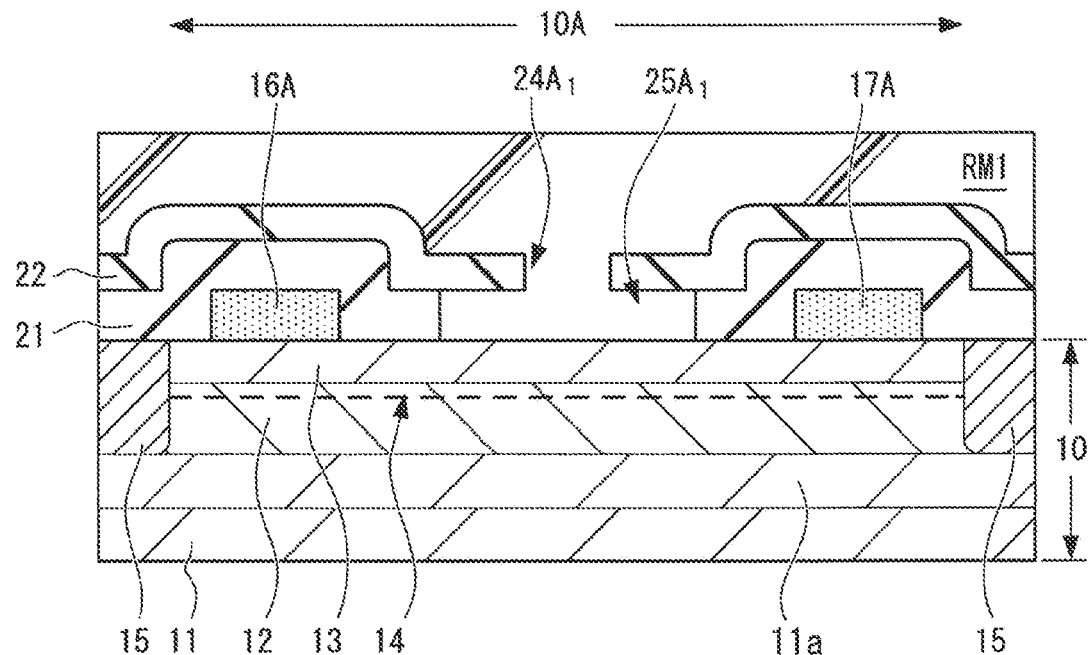
FIG. 13A is a process cross-sectional view continuing FIG. 12A.
Figure 13B:
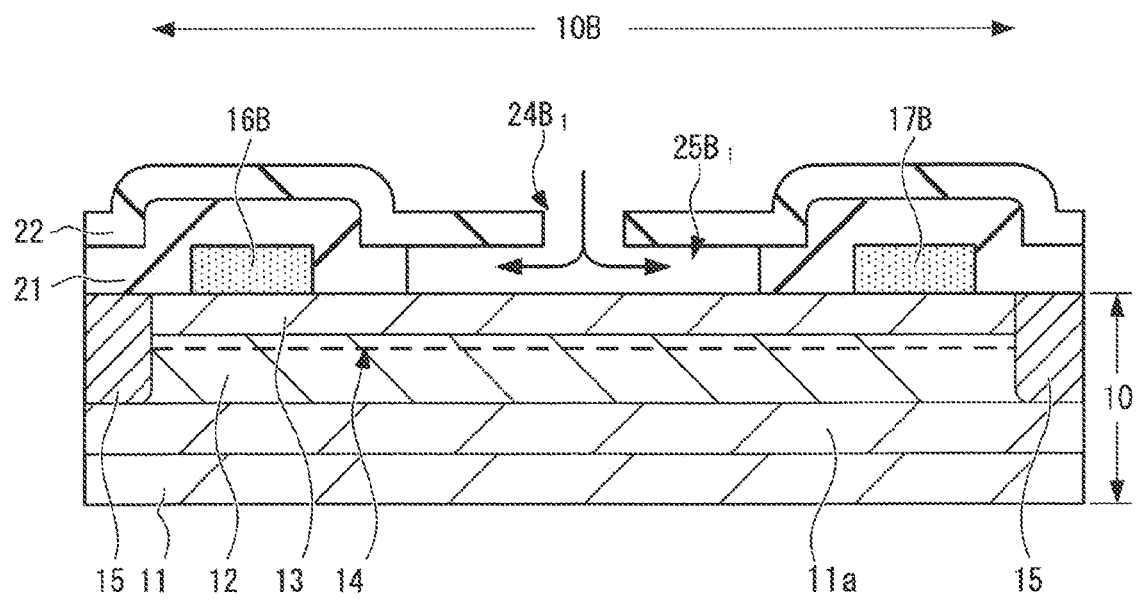
FIG. 13B is a process cross-sectional view continuing FIG. 12B.

Next, as shown in FIGS. 13A and 13B, the mask RM1 is used as an etching mask, and the width of the second cavity part 25B1 is extended by selectively etching the first insulating film 21 through the second opening 24B1 when the first opening 24A1 is covered with the mask RM1. The extension of the second cavity part 25B1 is performed by etching the first insulating film 21 by performing isotropic wet etching with less damage on the main surface of the semiconductor substrate 10, that is, the surface of the barrier layer 13. Wet etching of the first insulating film 21 is performed under conditions in which an etching selectivity with respect to the second insulating film 22 is obtained. For example, etching is performed under conditions in which the etching selectivity between the first insulating film 21 and the second insulating film 22 is 10 or more:1.

According to this process, the second cavity part 25B1 having a width W2 (refer to FIG. 6) wider than the width W1 (refer to FIG. 6) of the first cavity part 25A1 is formed In addition, in this process, since the width of the second cavity part 25B1 is selectively extended, the first insulating film 21 can remain between each of the pair of first main electrodes 16A and 17A and the first cavity part 25A1, and the first insulating film 21 can remain between each of the pair of second main electrodes 16B and 17B and the second cavity part 25B1.

Figure 14A:
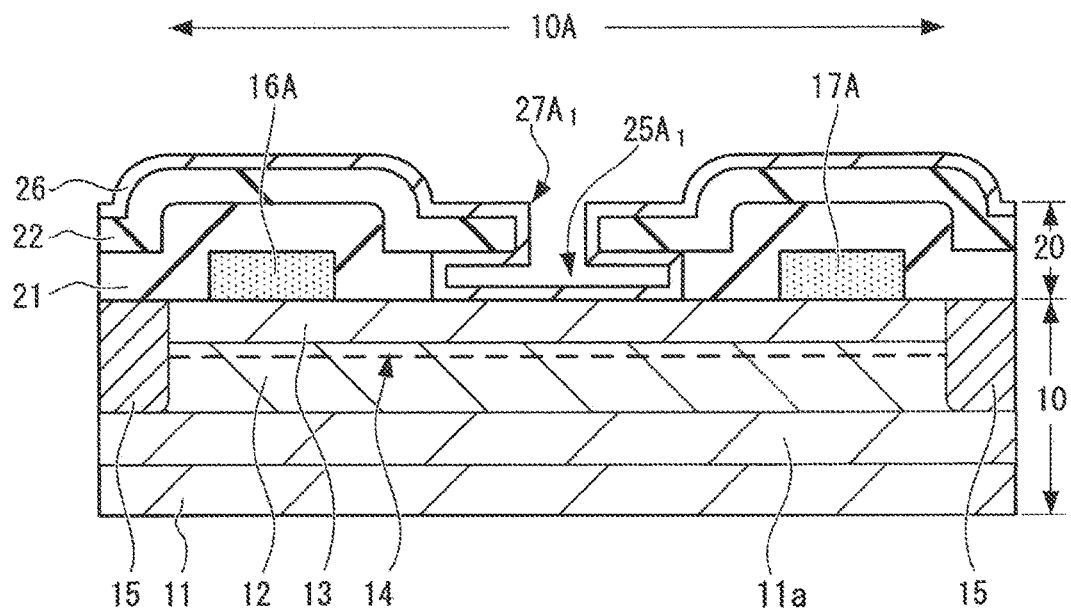
FIG. 14A is a process cross-sectional view continuing FIG. 13A.
Figure 14B:
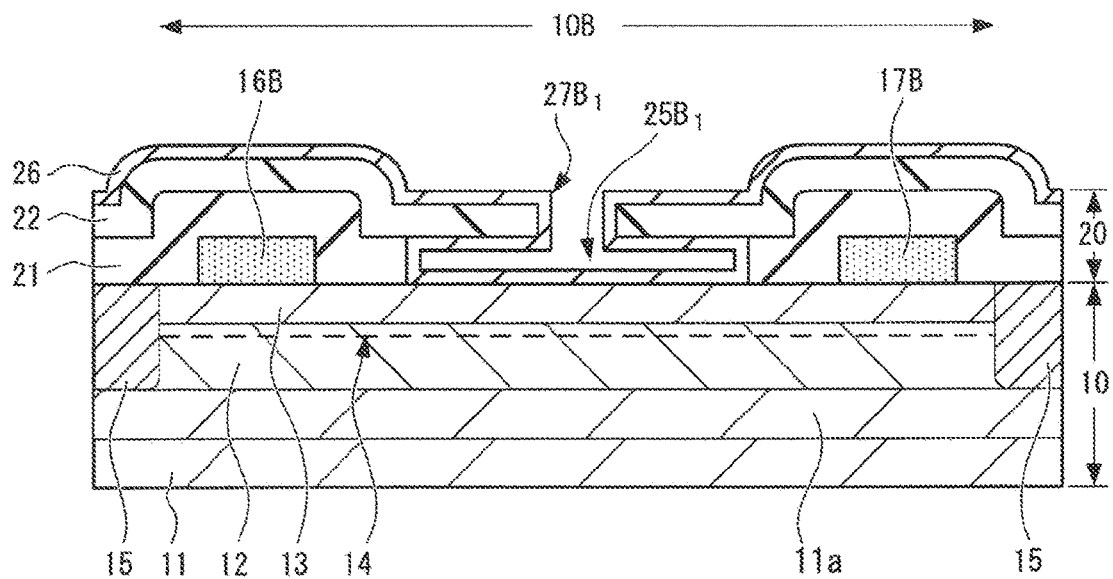
FIG. 14B is a process cross-sectional view continuing FIG. 13B.

Next, after the mask RM1 is removed, as shown in FIGS. 14A and 14B, in the first cavity part 25A1 and the second cavity part 25B1, the third insulating film 26 that covers the first insulating film 21, the second insulating film 22, and the main surface of the semiconductor substrate 10 (the surface of the barrier layer 13), covers respective side walls in the first opening 24A1 and the second opening 24B1 of the second insulating film 22, and covers the second insulating film 22 is formed. The third insulating film 26 is formed by, for example, forming an Al2O3 film using an ALD method. Since the ALD method allows uniform film formation, the exposed surface of the barrier layer 13, the first insulating film 21 and the second insulating film 22 is covered with the uniform third insulating film 26.

In this process, the insulating layer 20 including the first insulating film 21, the second insulating film 22 and the third insulating film 26 is formed on the first active region 10A and the second active region 10B of the semiconductor substrate 10.

In addition, in this process, since respective side walls in the first opening 24A1 and the second opening 24B1 of the second insulating film 22 are covered with the third insulating film 26, the first gate opening 27A1 having a narrower opening width than the first opening 24A1 is formed, and the second gate opening 27B1 having a narrower opening width than the second opening 24B1 is formed.

In addition, in this process, the first cavity part 25A1 and the second cavity part 25B1 are surrounded by the third insulating film 26. Here, since the third insulating film 26 is formed with an almost uniform film thickness, in the first cavity part 25A1 and the second cavity part 25B1 surrounded by the third insulating film 26, the width W2 (refer to FIG. 6) of the second cavity part 25B1 is wider than the width W1 (refer to FIG. 6) of the first cavity part 25A1.

Figure 15A:
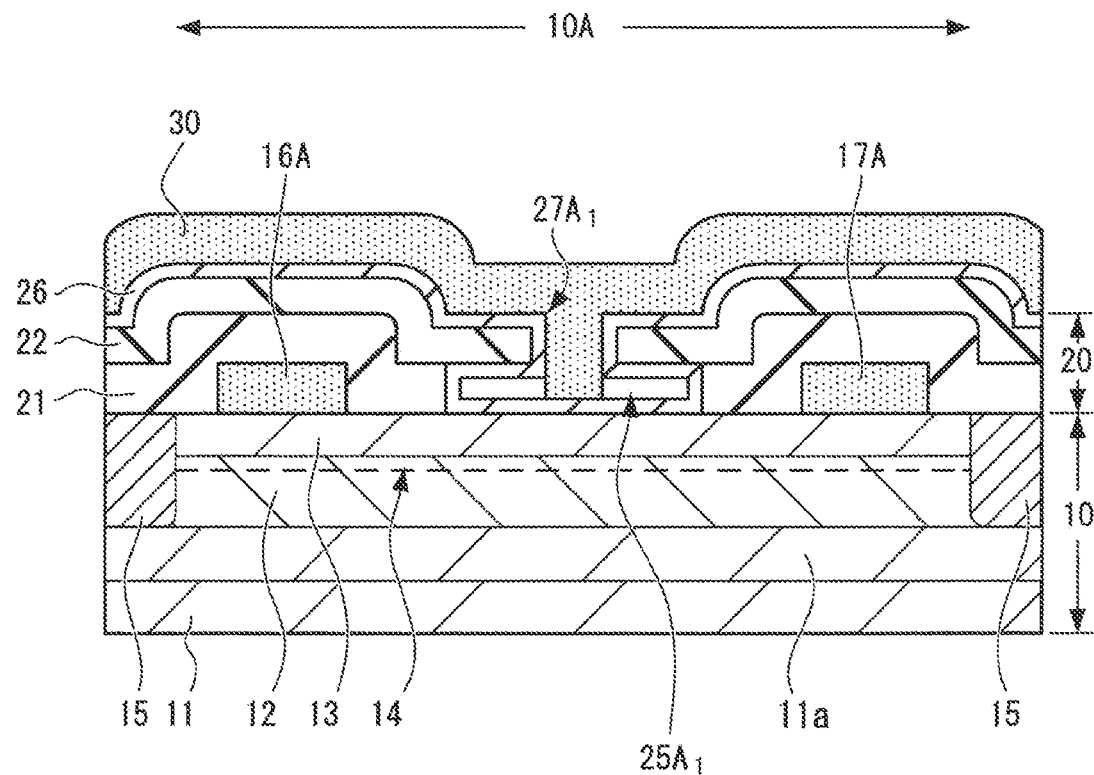
FIG. 15A is a process cross-sectional view continuing FIG. 14A.
Figure 15B:
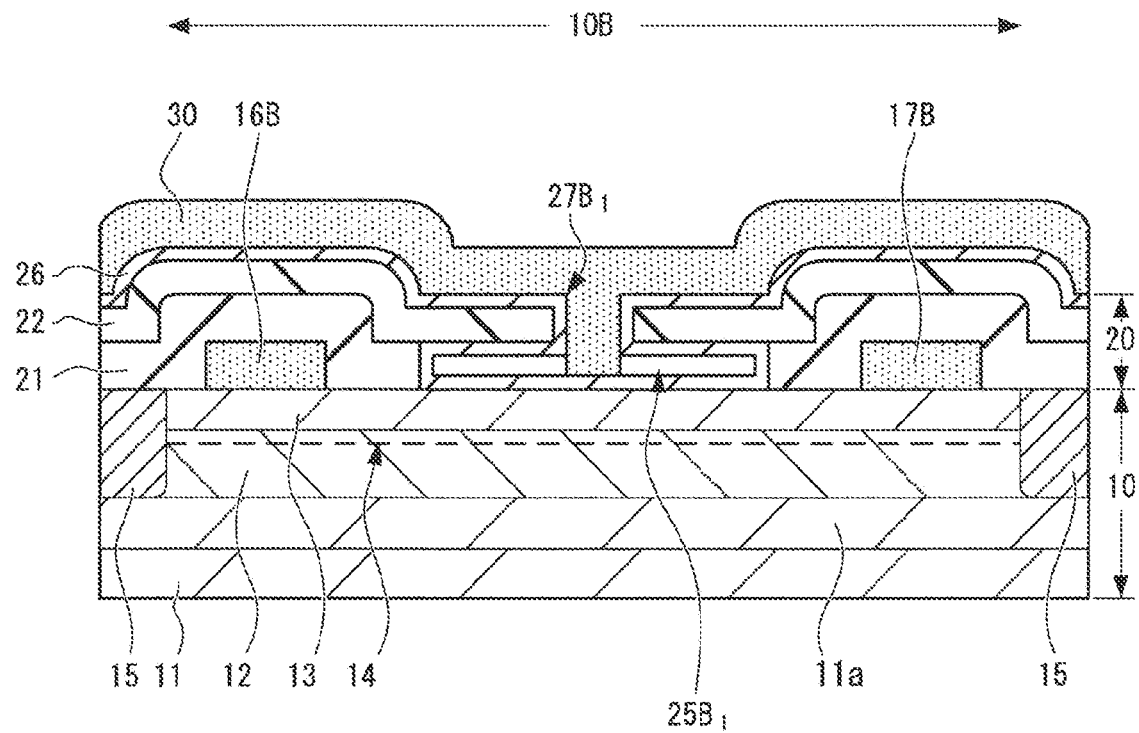
FIG. 15B is a process cross-sectional view continuing FIG. 14B.

Next, as shown in FIGS. 15A and 15B, a gate material 30 is formed on the entire surface of the third insulating film 26 including the above first active region 10A and second active region 10B of the semiconductor substrate 10. The gate material 30 is formed by sequentially laminating, for example, a Ni film and an Au film from the side of the semiconductor substrate 10 by a vapor deposition method.

In this process, the inside of the first gate opening 27A1 and the inside of the second gate opening 27B1 are filled with the gate material 30, and the gate material 30 is selectively filled into a part directly below the first gate opening 27A1 in the first cavity part 25A1 and a part directly below the second gate opening 27B1 in the second cavity part 25B1.

Next, the gate material 30 is patterned using a well-known photolithography technique and a dry etching technique having high directivity, the first gate electrode 31A (refer to FIG. 6) is formed on the first active region 10A of the semiconductor substrate 10, and the second gate electrode 31B (refer to FIG. 6) is formed on the second active region 10B of the semiconductor substrate 10. Here, each of the first gate electrode 31A and the second gate electrode 31B may be formed by a lift-off method.

In this process, the first gate electrode 31A includes the head part $31a_1$ positioned on the insulating layer 20 and the body part $31a_2$ that penetrates the insulating layer 20 from the head part $31a_1$ and protrudes toward the first cavity part $25A_1$, and the head part $31a_1$ is formed wider than the body part $31a_2$. Similarly, the second gate electrode 31B includes the head part $31b_1$ positioned on the insulating layer 20 and the body part $31b_2$ that penetrates the insulating layer 20 from the head part $31b_1$ and protrudes toward the second cavity part $25B_1$, and the head part $31b_1$ is formed wider than the body part $31b_2$.

In addition, in this process, the first cavity part $25A_1$ is formed bilaterally symmetrically with almost the same cavity width on both sides of the first gate electrode 31A in the gate length direction. In addition, the second cavity part $25B_1$ is formed bilaterally symmetrical with almost the same cavity width on both sides of the second gate electrode 31B in the gate length direction.

According to this process, the first field effect transistor Q1 shown in FIG. 2, FIG. 3 and FIG. 6 is almost completed, and the second field effect transistor Q2 shown in FIG. 4, FIG. 5 and FIG. 6 is almost completed.

Then, a wiring layer and other insulating layers are formed on the insulating layer 20, and thus the semiconductor device 1 shown in FIG. 1 to FIG. 6 is almost completed.

According to the method of producing the semiconductor device 1 of the first embodiment, the first cavity part $25A_1$ and the second cavity part $25B_1$ wider than the first cavity part $25A_1$ can be formed by the same process.

In addition, according to the method of producing the semiconductor device 1 of the first embodiment, since the width of the second cavity part $25B_1$ of the second field effect transistor Q2 having a larger planar size than the first field effect transistor Q1 is selectively extended, in the first field effect transistor Q1, the first insulating film 21 can remain between each of the pair of first main electrodes 16A and 17A and the first cavity part $25A_1$, and thus the first field effect transistor Q1 including the first cavity part $25A_1$ and the second field effect transistor Q2 including the second cavity part $25B_1$ wider than the first cavity part $25A_1$ and having a larger planar size than the first field effect transistor Q1 can be formed by the same process.

In addition, according to the method of producing the semiconductor device 1 of the first embodiment, in the first field effect transistor Q1, since the first insulating film 21 can remain between each of the pair of first main electrodes 16A and 17A and the first cavity part $25A_1$, the planar size of the first field effect transistor Q1 can be made smaller than that of the second field effect transistor Q2. Thereby, it is possible to reduce the on-resistance of the first field effect transistor Q1 and improve high frequency characteristics, and reduce the size of the semiconductor device 1.

In addition, in the method of producing the semiconductor device 1 according to the first embodiment, since the first insulating film 21 is etched by wet etching, it is possible to prevent damage to the main surface of the semiconductor substrate 10 (the barrier layer 13). Specifically, since the main surface of the semiconductor substrate 10 is not exposed to plasma, and ions and the like in an etching gas do not enter the semiconductor substrate 10 during etching, deterioration of the on-resistance, that is, an increase in the sheet resistance, and deterioration of off characteristics, that is, an increase in the leakage current or a decrease in the withstand voltage, are not caused.

Second Embodiment

<Configuration of Semiconductor Device>

A semiconductor device 1A according to a second embodiment of the present technology basically has the same configuration as the semiconductor device 1 of the above first embodiment, and includes a second field effect transistor Q3 in place of the second field effect transistor Q2 of the first embodiment.

Figure 16A:
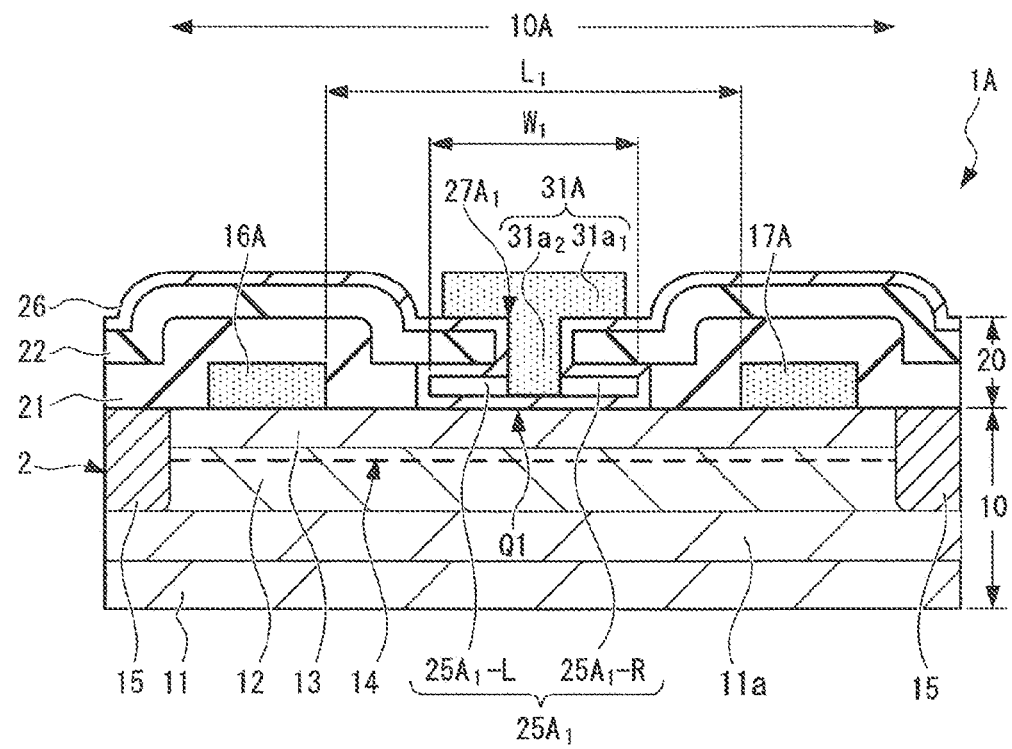
FIG. 16A is a cross-sectional view schematically showing one configuration example of a first transistor mounted on a semiconductor chip in a semiconductor device according to a second embodiment of the present technology.
Figure 16B:
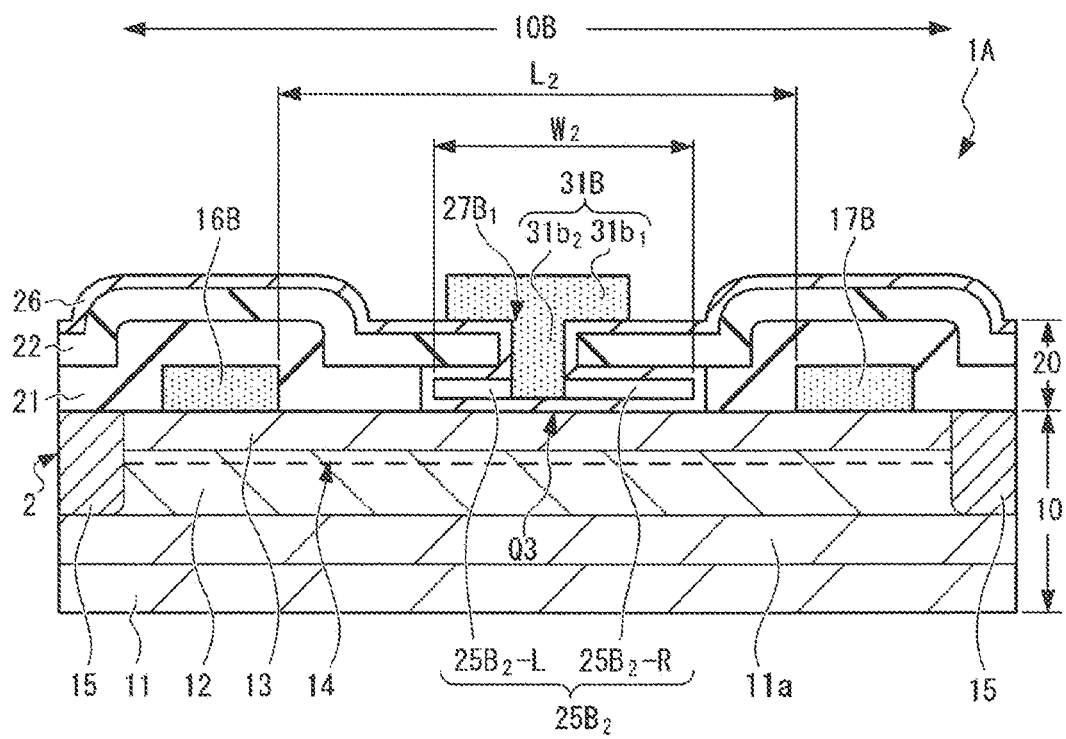
FIG. 16B is a cross-sectional view schematically showing one configuration example of a second transistor mounted on a semiconductor chip in the semiconductor device according to the second embodiment of the present technology.

That is, as shown in FIGS. 16A and 16B, the semiconductor device 1A according to the second embodiment of the present technology includes the first field effect transistor Q1 formed in the first active region 10A of the main surface of the semiconductor substrate 10 (refer to FIG. 16A) and the second field effect transistor Q3 formed in the second active region 10B of the main surface of the semiconductor substrate 10 (refer to FIG. 16B). Here, as shown in FIG. 16B, the second field effect transistor Q3 includes a second cavity part 25B2 in place of the second cavity part 25B1 of the second field effect transistor Q2 of the first embodiment. The other configurations are the same as those in the above first embodiment.

Like the second cavity part $B_1$ of the above first embodiment, the plane pattern of the second cavity part $25B_2$ of the second field effect transistor Q3 when viewed in a plan view is a circular plane pattern surrounding the body part $31b_2$ of the second gate electrode 31B. Therefore, like the second cavity part $25B_1$ of the above first embodiment, as shown in FIG. 16B, the second cavity part $25B_2$ includes a first part $25B_2$-L positioned on one side (left side) of the body part $31b_2$ of the second gate electrode 31B and a second part $25B_2$-R positioned on the other side (right side) of the body part $31b_2$ of the second gate electrode 31B in the gate length direction of the second gate electrode 31B. Here, unlike the second cavity part $25B_1$ of the above first embodiment, in the second embodiment, the second cavity part $25B_2$ has a bilaterally asymmetrical configuration in which the width of the second part $25B_2$-R is wider than the width of the first part $25B_2$-L.

In the gate length direction (longitudinal direction) of the second gate electrode 31B, the second cavity part $25B_2$ is wider than the body part $31b_2$ of the second gate electrode 31B and the second gate opening 27B1. Here, the width W2 of the second cavity part $25B_2$ is wider than the width $W_1$ of the first cavity part $25A_1$. That is, the second cavity part $25B_2$ is wider than the first cavity part $25A_1$.

According to the semiconductor device 1A according to the second embodiment, the same effects as those of the semiconductor device 1 according to the first embodiment described above can be obtained.

In addition, for example, when reduction in the source resistance is important for the device characteristics, in the second field effect transistor Q3, when one second main electrode 16B is used as a drain electrode, if the separation distance between one second main electrode 16B and the second gate electrode 31B increases, the source resistance increases and the device characteristics deteriorate. Here, when the width of the second cavity part $25B_2$-R on the side of the other second main electrode 16B that functions as a drain electrode is widened, while the source resistance is kept low, an effect of reducing the parasitic capacitance (Cgd) added between the gate electrode and the other main electrode can be improved.

Here, a wiring layer and other insulating layers are provided above the insulating layer 20, but in FIGS. 16A and 16B, the wiring layer and other insulating films above the insulating layer 20 are not shown.

<Method of Producing Semiconductor Device>

Next, a method of producing the semiconductor device 1A according to the second embodiment will be described with reference to FIGS. 17A, 17B, 18A, 18B, 19A, 19B, 20A, and 20B. FIGS. 17A, 18A, 19A and 20A show processes of forming the first field effect transistor Q1 in the first active region 10A of the semiconductor substrate 10. FIGS. 17B, 18B, 19B and 20B show processes of forming the second field effect transistor Q3 in the second active region 10B of the semiconductor substrate 10. The first field effect transistor Q1 and the second field effect transistor Q3 are formed by the same process.

Figure 17A:
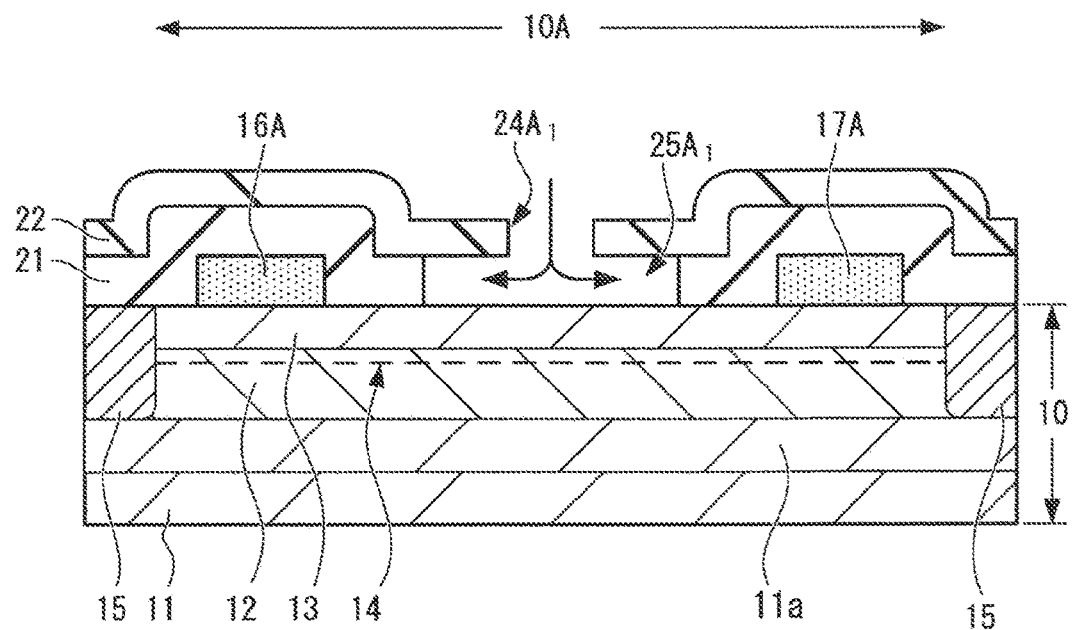
FIG. 17A is a process cross-sectional view of a method of producing a semiconductor device according to the second embodiment of the present technology.
Figure 17B:
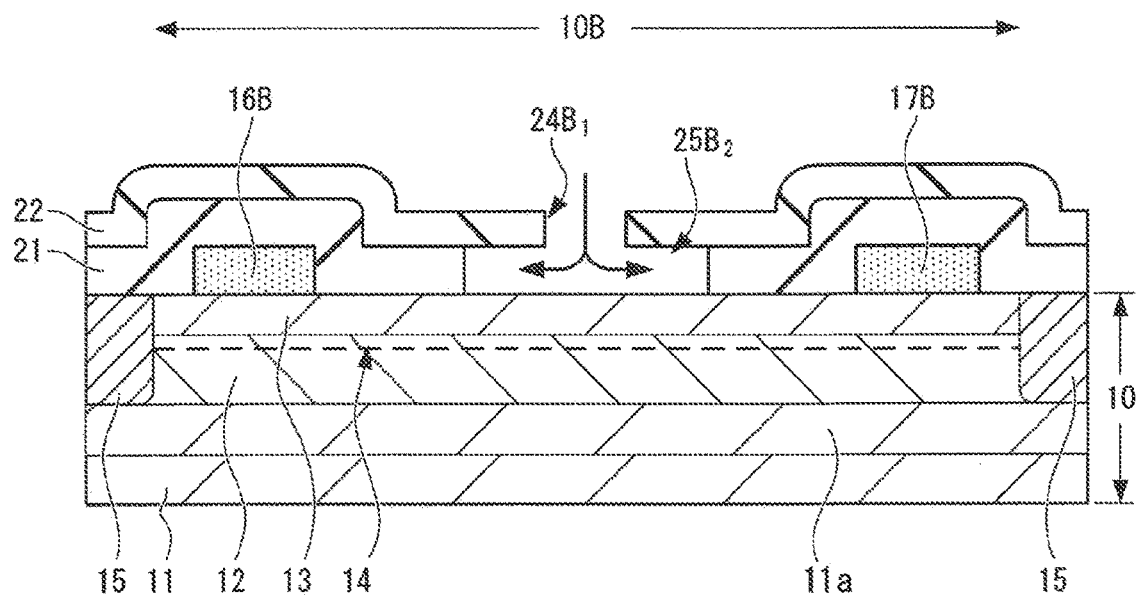
FIG. 17B is a process cross-sectional view of the method of producing a semiconductor device according to the second embodiment of the present technology.

First, the same processes as the processes shown in FIGS. 7A, 7B, 8A, 8B, 9A, 9B, 10A, and 10B in the first embodiment are performed, and as shown in FIGS. 17A and 17B, the pair of first main electrodes 16A and 17A, the pair of second main electrodes 16B and 17B, the first insulating film 21 and the second insulating film 22, the first opening 24A1 and the second opening 24B1 and the like are formed.

Next, the same processes as the processes shown in FIGS. 11A and 11B in the above first embodiment are performed, and as shown in FIGS. 17A and 17B, the first cavity part 25A1 wider than the first opening 24A1 is formed, and the second cavity part 25B2 wider than the second opening 24B1 is formed.

Figure 18A:
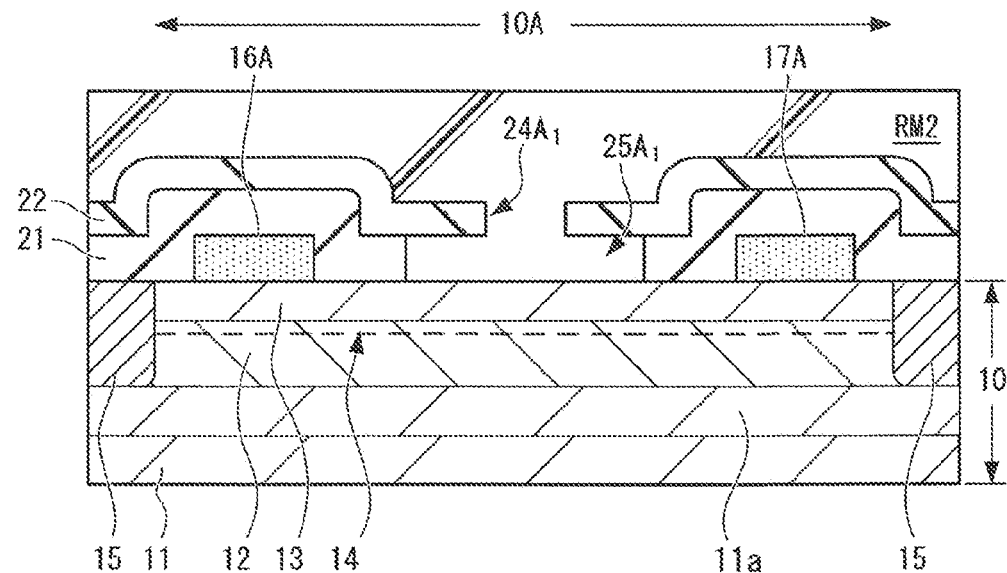
FIG. 18A is a process cross-sectional view continuing FIG. 17A.
Figure 18B:
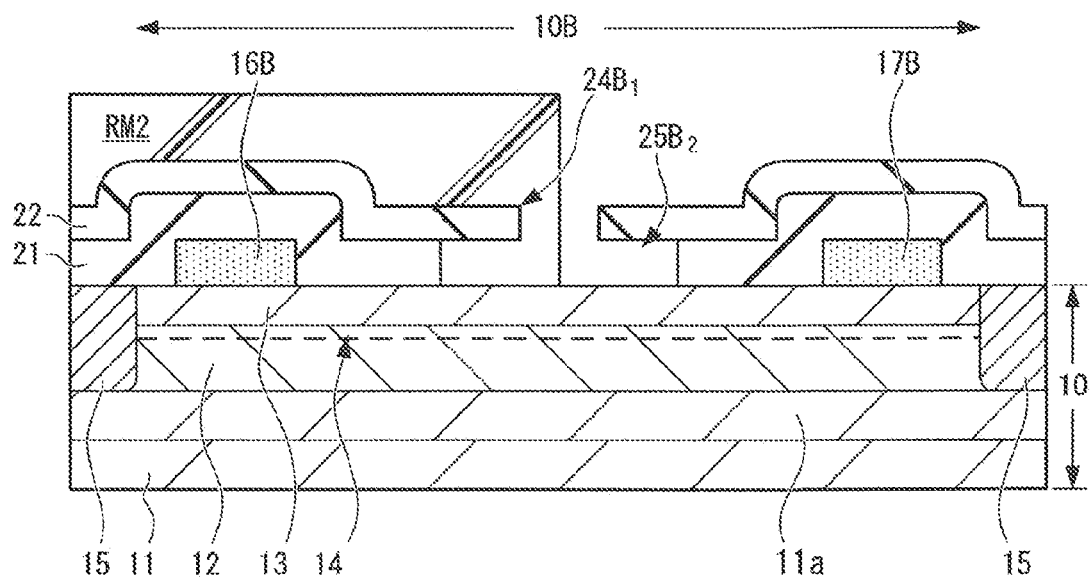
FIG. 18B is a process cross-sectional view continuing FIG. 17B.

Next, as shown in FIGS. 18A and 18B, a mask RM2 that covers the first opening 24A1 on the first active region 10A of the semiconductor substrate 10 and covers a part of each of the second opening 24B1 and the second cavity part 25B2 on the second active region 10B of the semiconductor substrate 10 in the width direction is formed. That is, the mask RM2 in which the side wall of the opening end is separated from one side wall between both side walls of each of the second opening 24B1 and the second cavity part 25B2 in the width direction is formed on the second active region 10B. Like the mask RM1 of the above first embodiment, the mask RM2 is formed by forming a photosensitive resist film on the entire main surface of the semiconductor substrate 10 including the above first active region 10A and second active region 10B, and then subjecting the photosensitive resist film to a photosensitivity and developing treatment or the like to form a predetermined pattern.

Figure 19A:
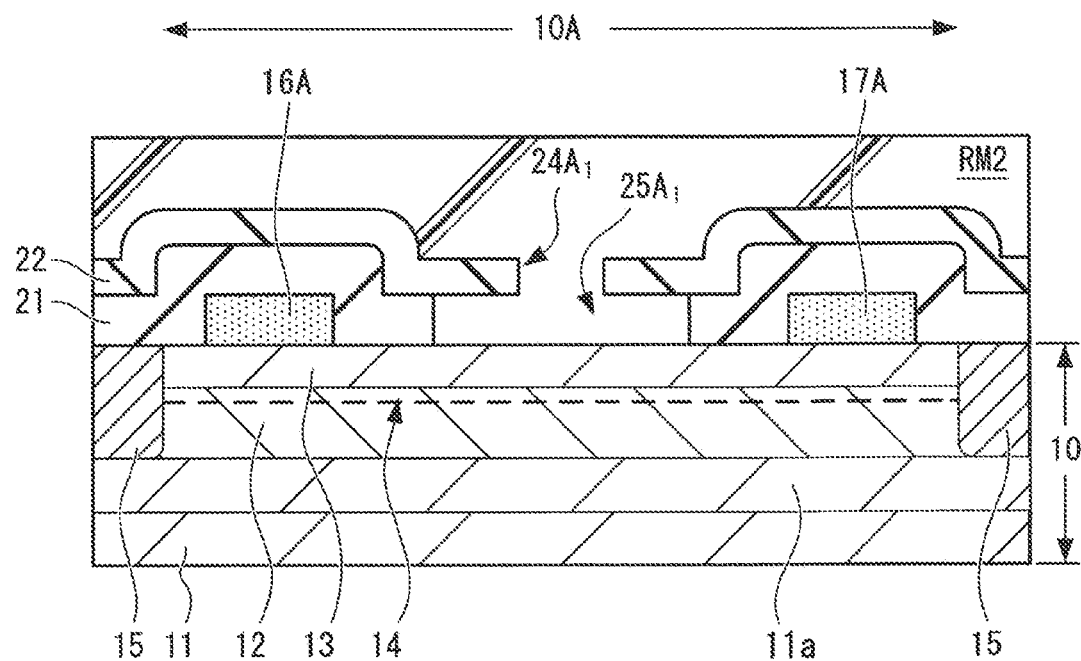
FIG. 19A is a process cross-sectional view continuing FIG. 18A.
Figure 19B:
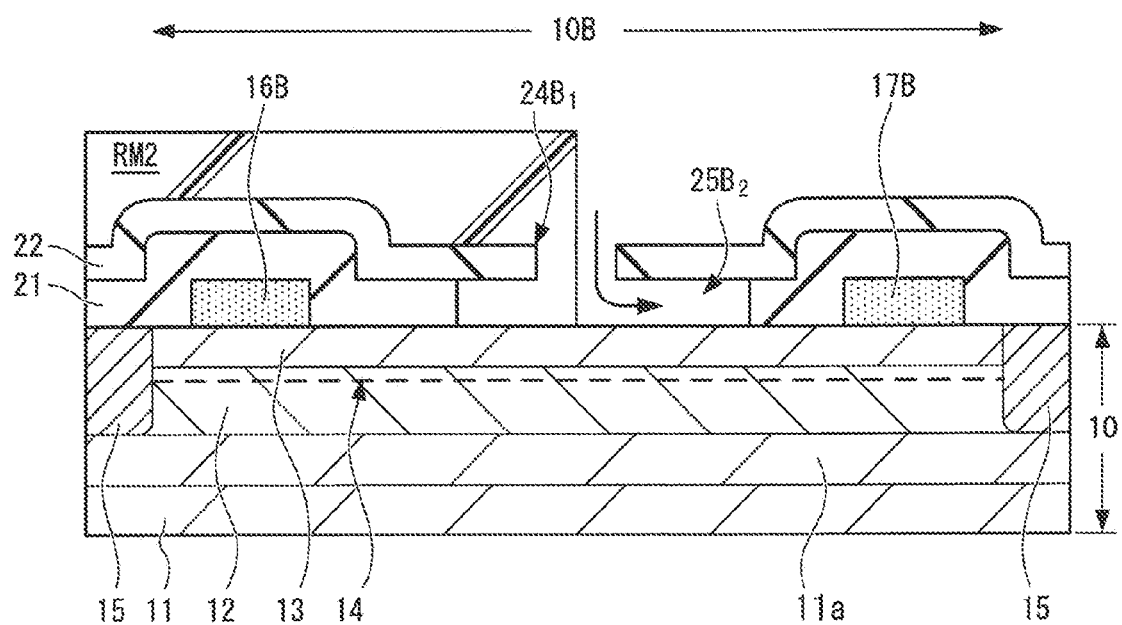
FIG. 19B is a process cross-sectional view continuing FIG. 18B.

Next, the mask RM2 is used as an etching mask, and as shown in FIGS. 19A and 19B, and the width of the second cavity part 25B2 is extended by etching the first insulating film 21 through the space between the side wall of the mask RM2 and the side wall in the second opening 24B1 of the second insulating film 22 when the first opening 24A1 is covered with the mask RM2 and a part of each of the second opening 24B1 and the second cavity part 25B2 in the width direction is covered with the mask RM2. Like the extension of the second cavity part 25B2 in the above first embodiment, the extension of the second cavity part 25B2 is performed by etching the first insulating film 21 by performing isotropic wet etching with less damage on the main surface of the semiconductor substrate 10, that is, the surface of the barrier layer 13. In addition, wet etching of the first insulating film 21 is performed under conditions in which an etching selectivity with respect to the second insulating film 22 is obtained as in the above second embodiment.

According to this process, the second cavity part 25B2 having a width W2 wider than the width W1 of the first cavity part 25A1 is formed. The width of the second cavity part 25B2 extending from the second opening 24B1 toward the second main electrode 17B is formed wider than the width of the second cavity part 25B2 extending from the second opening 24B1 toward one second main electrode 16B.

In addition, in this process, since the width of the second cavity part 25B2 is extended, the first insulating film 21 can remain between each of the pair of first main electrodes 16A and 17A and the first cavity part 25A1, and the first insulating film 21 can remain between each of the pair of second main electrodes 16B and 17B and the second cavity part 25B1.

Figure 20A:
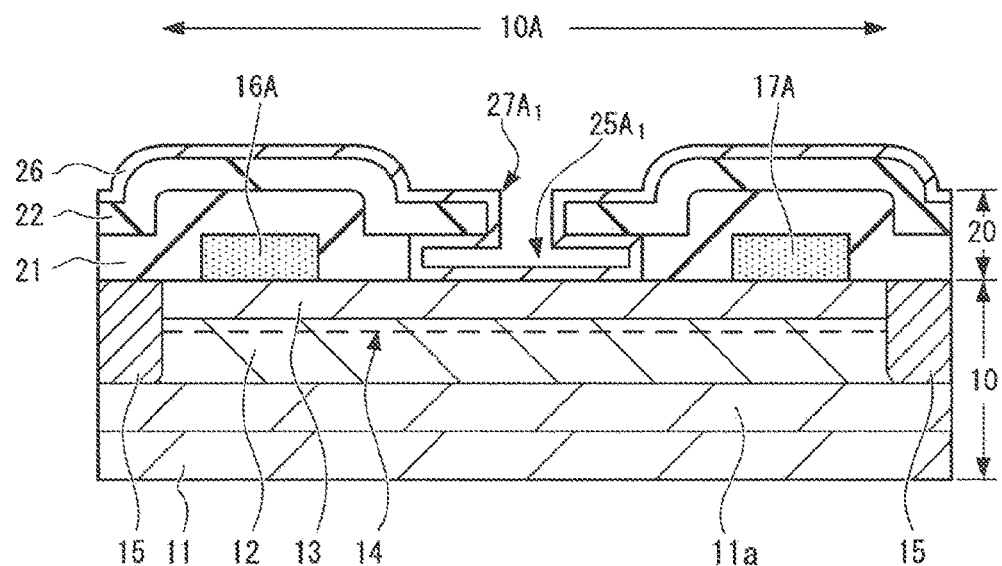
FIG. 20A is a process cross-sectional view continuing FIG. 19A.
Figure 20B:
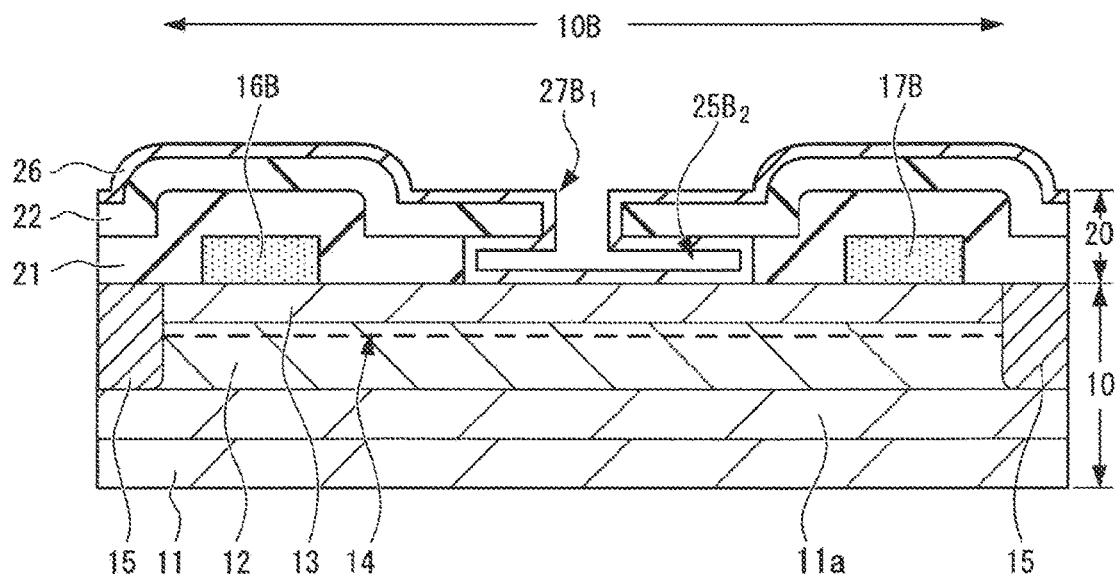
FIG. 20B is a process cross-sectional view continuing FIG. 19B.

Next, after the mask RM2 is removed, the processes shown in FIGS. 13A and 13B in the above first embodiment 1 are performed, and as shown in FIGS. 20A and 20B, in the first cavity part 25A1 and the second cavity part 25B2, the third insulating film 26 that covers the first insulating film 21, the second insulating film 22, and the main surface of the semiconductor substrate 10 (the surface of the barrier layer 13), covers respective side walls in the first opening 24A1 and the second opening 24B1 of the second insulating film 22, and covers the second insulating film 22 is formed.

In this process, the insulating layer 20 including the first insulating film 21, the second insulating film 22 and the third insulating film 26 is formed on the first active region 10A and the second active region 10B of the semiconductor substrate 10.

In addition, in this process, since respective side walls in the first opening 24A1 and the second opening 24B1 of the second insulating film 22 are covered with the third insulating film 26, the first gate opening 27A1 having a narrower opening width than the first opening 24A1 is formed, and the second gate opening 27B1 having a narrower opening width than the second opening 24B1 is formed.

In addition, in this process, the first cavity part 25A1 and the second cavity part 25B2 are surrounded by the third insulating film 26. Here, since the third insulating film 26 is formed with an almost uniform film thickness, in the first cavity part 25A1 and the second cavity part 25B2 surrounded by the third insulating film 26, the width W2 (refer to FIG. 16B) of the second cavity part 25B2 is larger than the width W1 (refer to FIG. 16A) of the first cavity part 25A1.

Then, the same processes as in the above first embodiment are performed, the first gate electrode 31A and the second gate electrode 31B are formed, and thus the first field effect transistor Q1 shown in FIG. 16A is almost completed, and the second field effect transistor Q3 shown in FIG. 16B is almost completed.

After that, as in the above first embodiment, a wiring layer and other insulating layers are formed on the insulating layer 20, and thus the semiconductor device 1A according to the second embodiment is almost completed.

According to the method of producing the semiconductor device 1A of the second embodiment, the same effects as in method of producing the semiconductor device 1 according to the first embodiment described above can be obtained.

In addition, according to the method of producing the semiconductor device 1A of the second embodiment, it is possible to form the bilaterally asymmetrical second cavity part $25B_2$ in which the width of the second part $25B_2$-R is wider than the width of the first part $25B_2$-L. Here, the width of the second part $25B_2$-R of the second cavity part $25B_2$ can be made wider than the width of the second part $25A_1$-R of the first cavity part $25A_1$.

In addition, the asymmetrical second cavity part $25B_2$ can be formed with the same number of masks as in the first embodiment.

Third Embodiment

<Configuration of Semiconductor Device>

A semiconductor device 1B according to a third embodiment of the present technology basically has the same configuration as the semiconductor device 1 of the above first embodiment, and includes a second field effect transistor Q4 in place of the second field effect transistor Q2 of the above first embodiment.

Figure 21A:
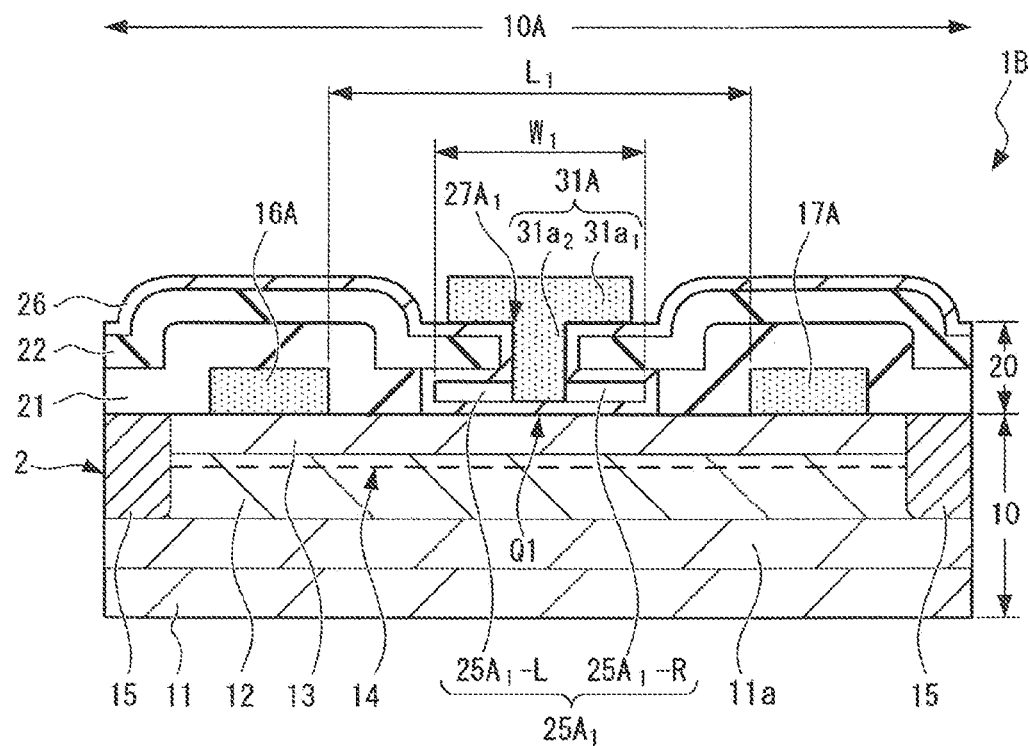
FIG. 21A is a cross-sectional view schematically showing one configuration example of a first transistor mounted on a power switch part of a semiconductor device according to a third embodiment of the present technology.
Figure 21B:
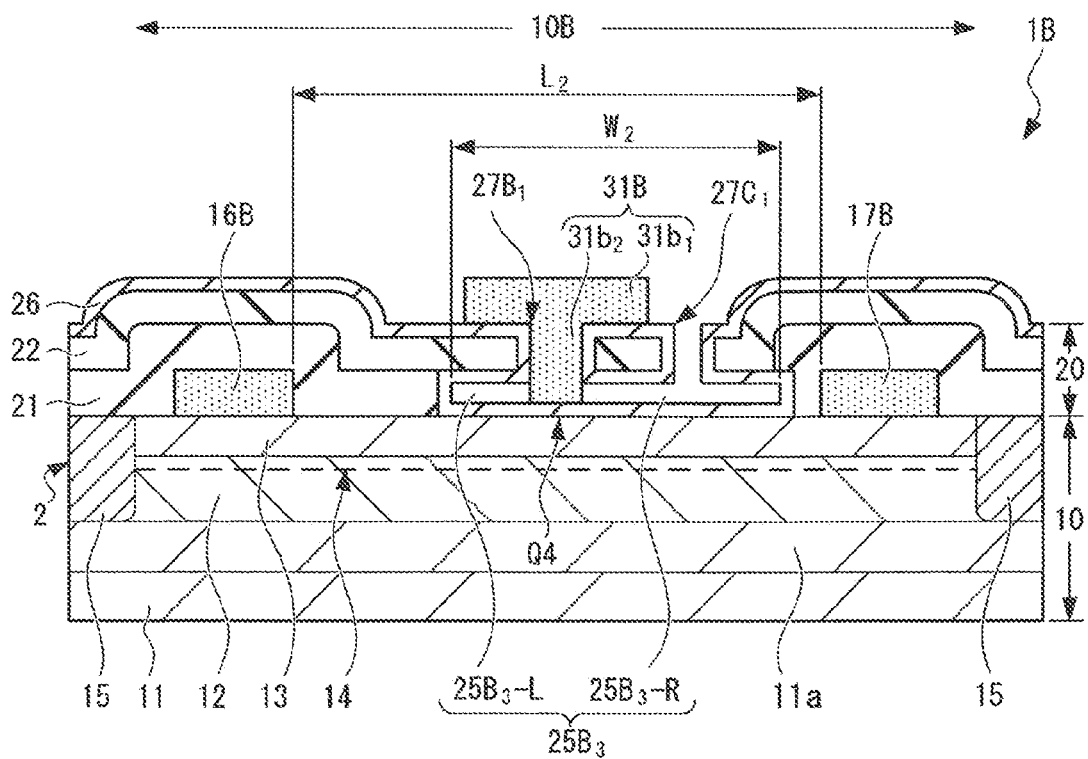
FIG. 21B is a cross-sectional view schematically showing one configuration example of a second transistor mounted on a power amplifier part for amplification of the semiconductor device according to the third embodiment of the present technology.

That is, as shown in FIGS. 21A and 21B, the semiconductor device 1B according to the third embodiment of the present technology includes the first field effect transistor Q1 formed in the first active region 10A of the main surface of the semiconductor substrate 10 (refer to FIG. 21A) and the second field effect transistor Q4 formed in the second active region 10B of the main surface of the semiconductor substrate 10 (refer to FIG. 21B). Here, as shown in FIG. 21B, the second field effect transistor Q4 includes a second cavity part 25B3 in place of the second cavity part 25B1 of the above second field effect transistor Q2 of the first embodiment. The other configurations are the same as those in the above first embodiment.

Like the second cavity part $25B_1$ of the above first embodiment, the plane pattern of the second cavity part $25B_3$ of the second field effect transistor Q4 when viewed in a plan view is a circular plane pattern surrounding the body part $31b_2$ of the second gate electrode 31B. Therefore, like the second cavity part $25B_1$ of the above first embodiment, as shown in FIG. 21B, the second cavity part $25B_3$ includes a first part $25B_3$-L positioned on one side (left side) of the body part $31b_2$ of the second gate electrode 31B and a second part $25B_3$-R positioned on the other side (right side) of the body part $31b_2$ of the second gate electrode 31B in the gate length direction of the second gate electrode 31B. Here, unlike the second cavity part $25B_1$ of the above first embodiment, in the third embodiment, the second cavity part $25B_3$ has a bilaterally asymmetrical configuration in which the width of the second part $25B_3$-R is wider than the width of the first part $25B_3$-L. Here, a third opening 27C1 provided in the insulating layer 20 is connected to the second part $25B_3$-R of the second cavity part $25B_3$.

The second cavity part $25B_3$ is wider than the body part $31b_2$ of the second gate electrode 31B and the second gate opening 27B1 in the gate length direction (longitudinal direction) of the second gate electrode 31B. Here, the width $W_2$ of the second cavity part $25B_3$ is wider than the width $W_1$ of the first cavity part $25A_1$. That is, the second cavity part $25B_3$ is wider than the first cavity part $25A_1$.

According to the semiconductor device 1B according to the third embodiment, the same effects as those of the semiconductor device 1A according to the second embodiment described above can be obtained.

Here, a wiring layer and other insulating layers are provided above the insulating layer 20, but in FIGS. 21A and 21B, the wiring layer and other insulating films above the insulating layer 20 are not shown.

<Method of Producing Semiconductor Device>

Figure 22A:
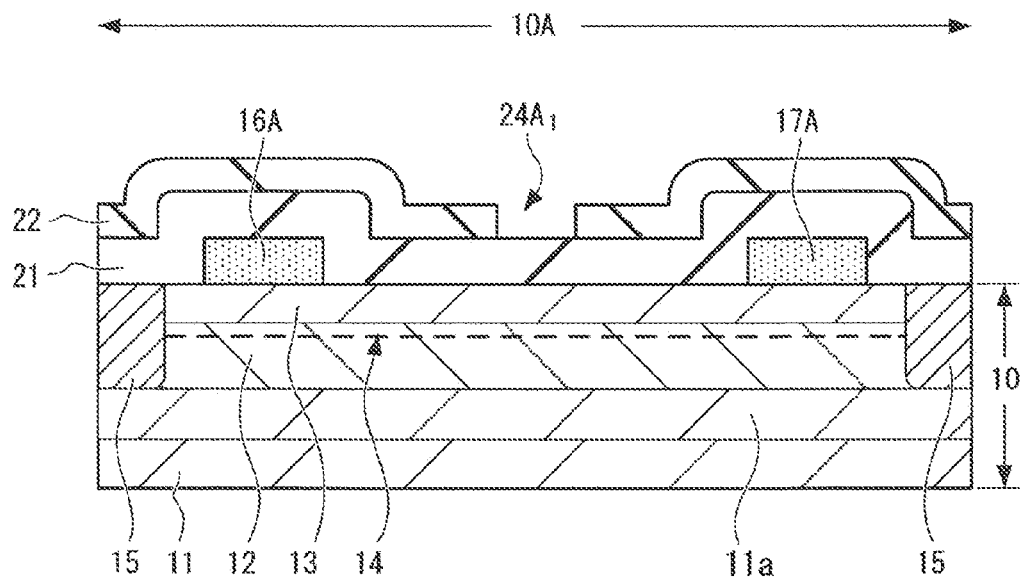
FIG. 22A is a process cross-sectional view of a method of producing a semiconductor device according to the third embodiment of the present technology.
Figure 22B:
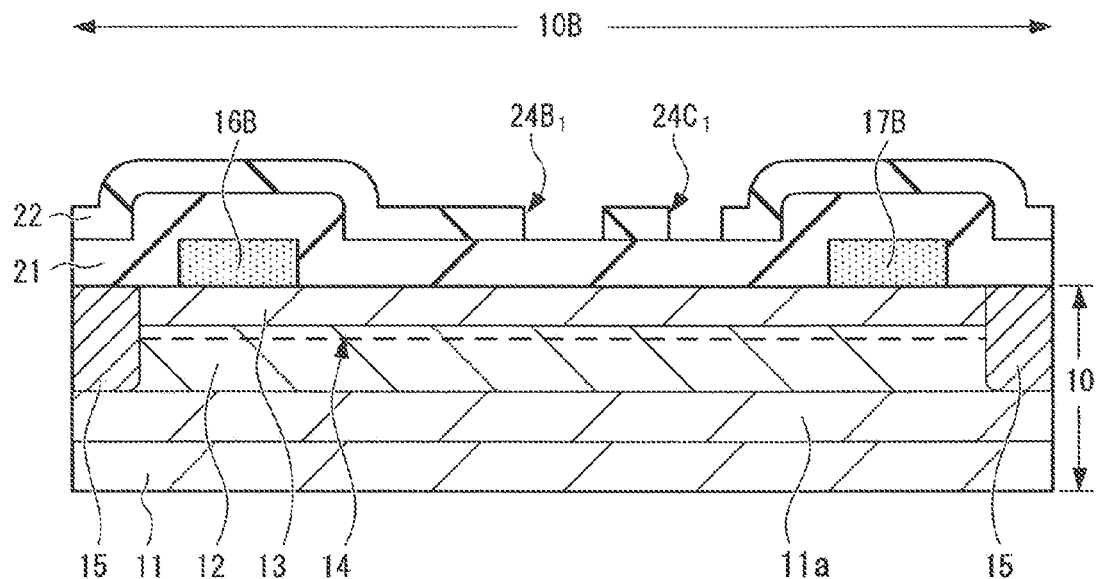
FIG. 22B is a process cross-sectional view of the method of producing a semiconductor device according to the third embodiment of the present technology.
Figure 23A:
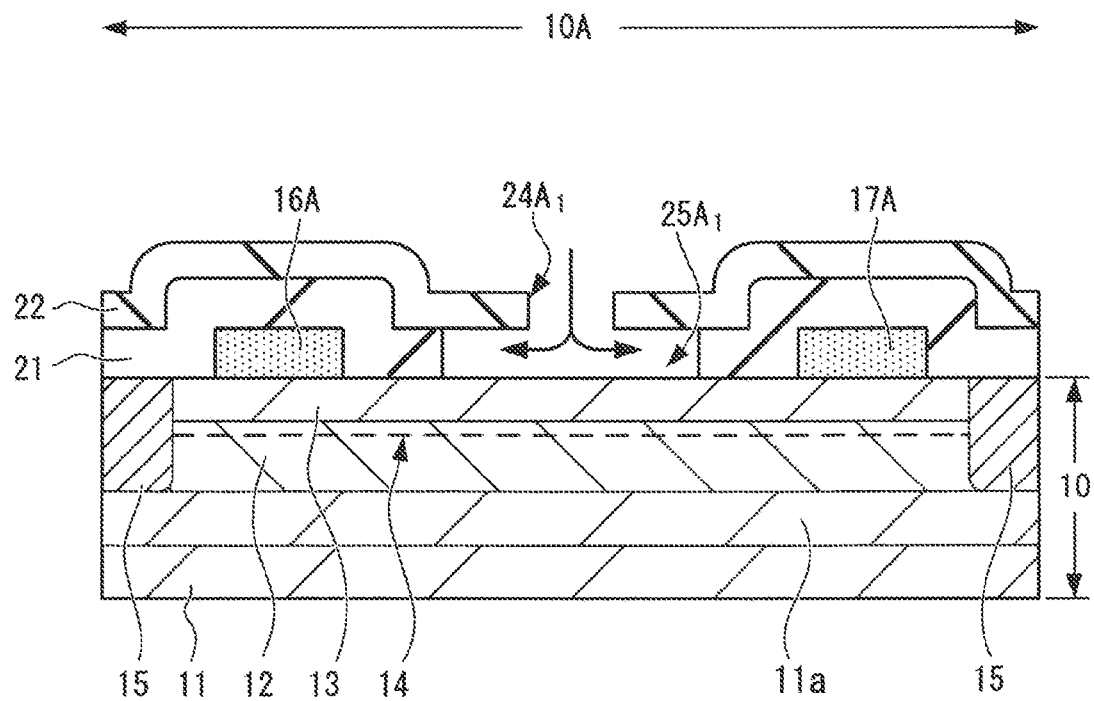
FIG. 23A is a process cross-sectional view continuing FIG. 22A.
Figure 23B:
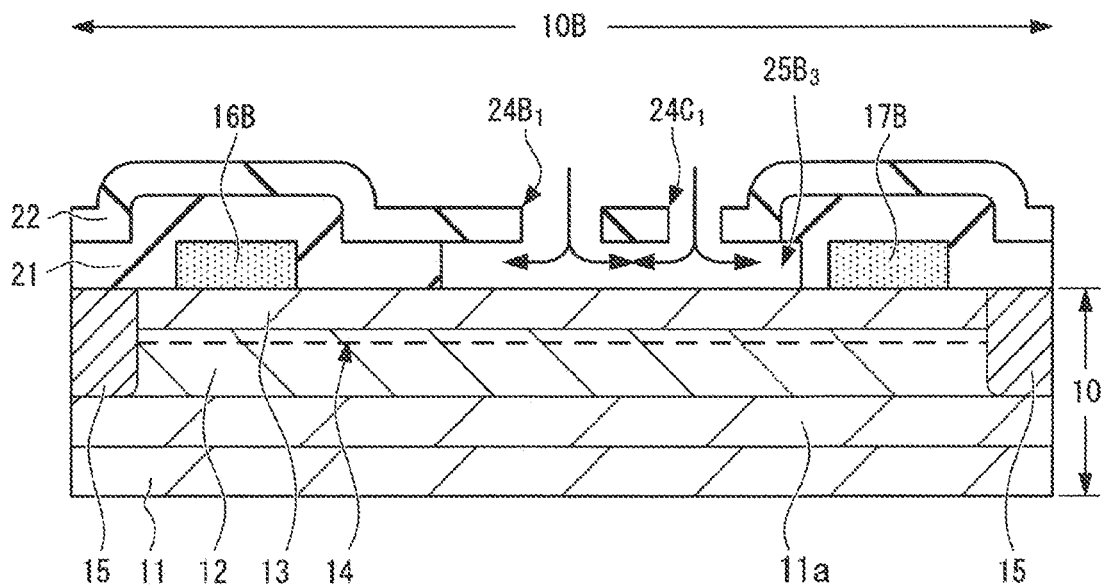
FIG. 23B is a process cross-sectional view continuing FIG. 22B.
Figure 24A:
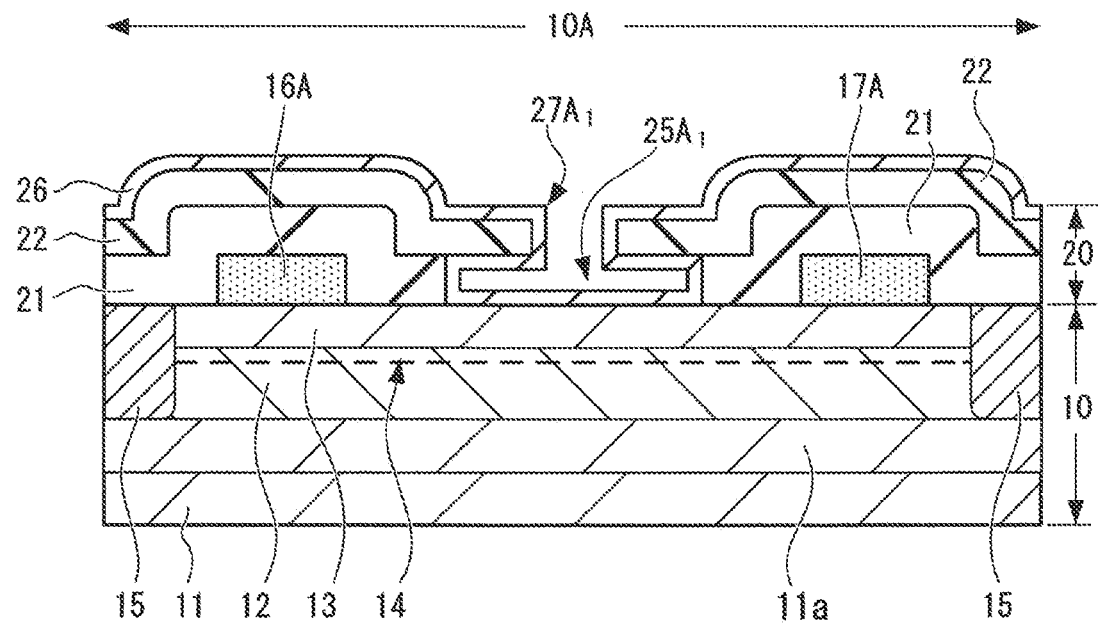
FIG. 24A is a process cross-sectional view continuing FIG. 23A.
Figure 24B:
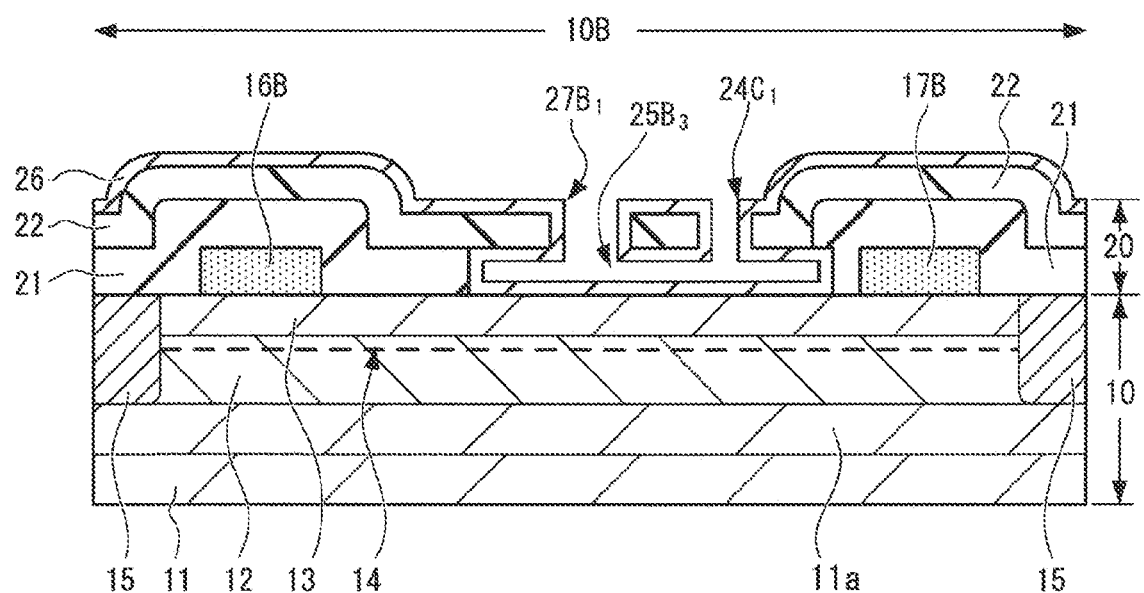
FIG. 24B is a process cross-sectional view continuing FIG. 23B.

Next, a method of producing the semiconductor device 1B according to the third embodiment will be described with reference to FIGS. 22A, 22B, 23A, 23B, 24A, and 24B. FIGS. 22A, 23A, and 24A show processes of forming the first field effect transistor Q1 in the first active region 10A of the semiconductor substrate 10, and FIGS. 22B, 23B, and 24B show processes of forming the second field effect transistor Q4 in the second active region 10B of the semiconductor substrate 10. The first field effect transistor Q1 and the second field effect transistor Q4 are formed by the same process.

First, the same processes as the processes shown in FIGS. 7A, 7B, 8A, 8B, 9A, and 9B in the first embodiment are performed, and as shown in FIGS. 22A and 22B, the pair of first main electrodes 16A and 17A, the pair of second main electrodes 16B and 17B, the first insulating film 21 and the second insulating film 22 and the like are formed.

Next, as shown in FIGS. 22A and 22B, the first opening 24A1 is formed in the second insulating film 22 on the first active region 10A of the main surface of the semiconductor substrate 10, and the second opening 24B1 and a third opening 24C1 adjacent to each other are formed in the second insulating film 22 on the second active region 10B of the main surface of the semiconductor substrate 10. The first opening 24A1, the second opening 24B1 and the third opening 24C1 are formed by etching the second insulating film 22 using a well-known photolithography technique and well-known dry etching having high directivity as an anisotropic etching technique as in the above first embodiment.

The first opening 24A1 is formed between the pair of first main electrodes 16A and 17A in a plan view, and is formed with a long plane pattern in the longitudinal direction of the pair of first main electrodes 16A and 17A. The second opening 24B1 and the third opening 24C1 are formed between the pair of second main electrodes 16B and 17B in a plan view, and are formed with a long plane pattern in the longitudinal direction of the pair of second main electrodes 16B and 17B.

Next, as shown in FIGS. 23A and 23B, the first cavity part 25A1 wider than the first opening 24A1 is formed by etching the first insulating film 21 on the first active region 10A of the semiconductor substrate 10 through the first opening 24A1, and the second cavity part 25B3 wider than the first cavity part 25A1 is formed by etching the first insulating film 21 on the second active region 10B of the semiconductor substrate 10 through the second opening 24B1 and the third opening 24C1.

The first cavity part 25A1 and the second cavity part 25B3 are formed by etching the first insulating film 21 by performing isotropic wet etching with less damage on the main surface of the semiconductor substrate 10, that is, the surface of the barrier layer 13. Wet etching of the first insulating film 21 is performed under conditions in which an etching selectivity with respect to the second insulating film 22 is obtained as in the above first embodiment.

In this process, since the first insulating film 21 on the second active region 10B is etched with an etching solution supplied through two openings (the second opening $24B_1$ and the third opening $2C_1$), the second cavity part $25B_3$ having the width W2 (refer to FIG. 21B) wider than the width $W_1$ (refer to FIG. 21A) of the first cavity part $25A_1$ formed with an etching solution supplied through one opening is formed. In addition, since the third opening $24C_1$ is provided between the second opening $24B_1$ and the other second main electrode 17B in a plan view, the width of the second cavity part $25B_3$ extending from the second opening $24B_1$ toward the other second main electrode 17B is formed wider than the width of the second cavity part $25B_3$ extending from the second opening $24B_1$ to one second main electrode 16B.

Next, the same processes as the processes shown in FIGS. 13A and 13B in the above first embodiment 1 are performed, and as shown in FIGS. 24A and 24B, in the first cavity part 25A1 and the second cavity part 25B3, the third insulating film 26 that covers the first insulating film 21, the second insulating film 22, and the main surface of the semiconductor substrate 10 (the surface of the barrier layer 13), covers respective side walls in the first opening 24A1, the second opening 24B1 and the third opening 24C1 of the second insulating film 22, and covers the second insulating film 22 is formed.

In this process, the insulating layer 20 including the first insulating film 21, the second insulating film 22 and the third insulating film 26 is formed on the first active region 10A and the second active region 10B of the semiconductor substrate 10.

In addition, in this process, since respective side walls in the first opening 24A1 and a second opening 24B2 of the second insulating film 22 are covered with the third insulating film 26, the first gate opening 27A1 having a narrower opening width than the first opening 24A1 is formed, and a second gate opening 27B2 having a narrower opening width than the second opening 24B1 and the third opening 27C1 having a narrower opening width than the third opening 24C1 are formed.

In addition, in this process, the first cavity part 25A1 and the second cavity part 25B3 are surrounded by the third insulating film 26. Here, since the third insulating film 26 is formed with an almost uniform film thickness, in the first cavity part 25A1 and the second cavity part 25B3 surrounded by the third insulating film 26, the width W2 (refer to FIG. 21B) of the second cavity part 25B3 is wider than the width W1 (refer to FIG. 21A) of the first cavity part 25A1.

Then, the same processes as in the above first embodiment are performed, the first gate electrode 31A and the second gate electrode 31B are formed, and thus the first field effect transistor Q1 shown in FIG. 21A is almost completed, and the second field effect transistor Q4 shown in FIG. 21B is almost completed.

After that, as in the above first embodiment, a wiring layer and other insulating layers are formed on the insulating layer 20, and thus the semiconductor device 1 according to the second embodiment is almost completed.

According to the method of producing the semiconductor device 1B of the third embodiment, the same effects as in the method of producing a semiconductor device according to the first embodiment described above can be obtained.

In addition, according to the method of producing the semiconductor device 1B of the third embodiment, it is possible to form the bilaterally asymmetrical second cavity part $25B_3$ in which the width of the second part $25B_3$-R is wider than the width of the first part $25B_3$-L.

In addition, since the second cavity part $25B_3$ wider than the first cavity part $25A_1$ can be formed without using an etching mask, it is possible to reduce the number of production processes as compared with the above first embodiment and second embodiment, and it is possible to reduce the production cost of the semiconductor device 1B.

Here, in the above third embodiment, two openings (the second opening $24B_1$ and the second opening $24C_1$) are formed in the second insulating film 22 on the second active region 10B, but three or more openings may be formed in the second insulating film 22 on the second active region 10B. A plurality of openings are arranged at predetermined intervals in the arrangement direction of the pair of second gate electrodes 17A and 17B.

Fourth Embodiment

<Configuration of Semiconductor Device>

Figure 25A:
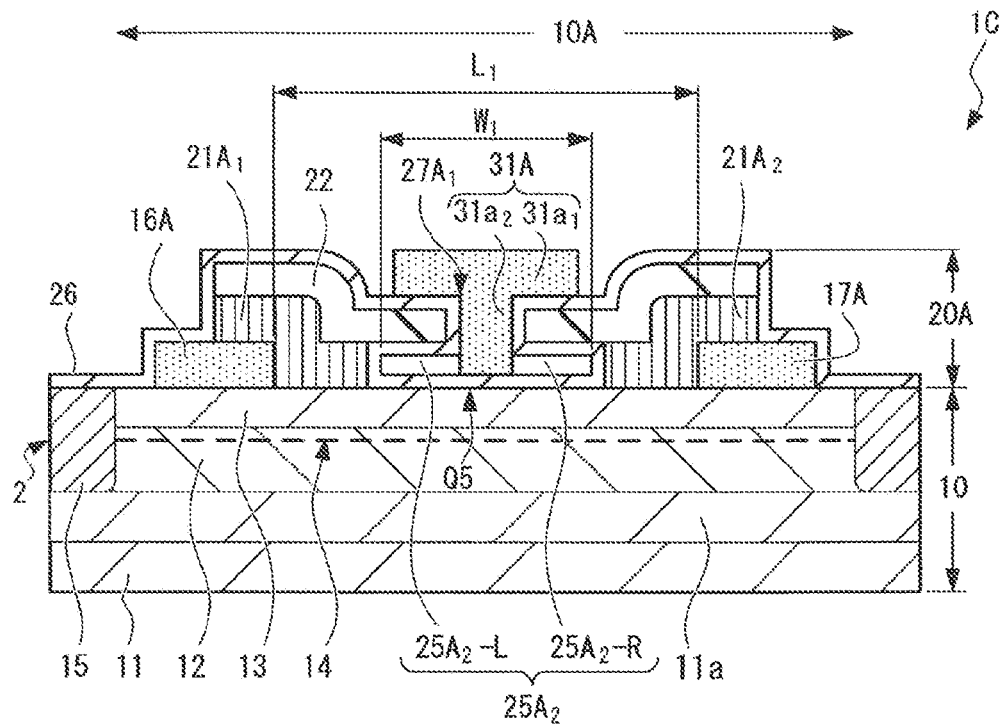
FIG. 25A is a cross-sectional view schematically showing one configuration example of a first transistor mounted on a power switch part of a semiconductor device according to a fourth embodiment of the present technology.
Figure 25B:
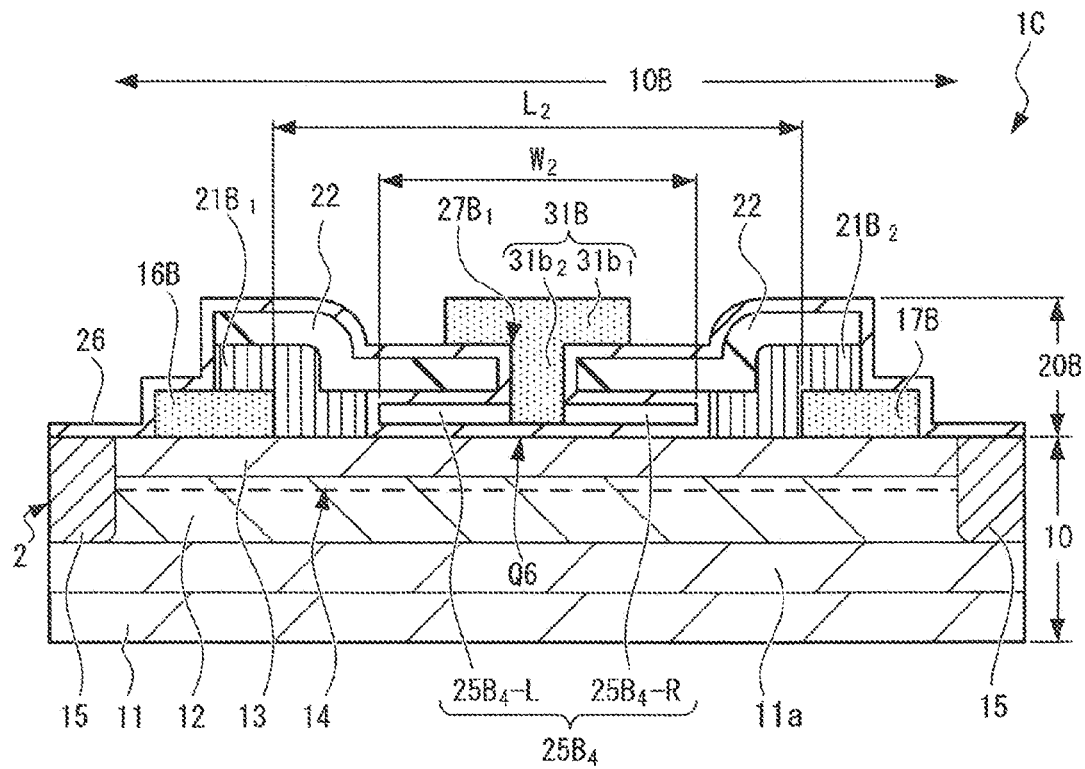
FIG. 25B is a cross-sectional view schematically showing one configuration example of a second transistor mounted on a power amplifier part for amplification of the semiconductor device according to the fourth embodiment of the present technology.

As shown in FIGS. 25A and 25B, a semiconductor device 1C according to a fourth embodiment of the present technology includes the semiconductor substrate 10, a first insulating layer 20A provided on the first active region 10A of the main surface of the semiconductor substrate 10, and a second insulating layer 20B provided on the second active region 10B different from the first active region 10A of the main surface of the semiconductor substrate 10. In addition, the semiconductor device 1C includes a first field effect transistor Q5 formed in the first active region 10A of the main surface of the semiconductor substrate 10 and a second field effect transistor Q6 formed in the second active region 10B of the main surface of the semiconductor substrate 10. The first field effect transistor Q5 is an element constituting a high frequency switch of the high frequency switch part SW shown in FIG. 1. The second field effect transistor Q6 is an element constituting a high frequency power amplifier of the high frequency power amplifier part PA shown in FIG. 1.

As shown in FIG. 25A, the first insulating layer 20A includes a pair of first etching stopper parts $21A_1$ and $21A_2$ provided on the first active region 10A of the main surface of the semiconductor substrate 10, the second insulating film 22 provided on the pair of first etching stopper parts $21A_1$ and $21A_2$, and the third insulating film 26 provided on the second insulating film 22.

As shown in FIG. 25B, the second insulating layer 20B includes a pair of second etching stopper parts $21B_1$ and $21B_2$ provided on the second active region 10B of the main surface of the semiconductor substrate 10, the second insulating film 22 provided on the pair of second etching stopper parts $21B_1$ and $21B_2$, and the third insulating film 26 provided on the second insulating film 22.

The first insulating film 21 (refer to FIGS. 28A and 28B) is formed of, for example, an Al302 film. The pair of first etching stopper parts 21A1 and 21A2, and the pair of second etching stopper parts 21B1 and 21B2 are formed of, for example, a crystallization region in which a heat treatment is performed on the first insulating film 21 (refer to FIGS. 28A and 28B) to enhance chemical resistance to an etching solution during wet etching. The second insulating film 22 is formed of, for example, a SiO2 film having a high etching selectivity with respect to the first insulating film 21. The first insulating film 21 is formed with, for example, a film thickness of about 50 nm. The pair of first etching stopper parts 21A1 and 21A2, the pair of second etching stopper parts 21B1 and 21B2, and the second insulating film 22 are formed with, for example, a film thickness of about 50 nm.

As shown in FIG. 25A, the third insulating film 26 is formed to cover the first insulating film 21, the second insulating film 22, and the main surface of the semiconductor substrate 10 (the barrier layer 13) in a first cavity part $25A_2$ to be described below. In addition, as shown in FIG. 25B, the third insulating film 26 is formed to cover the first insulating film 21, the second insulating film 22, and the main surface of the semiconductor substrate 10 (the barrier layer 13) in a second cavity part $25B_4$ to be described below.

As shown in FIG. 25A, the first field effect transistor Q5 includes the buffer layer 11a, the channel layer 12, the barrier layer 13, and the two dimensional electron gas layer 14. In addition, the first field effect transistor Q5 includes the pair of first main electrodes 16A and 17A which are separated from each other and provided on the first active region 10A of the main surface of the semiconductor substrate 10 and function as the source electrode and the drain electrode, and the first cavity part $25A_2$ provided in the first insulating layer 20A between the pair of first main electrodes 16A and 17A. In addition, the first field effect transistor Q5 includes the first gate electrode 31A which has the head part $31a_1$ positioned on the first insulating layer 20A and the body part $31a_2$ that penetrates the first insulating layer 20A from the head part $31a_1$ and protrudes toward the first cavity part $25A_2$, and in which the head part $31a_1$ is wider than the body part $31a_2$. That is, the first field effect transistor Q5 of the first embodiment is a GaN-based hetero FET.

The first gate electrode 31A has a long shape when viewed in a plan view, and the gate width is longer than the gate length. Here, the first gate electrode 31A extends over the first active region 10A and the inactive region 15. Here, in the first gate electrode 31A, the head part $31a_1$ is positioned on the third insulating film 26, and the body part $31a_2$ integrated with the head part $31a_1$ protrudes toward the first cavity part $25A_2$ through the first gate opening $27A_1$ provided in the first insulating layer 20A.

The pair of first main electrodes 16A and 17A with the first gate electrode 31A therebetween are separated from each other in the gate length direction of the first gate electrode 31A. Here, the pair of first main electrodes 16A and 17A extend over the first active region 10A and the inactive region 15 in the gate width direction of the first gate electrode 31A.

The plane pattern of the first cavity part $25A_2$ when viewed in a plan view is a circular plane pattern surrounding the body part $31a_2$ of the first gate electrode 31A. Therefore, as shown in FIG. 25A, the first cavity part $25A_2$ includes a first part $25A_2$-L positioned on one side (left side) of the body part $31a_2$ and a second part $25A_2$-R positioned on the other side (right side) of the body part $31a_2$ in the gate length direction of the first gate electrode 31A. Here, in the fourth embodiment, the first cavity part $25A_2$ has a bilaterally symmetrical configuration in which the first part $25A_2$-L and the second part $25A_2$-R have substantially the same width. In the gate length direction (longitudinal direction) of the first gate electrode 31A, the first cavity part $25A_2$ is wider than the body part $31a_2$ of the first gate electrode 31A and the first gate opening $27A_1$.

As shown in FIG. 25B, the second field effect transistor Q6 includes the buffer layer 11a, the channel layer 12, the barrier layer 13, and the two dimensional electron gas layer 14. In addition, the second field effect transistor Q6 includes the pair of second main electrodes 16B and 17B which are separated from each other and provided on the second active region 10B of the main surface of the semiconductor substrate 10 and in which the separation distance $L_2$ is longer than the separation distance $L_1$ between the pair of first main electrodes 16A and 17A of the first field effect transistor Q5 (refer to FIG. 25A), and the second cavity part $25B_4$ provided in the insulating layer 20B between the pair of second main electrodes 16B and 17B. The pair of second main electrodes 16B and 17B function as a source electrode and a drain electrode. In addition, the second field effect transistor Q6 includes the second gate electrode 31B which has the head part $31b_1$ positioned on the second insulating layer 20B and the body part $31b_2$ that penetrates the second insulating layer 20B from the head part $31b_1$ and protrudes toward the second cavity part $25B_4$, and in which the head part $31b_1$ is wider than the body part $31b_2$. That is, the second field effect transistor Q6 of the fourth embodiment is also a GaN-based hetero FET like the first field effect transistor Q5.

The second gate electrode 31B has a long shape when viewed in a plan view, and the gate width is longer than the gate length. Here, the second gate electrode 31B extends over the second active region 10B and the inactive region 15. Here, in the second gate electrode 31B, the head part $31b_1$ is positioned on the third insulating film 26, and the body part $31b_2$ integrated with the head part $31b_1$ protrudes toward the second cavity part $25B_4$ through the second gate opening 27B1 provided in the second insulating layer 20B.

The pair of second main electrodes 16B and 17B with the second gate electrode 31B therebetween are separated from each other in the gate length direction of the second gate electrode 31B. Here, the pair of second main electrodes 16B and 17B extend over the second active region 10B and the inactive region 15 in the gate width direction of the second gate electrode 31B.

The plane pattern of the second cavity part $25B_4$ when viewed in a plan view is a circular plane pattern surrounding the body part $31b_2$ of the second gate electrode 31B. Therefore, like the first cavity part $25A_2$, as shown in FIG. 25B, the second cavity part $25B_4$ includes a first part $25B_4$-L positioned on one side (left side) of the body part $31b_2$ and a second part $25B_4$-R positioned on the other side (right side) of the body part $31b_2$ in the gate length direction of the second gate electrode 31B. In the fourth embodiment, although not limited to this, the second cavity part $25B_4$ has a bilaterally symmetrical configuration in which the first part $25B_4$-L and the second part $25B_4$-R have substantially the same width.

In the gate length direction (longitudinal direction) of the second gate electrode 31B, the second cavity part 25B4 is wider than the body part $31b2$ of the second gate electrode 31B and the second gate opening 27B1. Here, as shown in FIGS. 25B and 25A, the width W2 of the second cavity part 25B4 is wider than the width W1 of the first cavity part 25A2. That is, the second cavity part 25B4 is wider than the first cavity part 25A2.

As shown in FIG. 25A, the upper part of the first cavity part $25A_2$ is covered with the second insulating film 22, and the side parts of the first cavity part $25A_2$ in the width direction are covered with the pair of first etching stopper parts $21A_1$ and $21A_2$. As shown in FIG. 25B, the upper part of the second cavity part $25B_4$ is covered with the second insulating film 22, and the side parts of the second cavity part $25B_4$ in the width direction are covered with the pair of second etching stopper parts $21B_1$ and $21B_2$.

According to the semiconductor device 1C of the fourth embodiment, the same effects as those of the semiconductor device 1 according to the first embodiment described above can be obtained.

Here, a wiring layer and other insulating layers are provided above the insulating layer 20, but in FIGS. 25A and 25B, the wiring layer and other insulating films above the insulating layer 20 are not shown.

<Method of Producing Semiconductor Device>

Next, a method of producing the semiconductor device 1C according to the fourth embodiment will be described with reference to FIGS. 26A, 26B, 27A, 27B, 28A, 28B, 29A, 29B, 30A, 30B, 31A, and 31B. FIGS. 26A, 27A, 28A, 29A, 30A and 31A show processes of forming the first field effect transistor Q5 in the first active region 10A of the semiconductor substrate 10, and FIGS. 26B, 27B, 28B, 29B, 30B and 31B show processes of forming the second field effect transistor Q6 in the second active region 10B of the semiconductor substrate 10. The first field effect transistor Q5 and the second field effect transistor Q6 are formed by the same process.

Figure 26A:
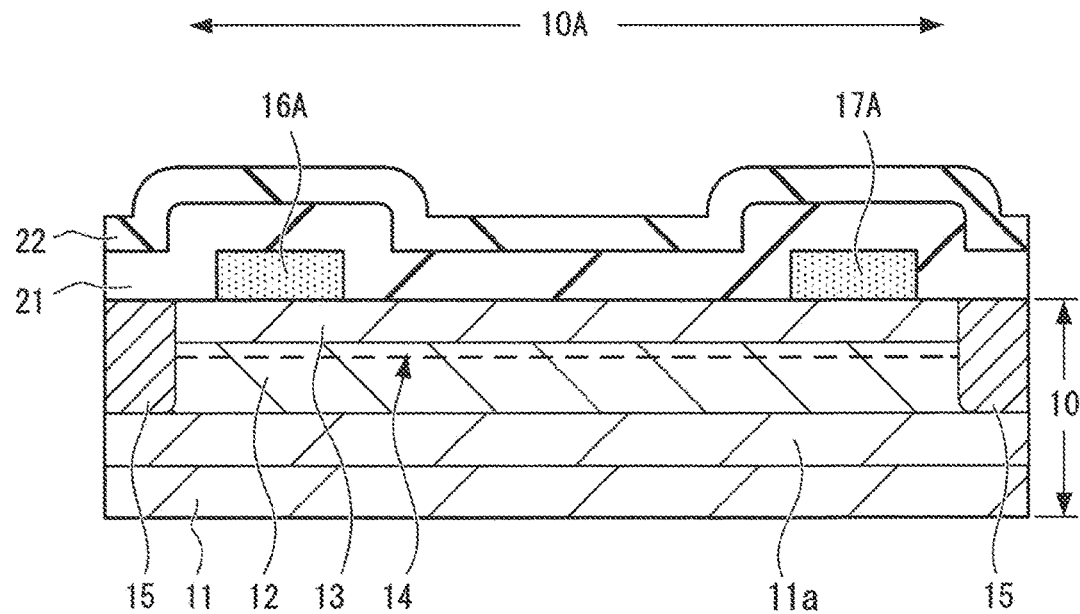
FIG. 26A is a process cross-sectional view of a method of producing a semiconductor device according to the fourth embodiment of the present technology.
Figure 26B:
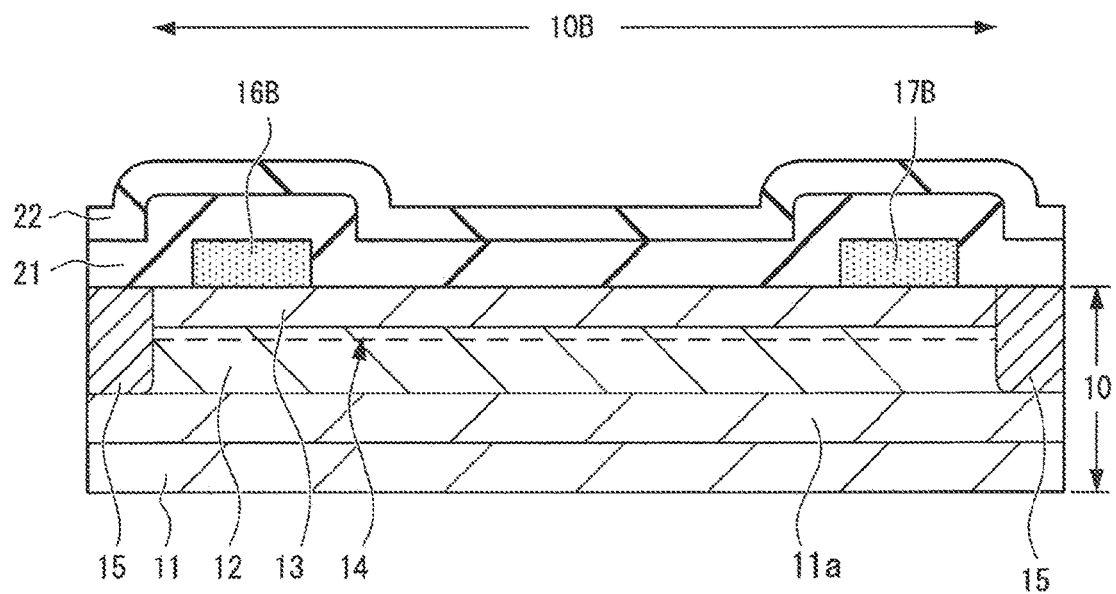
FIG. 26B is a process cross-sectional view of the method of producing a semiconductor device according to the fourth embodiment of the present technology.

First, the same processes as the processes shown in FIGS. 7A, 7B, 8A, 8B, 9A, and 9B in the first embodiment are performed, and as shown in FIGS. 26A and 26B, the pair of first main electrodes 16A and 17A, the pair of second main electrodes 16B and 17B, the first insulating film 21 and the second insulating film 22 and the like are formed.

Figure 27A:
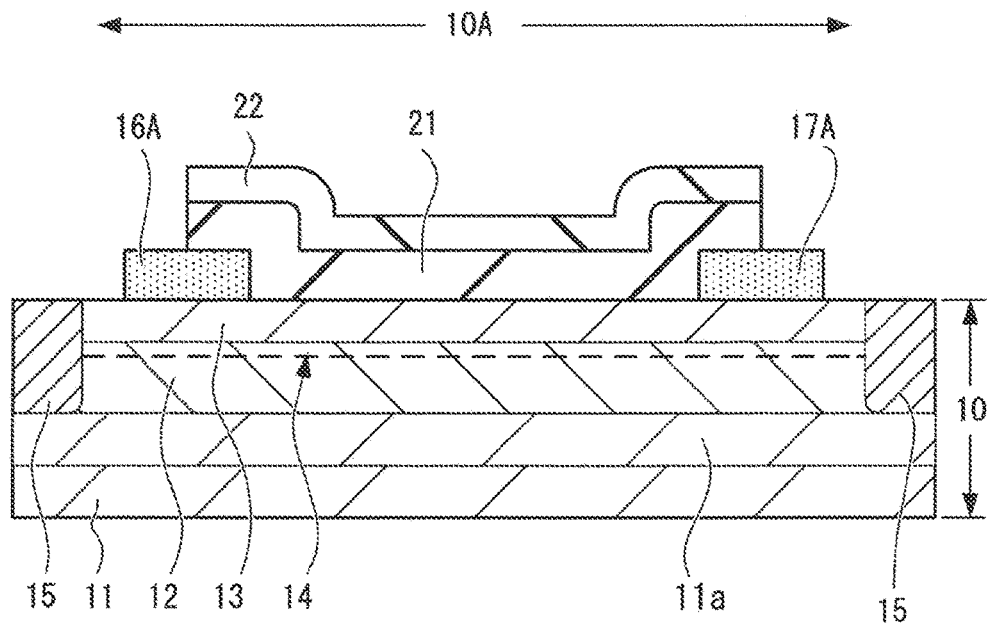
FIG. 27A is a process cross-sectional view continuing FIG. 26A.
Figure 27B:
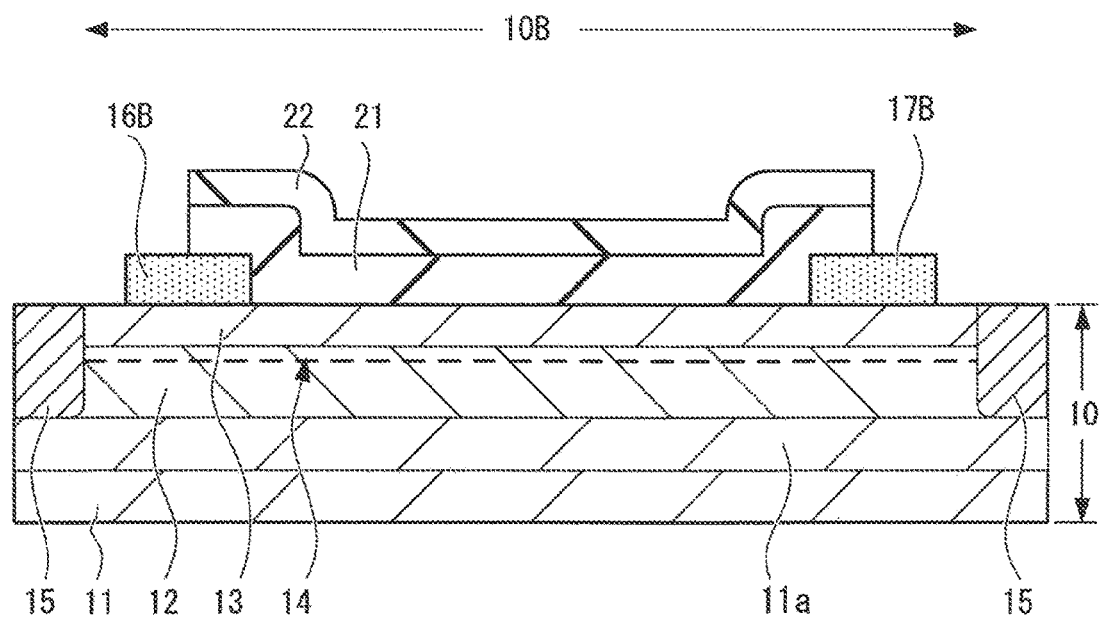
FIG. 27B is a process cross-sectional view continuing FIG. 26B.

Next, the second insulating film 22 and the first insulating film 21 are sequentially patterned, and as shown in FIG. 27A, the second insulating film 22 and the first insulating film 21 having a pattern in which ends (side walls) in the width direction are terminated on the pair of first main electrodes 16A and 17A are formed on the first active region 10A, and as shown in FIG. 27B, the second insulating film 22 and the first insulating film 21 having a pattern in which ends in the width direction are terminated on the pair of second main electrodes 16B and 17B are formed on the second active region 10B. The second insulating film 22 and the first insulating film 21 are patterned using a well-known photolithography technique and an anisotropic dry etching technique.

In this process, since the separation distance L2 between the pair of second main electrodes 16B and 17B (refer to FIG. 25B) is longer than the separation distance L1 between the pair of first main electrodes 16A and 17A (refer to FIG. 25A), as shown in FIGS. 27A and 27B, the width of the first insulating film 21 and the second insulating film 22 on the second active region 10B is longer than the width of each of the first insulating film 21 and the second insulating film 22 on the first active region 10A.

Figure 28A:
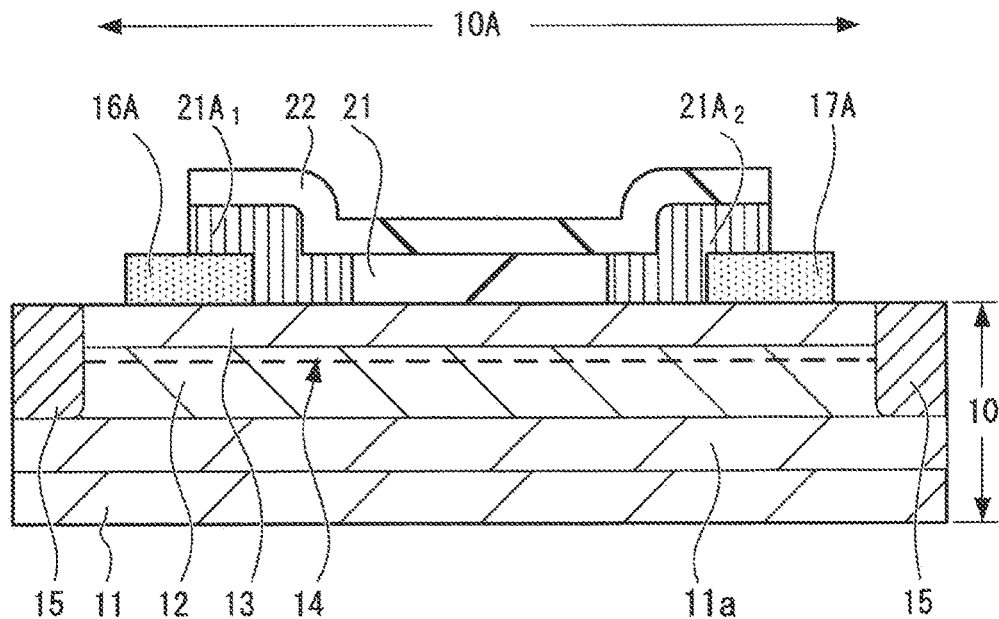
FIG. 28A is a process cross-sectional view continuing FIG. 27A.
Figure 28B:
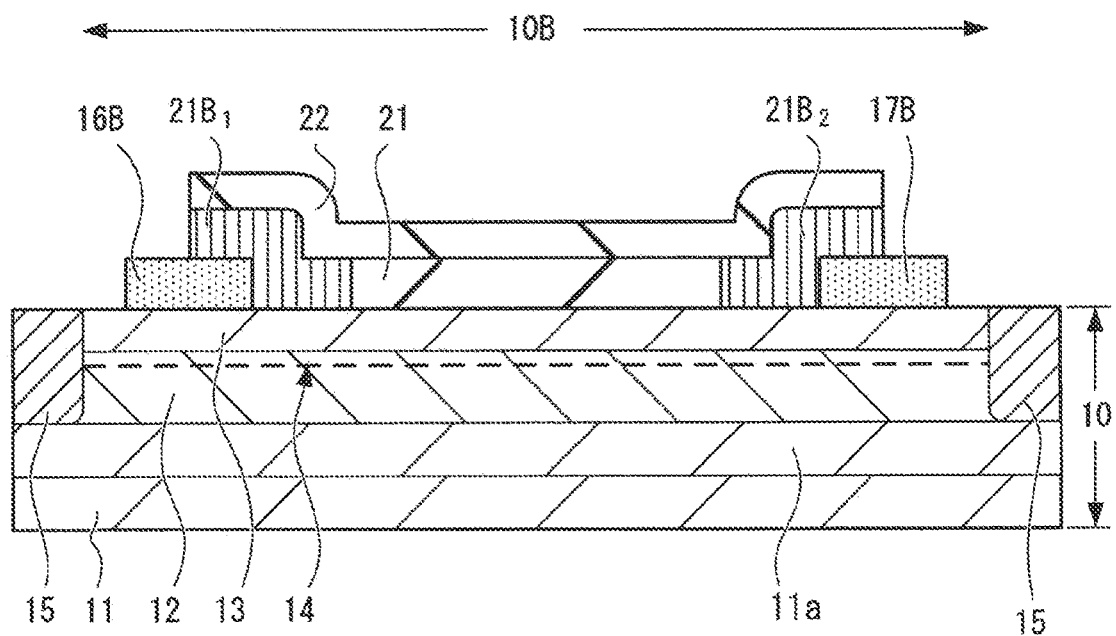
FIG. 28B is a process cross-sectional view continuing FIG. 27B.

Next, a heat treatment is performed on the first insulating film 21, and as shown in FIGS. 28A and 28B, the pair of first etching stopper parts 21A1 and 21A2 having a higher etching selectivity than the first insulating film 21 are formed on one end side and the other end side of the first insulating film 21 on the first active region 10A in the width direction, and the pair of second etching stopper parts 21B1 and 21B2 which have a higher etching selectivity than the first insulating film 21 and between which the separation distance is longer than the separation distance between the pair of first etching stopper parts 21A1 and 21A2 are formed on one end side and the other end side of the first insulating film 21 on the second active region 10B in the width direction.

In this process, since the upper surface of the first insulating film 21 composed of an $Al_2O_3$ film is covered with the second insulating film 22, a crystallization region in which chemical resistance during wet etching is strong is created from the end to the inside according to a heat treatment. Since this crystallization region has a high etching selectivity with respect to the first insulating film 21 in which no crystallization region is created, it functions as the first etching stopper parts $21A_1$ and $21A_2$, and the second etching stopper parts $21B_1$ and $21B_2$ when the first insulating film 21 is wet-etched to form a cavity part.

Figure 29A:
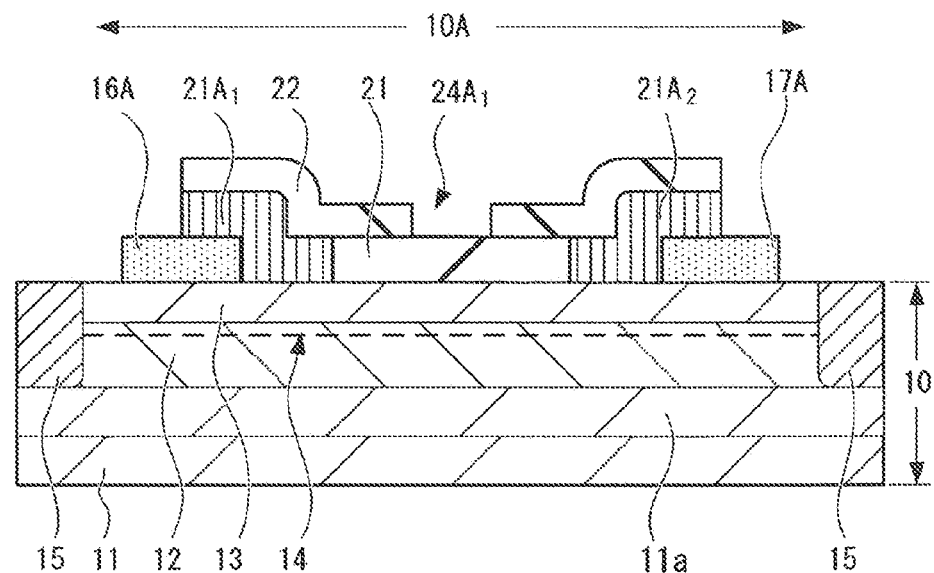
FIG. 29A is a process cross-sectional view continuing FIG. 28A.
Figure 29B:
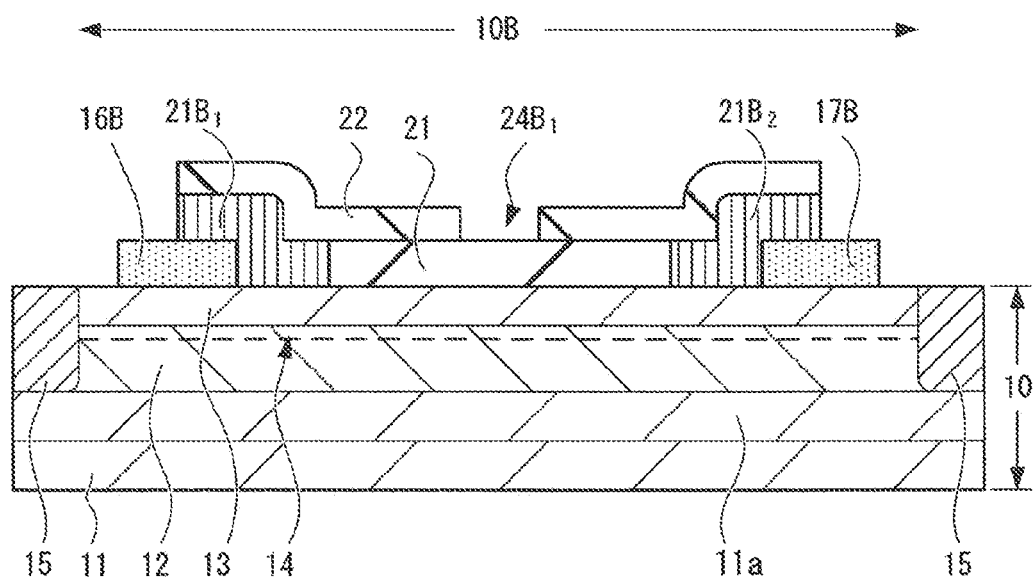
FIG. 29B is a process cross-sectional view continuing FIG. 28B.

Next, the same processes as the processes shown in FIGS. 10A and 10B in the above first embodiment are performed, and as shown in FIGS. 29A and 29B, the first opening 24A1 is formed in the second insulating film 22 on the first active region 10A of the semiconductor substrate 10, and the second opening 24B1 is formed in the second insulating film 22 on the second active region 10B of the main surface of the semiconductor substrate 10. The first opening 24A1 is formed, for example, at the center position between the pair of first etching stopper parts 21A1 and 31A2 in a plan view. In addition, the second opening 24B1 is formed, for example, at the center position between the pair of first etching stopper parts 21B1 and 21B2 in a plan view.

Figure 30A:
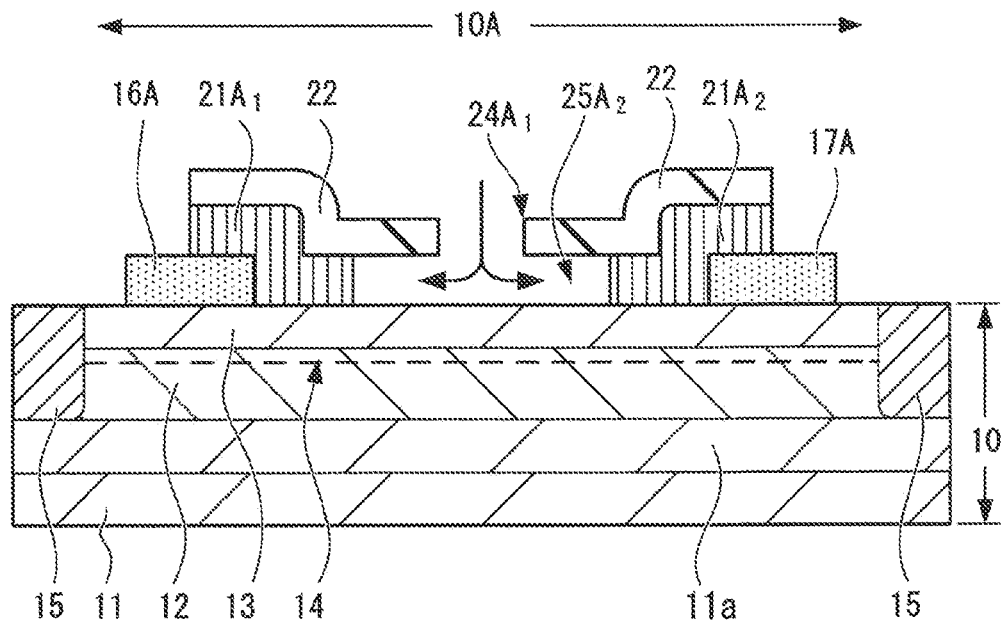
FIG. 30A is a process cross-sectional view continuing FIG. 29A.
Figure 30B:
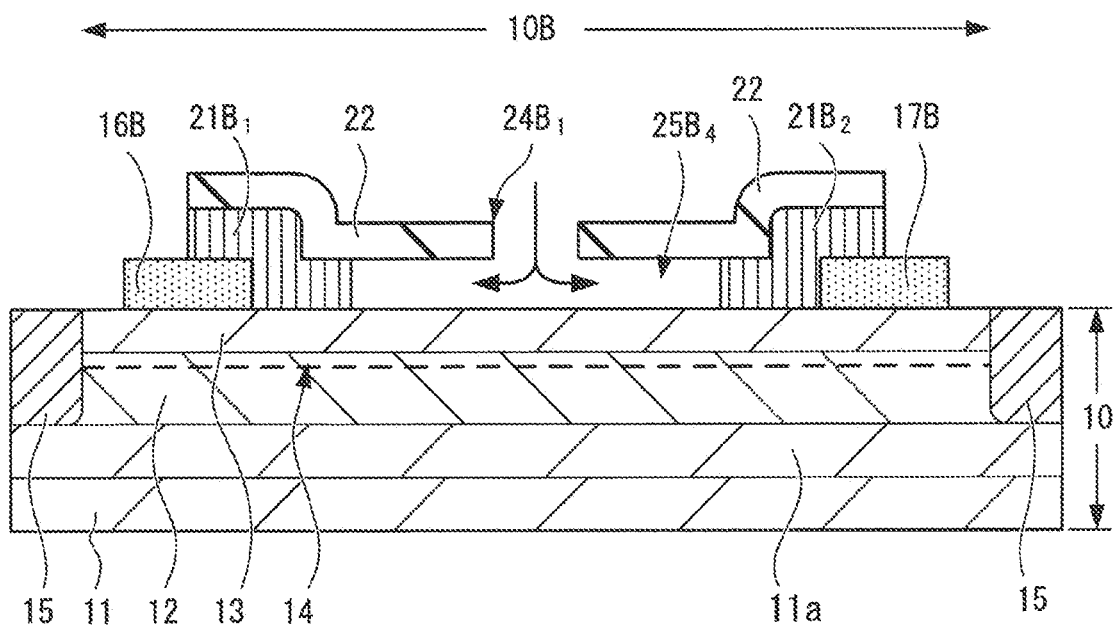
FIG. 30B is a process cross-sectional view continuing FIG. 29B.

Next, as shown in FIGS. 30A and 30B, the first cavity part 25A2 wider than the first opening 24A1 is formed by etching the first insulating film 21 on the first active region 10A of the semiconductor substrate 10 through the first opening 24A1, and the second cavity part 25B4 wider than the first cavity part 25A2 is formed by etching the first insulating film 21 on the second active region 10B of the semiconductor substrate 10 through the second opening 24B1. As in the above first embodiment, etching of the first insulating film 21 is performed by performing isotropic wet etching with less damage on the main surface of the semiconductor substrate (the surface of the barrier layer 13). Wet etching of the first insulating film 21 is performed under conditions in which an etching selectivity with respect to the second insulating film 22, the pair of first etching stopper parts 21A1 and 21A2, and the pair of second etching stopper parts 21B1 and 21B2 is obtained.

In this process, since the pair of first etching stopper parts $21A_1$ and $21A_2$ have a higher etching selectivity with respect to the first insulating film 21, it is possible to prevent excessive extension of the first cavity part $25A_2$ in the width direction (lateral direction). In addition, since the pair of second etching stopper parts $21B_1$ and $21B_2$ have a higher etching selectivity than the first insulating film 21, it is possible to prevent excessive extension of the second cavity part $25B_4$ in the width direction (lateral direction). That is, the width of the first cavity part $25A_2$ can be controlled according to the pair of first etching stopper parts $21A_1$ and $21A_2$ and the width of the second cavity part $25B_4$ can be controlled according to the pair of second etching stopper parts $21B_1$ and $21B_2$.

Figure 31A:
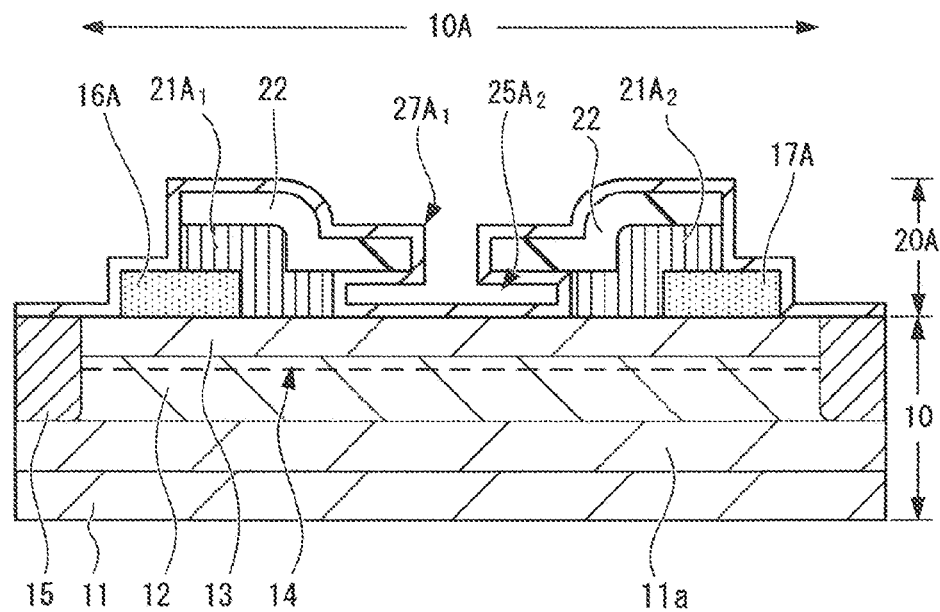
FIG. 31A is a process cross-sectional view continuing FIG. 30A.
Figure 31B:
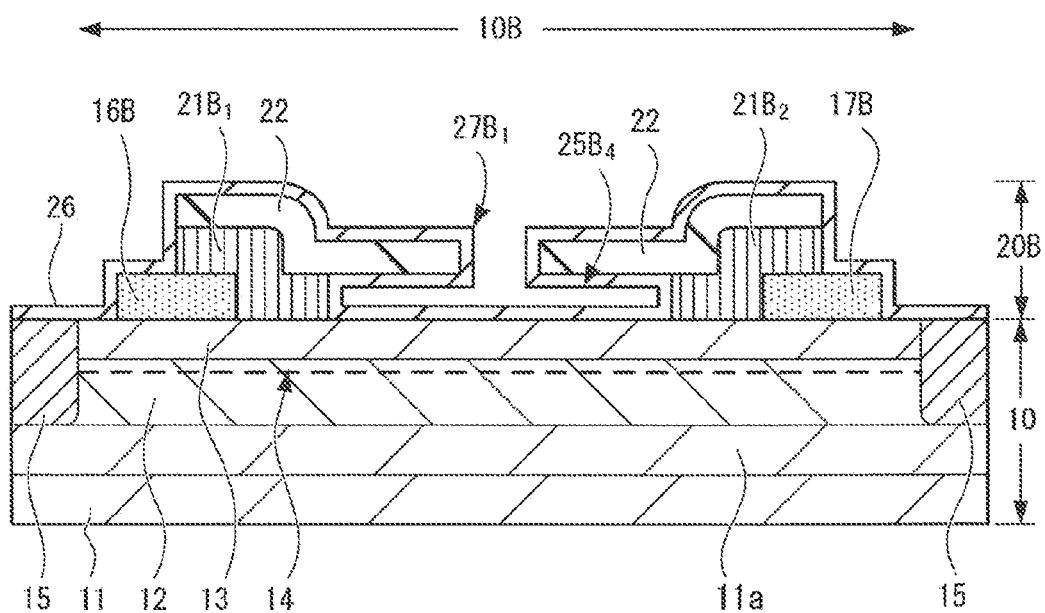
FIG. 31B is a process cross-sectional view continuing FIG. 30B.

Next, the same processes as the processes shown in FIGS. 14A and 14B in the above first embodiment 1 are performed, and as shown in FIGS. 31A and 31B, in the first cavity part 25A2 and the second cavity part 25B4, the third insulating film 26 that covers the first insulating film 21, the second insulating film 22, and the main surface of the semiconductor substrate 10 (the surface of the barrier layer 13), covers respective side walls in the first opening 24A1 and the second opening 24B1 of the second insulating film 22 and covers the second insulating film 22 is formed.

In this process, the first insulating layer 20A including a pair of first etching stopper parts 22A1 and 22A2, the second insulating film 22 and the third insulating film 26 is formed on the first active region 10A of the main surface of the semiconductor substrate 10, and the second insulating layer 20B including a pair of etching stopper parts 22B1 and 22B2, the second insulating film 22 and the third insulating film 26 is formed on the second active region 10B of the main surface of the semiconductor substrate 10.

In addition, in this process, since respective side walls in the first opening 24A1 and the second opening 24B2 of the second insulating film 22 are covered with the third insulating film 26, the first gate opening 27A1 having a narrower opening width than the first opening 24A1 is formed, and the second gate opening 27B2 having a narrower opening width than the second opening 24B1 is formed.

In addition, in this process, the first cavity part 25A2 and the second cavity part 25B4 are surrounded by the third insulating film 26. Here, since the third insulating film 26 is formed with an almost uniform film thickness, in the first cavity part 25A2 and the second cavity part 25B4 surrounded by the third insulating film 26, the width W2 (refer to FIG. 25B) of the second cavity part 25B4 is wider than the width W1 (refer to FIG. 25A) of the first cavity part 25A2.

Then, the same processes as those in the above first embodiment are performed, the first gate electrode 31A and the second gate electrode 31B are formed, and thus the first field effect transistor Q5 shown in FIG. 25A is almost completed, and the second field effect transistor Q6 shown in FIG. 25B is almost completed.

After that, as in the above first embodiment, a wiring layer and other insulating layers are formed on the first insulating layer 20A and the second insulating layer 20B, and thus the semiconductor device 1C according to the fourth embodiment is almost completed.

According to the method of producing the semiconductor device 1C of the fourth embodiment, like the method of producing the semiconductor device 1 according to the above first embodiment, the first cavity part $25A_2$ and the second cavity part $25B_4$ wider than the first cavity part $25A_2$ can be formed by the same process.

In addition, since the second cavity part $25B_4$ wider than the first cavity part $25A_2$ can be formed without using an etching mask, it is possible to reduce the number of production processes as compared with the above first embodiment and second embodiment, and it is possible to reduce the production cost of the semiconductor device 1C.

In addition, since the width of the first cavity part $25A_2$ can be controlled according to the separation distance between the pair of first etching stopper parts $21A_1$ and $21A_2$ and the width of the second cavity part $25B_4$ can be controlled according to the separation distance between the pair of second etching stopper parts $21B_1$ and $21B_2$, it is possible to freely set the widths of the first cavity part $25A_2$ and the second cavity part 25A4.

Here, in the fourth embodiment, a case in which the first cavity part $25A_2$ and the second cavity part $25B_4$ are bilaterally asymmetrical has been described. However, the present technology is not limited to the bilaterally symmetrical first cavity part $25A_2$ and second cavity part $25B_4$. For example, when the first opening $24A_1$ that is eccentric (biased) toward any one of the pair of first etching stopper parts $21A_1$ and $21A_2$ is formed in the second insulating film 22, the bilaterally asymmetrical first cavity part $25A_2$ can be formed. Similarly, when the second opening $24B_1$ that is eccentric toward any one of the pair of second etching stopper parts $21B_1$ and $21B_2$ is formed in the second insulating film 22, the bilaterally asymmetrical second cavity part $25B_4$ can be formed.

Fifth Embodiment

<Configuration of Semiconductor Device>

Figure 32A:
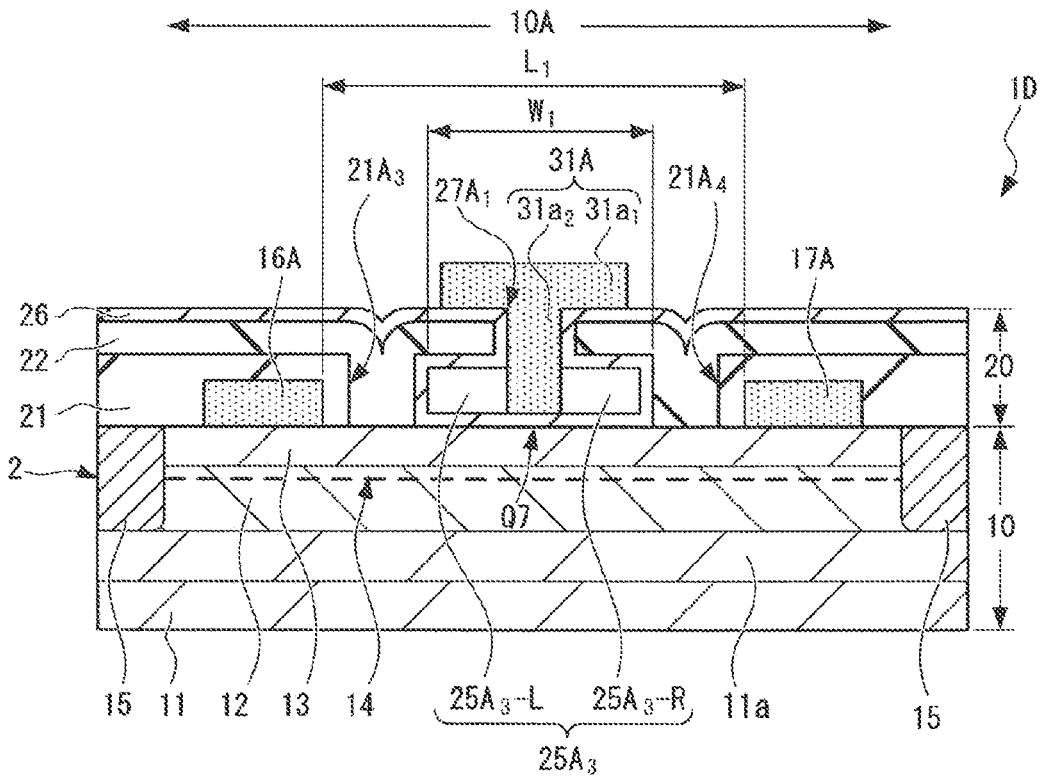
FIG. 32A is a cross-sectional view schematically showing one configuration example of a first transistor mounted on a power switch part of a semiconductor device according to a fifth embodiment of the present technology.
Figure 32B:
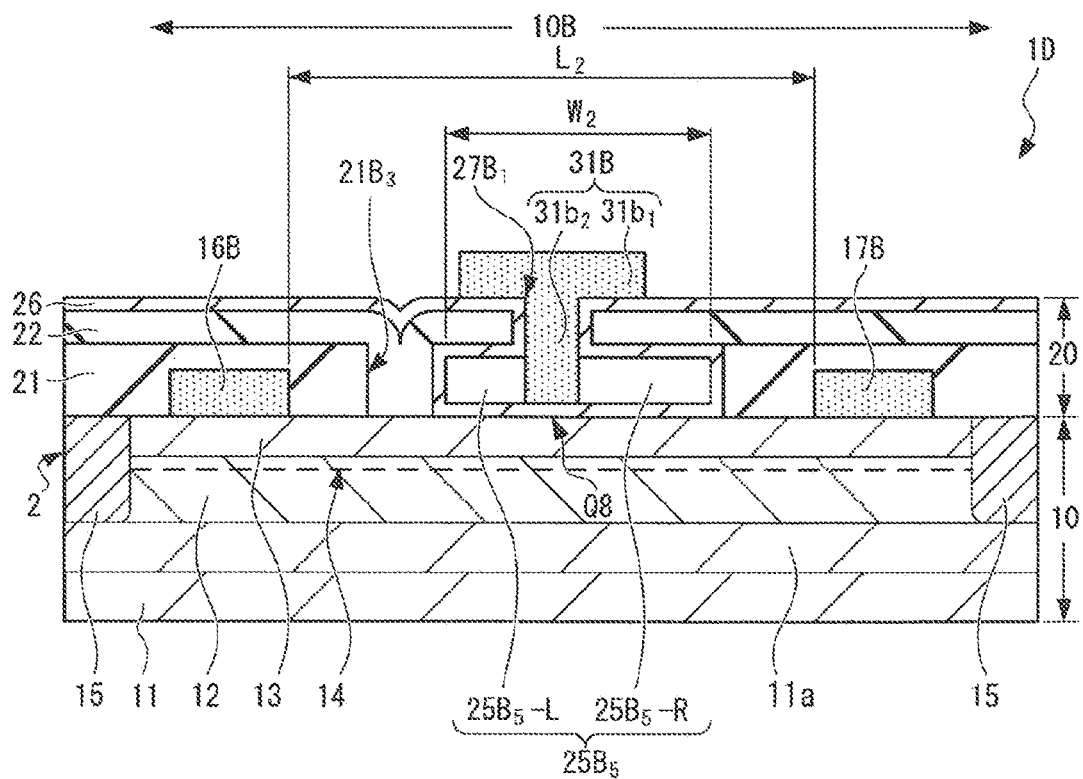
FIG. 32B is a cross-sectional view schematically showing one configuration example of a second transistor mounted on a power amplifier part for amplification of the semiconductor device according to the fifth embodiment of the present technology.

As shown in FIGS. 32A and 32B, a semiconductor device 1D according to a fifth embodiment of the present technology includes the semiconductor substrate 10, and the insulating layer 20 provided on the first active region 10A and the second active region 10B of the main surface of the semiconductor substrate 10. In addition, the semiconductor device 1D includes a first field effect transistor Q7 formed in the first active region 10A of the main surface of the semiconductor substrate 10 and a second field effect transistor Q8 formed in the second active region 10B different from the first active region 10A of the main surface of the semiconductor substrate 10. The first field effect transistor Q7 is an element constituting a high frequency switch of the high frequency switch part SW shown in FIG. 1. The second field effect transistor Q8 is an element constituting a high frequency power amplifier of the high frequency power amplifier part PA shown in FIG. 1.

The insulating layer 20 includes the first insulating film 21 provided on the main surface of the semiconductor substrate 10, the second insulating film 22 provided on the first insulating film 21, and the third insulating film 26 provided on the second insulating film 22. The first insulating film 21 is formed of, for example, an $Al_3O_2$ film. The second insulating film 22 is formed of, for example, a $SiO_2$ film having a high etching selectivity with respect to the first insulating film 21. The first insulating film 21 is formed with, for example, a film thickness of about 50 nm, and the second insulating film 22 is formed with, for example, a film thickness of about 50 nm.

The third insulating film 26 is formed to cover the first insulating film 21, the second insulating film 22, and the main surface of the semiconductor substrate 10 (the barrier layer 13) in a first cavity part $25A_3$ and a second cavity part $25B_5$ to be described below.

As shown in FIG. 32A, the first field effect transistor Q7 includes the buffer layer 11a, the channel layer 12, the barrier layer 13, and the two dimensional electron gas layer 14. In addition, the first field effect transistor Q7 includes the pair of first main electrodes 16A and 17A which are separated from each other and provided on the first active region 10A of the main surface of the semiconductor substrate 10 and function as a source electrode and a drain electrode, and the first cavity part $25A_3$ provided in the first insulating layer 20A between the pair of first main electrodes 16A and 17A. In addition, the first field effect transistor Q7 includes the first gate electrode 31A which has the head part $31a_1$ positioned on the insulating layer 20 and the body part $31a_2$ that penetrates the insulating layer 20 from the head part $31a_1$ and protrudes toward the first cavity part $25A_3$ and in which the head part $31a_1$ is wider than the body part $31a_2$. That is, the first field effect transistor Q7 of the first embodiment is a GaN-based hetero FET.

The first gate electrode 31A has long shape when viewed in a plan view, and the gate width is longer than the gate length. Here, the first gate electrode 31A extends over the first active region 10A and the inactive region 15. Here, in the first gate electrode 31A, the head part $31a_1$ is positioned on the third insulating film 26, and the body part $31a_2$ integrated with the head part $31a_1$ protrudes toward the first cavity part $25A_3$ through the first gate opening $27A_1$ provided in the insulating layer 20.

The pair of first main electrodes 16A and 17A with the first gate electrode 31A therebetween are separated from each other in the gate length direction of the first gate electrode 31A. Here, the pair of first main electrodes 16A and 17A extend over the first active region 10A and the inactive region 15 in the gate width direction of the first gate electrode 31A.

The plane pattern of the first cavity part $25A_3$ when viewed in a plan view is a circular plane pattern surrounding the body part $31a_2$ of the first gate electrode 31A. Therefore, as shown in FIG. 32A, the first cavity part $25A_3$ includes a first part $25A_3$-L positioned on one side (left side) of the body part $31a_2$ and a second part $25A_3$-R positioned on the other side (right side) of the body part $31a_2$ in the gate length direction of the first gate electrode 31A. Here, in the fifth embodiment, the first cavity part $25A_3$ has a bilaterally symmetrical configuration in which the first part $25A_3$-L and the second part $25A_3$-R have substantially the same width. In the gate length direction (short direction) of the first gate electrode 31A, the first cavity part $25A_3$ is wider than the body part $31a_2$ of the first gate electrode 31A and the first gate opening $27A_1$.

As shown in FIG. 32B, the second field effect transistor Q8 includes the buffer layer 11a, the channel layer 12, the barrier layer 13, and the two dimensional electron gas layer 14. In addition, the second field effect transistor Q8 includes the pair of second main electrodes 16B and 17B which are separated from each other and provided on the second active region 10B of the main surface of the semiconductor substrate 10 and in which the separation distance $L_2$ is longer than the separation distance $L_1$ (refer to FIG. 32A) between the pair of first main electrodes 16A and 17A of the first field effect transistor Q7, and the second cavity part $25B_5$ provided in the insulating layer 20 between the pair of second main electrodes 16B and 17B. The pair of second main electrodes 16B and 17B function as a source electrode and a drain electrode. In addition, the second field effect transistor Q8 includes the second gate electrode 31B which has the head part $31b_1$ positioned on the insulating layer 20 and the body part $31b_2$ that penetrates the second insulating layer 20B from the head part $31b_1$ and protrudes toward the second cavity part $25B_5$, and in which the head part $31b_1$ is wider than the body part $31b_2$. That is, the second field effect transistor Q8 of the fifth embodiment is also a GaN-based hetero FET like the first field effect transistor Q7.

The second gate electrode 31B has a long shape when viewed in a plan view, and the gate width is longer than the gate length. Here, the second gate electrode 31B extends over the second active region 10B and the inactive region 15. Here, in the second gate electrode 31B, the head part $31b_1$ is positioned on the third insulating film 26, and the body part $31b_2$ integrated with the head part $31b_1$ protrudes toward the second cavity part $25B_5$ through the second gate opening 27B1 provided in the second insulating layer 20B.

The pair of second main electrodes 16B and 17B with the second gate electrode 31B therebetween are separated from each other in the gate length direction (the short direction and the width direction) of the second gate electrode 31B. Here, the pair of second main electrodes 16B and 17B extend over the second active region 10B and the inactive region 15 in the gate width direction (the longitudinal direction and the length direction) of the second gate electrode 31B.

The plane pattern of the second cavity part $25B_5$ when viewed in a plan view is a circular plane pattern surrounding the body part $31b_2$ of the second gate electrode 31B. Therefore, like the first cavity part $25A_3$, as shown in FIG. 32B, the second cavity part $25B_5$ includes a first part $25B_5$-L positioned on one side (left side) of the body part $31b_2$ and a second part $25B_5$-R positioned on the other side (right side) of the body part $31b_2$ in the gate length direction of the second gate electrode 31B. Here, unlike the second cavity part $25B_1$ of the above first embodiment, in the fifth embodiment, the second cavity part $25B_5$ has a bilaterally asymmetrical configuration in which the width of the second part $25B_5$-R is wider than the width of the first part $25B_5$-L.

In the gate length direction (longitudinal direction) of the second gate electrode 31B, the second cavity part $25B_5$ is wider than the body part $31b_2$ of the second gate electrode 31B and the second gate opening 27B1. Here, as shown in FIG. 32B, the width W2 of the second cavity part $25B_5$ is wider than the width $W_1$ of the first cavity part $25A_3$ shown in FIG. 32A. That is, the second cavity part $25B_5$ is wider than the first cavity part $25A_3$.

As shown in FIG. 32A, a first stopper opening $21A_3$ in which the second insulating film 22 is embedded is provided between one first main electrode 16A and the first cavity part $25A_3$ between among the pair of first main electrodes 16A and 17A. The first stopper opening $21A_3$ extends in the longitudinal direction of one first main electrode 16A. In addition, a first stopper opening $21A_4$ in which the second insulating film 22 is embedded is provided between the other first main electrode 17A and the first cavity part $25A_3$. The first stopper opening $21A_4$ extends in the longitudinal direction of the other first main electrode 17A.

As shown in FIG. 32B, a second stopper opening $21B_3$ in which the second insulating film 22 is embedded is provided between one second main electrode 16B and the second cavity part $25B_5$ between the pair of second main electrodes 16B and 17B. The second stopper opening $21B_3$ extends in the longitudinal direction of one second main electrode 16B.

Since the second insulating film 22 (refer to FIG. 32A) positioned inside each of the pair of first stopper openings $21A_3$ and $21A_4$ is formed of an insulating film having a higher etching rate than the first insulating film 21, it functions as an etching stopper when the first insulating film 21 is etched to form the first cavity part $25A_3$. Similarly, since the second insulating film 22 positioned inside the second stopper opening $21B_3$ is formed of an insulating film having a higher etching rate than the first insulating film 21, it functions as an etching stopper when the first insulating film 21 is etched to form the second cavity part $25B_5$.

According to the semiconductor device 1D of the fifth embodiment, the same effects as those of the semiconductor device 1 according to the first embodiment described above can be obtained.

Here, a wiring layer and other insulating layers are provided above the insulating layer 20, but in FIGS. 32A and 32B, the wiring layer and other insulating layers above the insulating layer 20 are not shown.

<Method of Producing Semiconductor Device>

Next, a method of producing the semiconductor device 1D according to the fifth embodiment will be described with reference to FIGS. 33A, 33B, 34A, 34B, 35A, 35B, 36A, 36B, 37A, and 37B. FIGS. 33A, 34A, 35A, 36A and 37A show processes of forming the first field effect transistor Q7 in the first active region 10A of the semiconductor substrate 10. FIGS. 33B, 34B, 35B, 36B and 37B show processes of forming the second field effect transistor Q8 in the second active region 10B of the semiconductor substrate 10. The first field effect transistor Q7 and the second field effect transistor Q8 are formed by the same process.

Figure 33A:
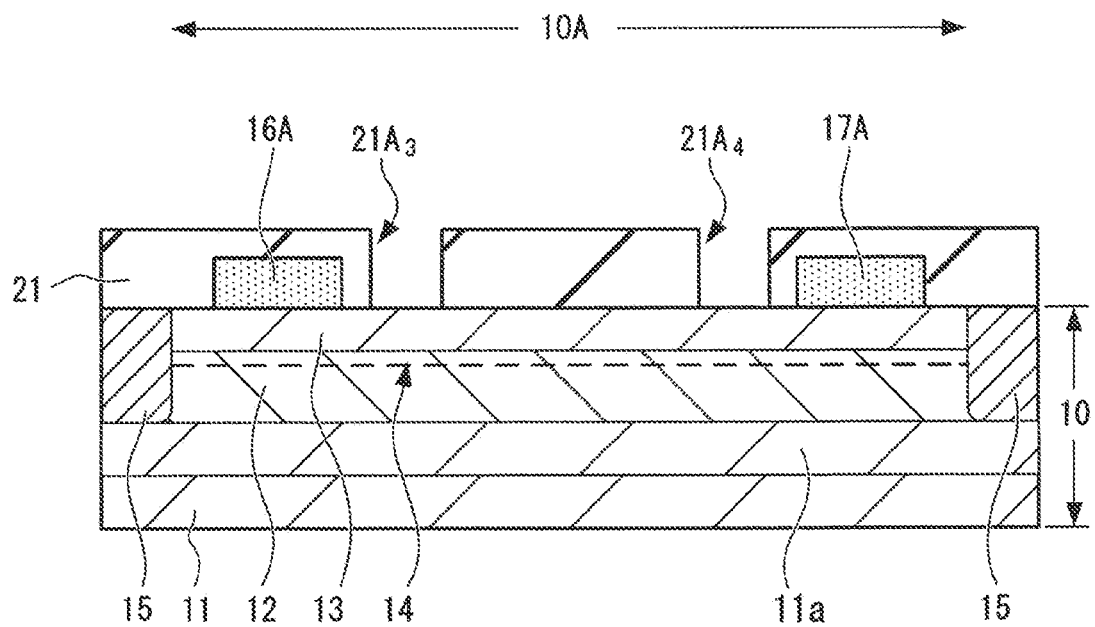
FIG. 33A is a process cross-sectional view of a method of producing a semiconductor device according to the fifth embodiment of the present technology.
Figure 33B:
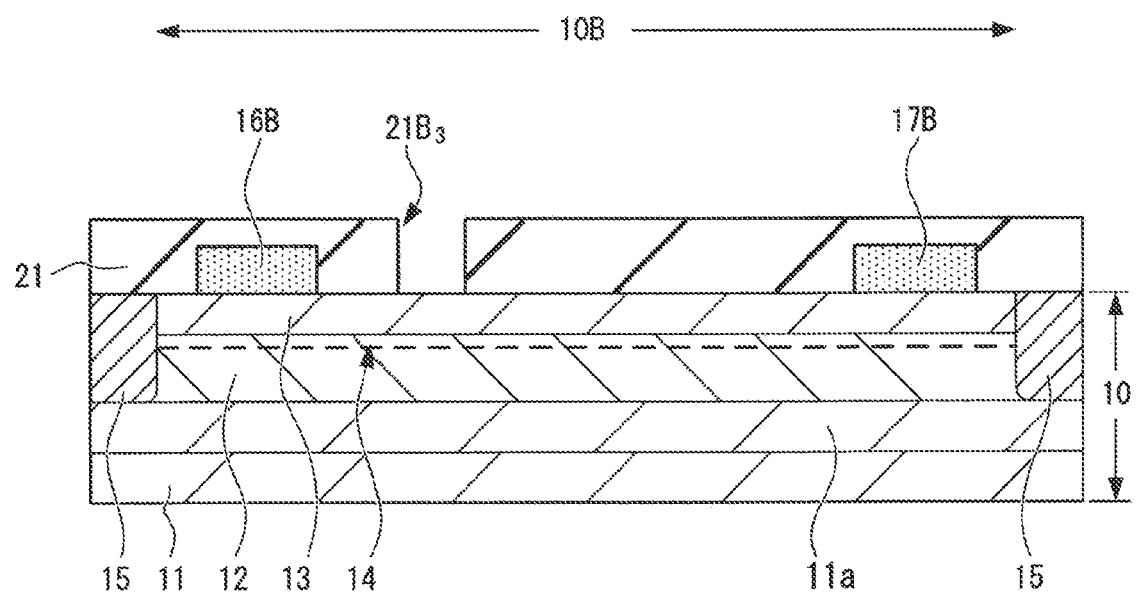
FIG. 33B is a process cross-sectional view of the method of producing a semiconductor device according to the fifth embodiment of the present technology.

First, the same processes as the processes shown in FIGS. 7A, 7B, 8A, and 8B in the first embodiment are performed, and as shown in FIG. 33A and FIG. 33B, the pair of first main electrodes 16A and 17A, the pair of second main electrodes 16B and 17B, the first insulating film 21 and the like are formed.

Next, as shown in FIGS. 33A and 33B, the pair of first stopper openings 21A3 and 21A4 which are separated from each other are formed in the first insulating film 21 on the first active region 10A of the main surface of the semiconductor substrate 10, and the second stopper opening 21B3 is formed in the first insulating film 21 on the second active region 10B of the main surface of the semiconductor substrate 10. The pair of first stopper openings 21A3 and 21A4, and the second stopper opening 21B3 are formed using a well-known photolithography technique and an anisotropic dry etching technique. The pair of first stopper openings 21A3 and 21A4 are arranged between the pair of first main electrodes 16A and 17A. Here, one first stopper opening 21A3 extends along one first main electrode 16A, and the other first stopper opening 21A4 extends along the other first main electrode 17A. The second stopper opening 21B3 is arranged between the pair of second main electrodes 16B and 17B. Here, the second stopper opening 21B3 is eccentric toward any one of the pair of second main electrodes 16B and 17B, and in the fifth embodiment, toward one second main electrode 16B, and extends along one second main electrode 16B.

Figure 34A:
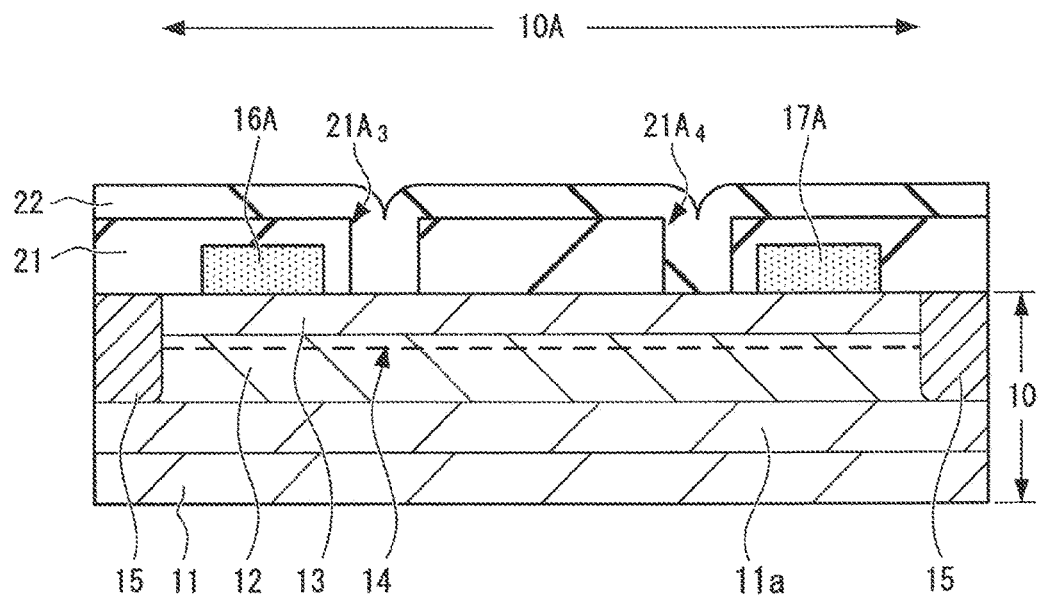
FIG. 34A is a process cross-sectional view continuing FIG. 33A.
Figure 34B:
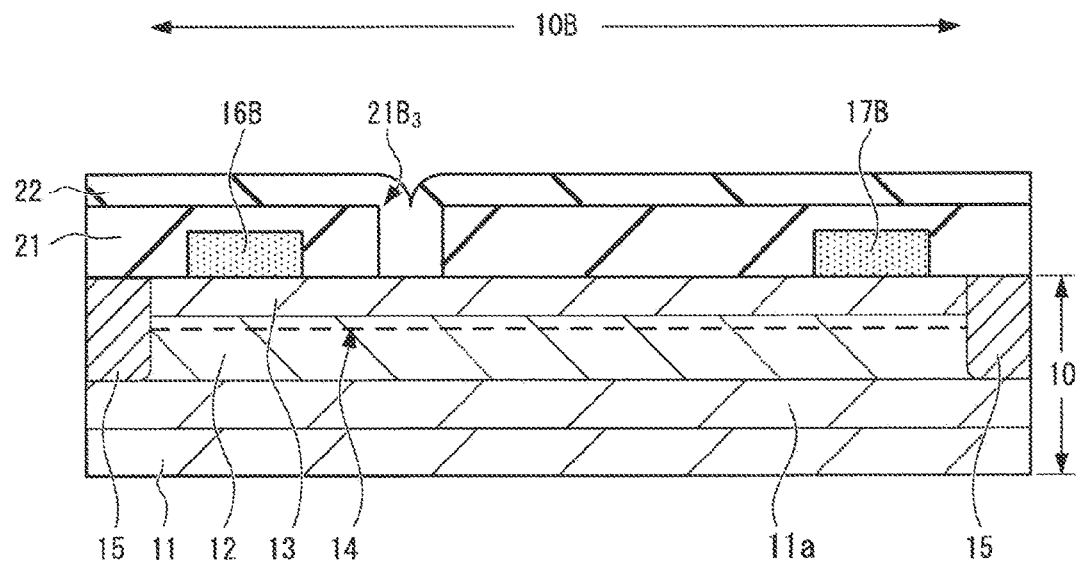
FIG. 34B is a process cross-sectional view continuing FIG. 33B.

Next, as shown in FIGS. 34A and 34B, the second insulating film 22 is formed on the first active region 10A and the second active region 10B of the main surface of the semiconductor substrate 10 with the first insulating film 21 therebetween to embed the inside of the pair of first stopper openings 21A3 and 21A4 and the inside of the second stopper opening 21B3. The second insulating film 22 is formed of an insulating film having a high etching selectivity with respect to the first insulating film 21. For example, an Al2O3 film is formed as the first insulating film 21 by an atomic vapor deposition (ALD) method. Then, a SiO2 film is filmed as the second insulating film 22 by a CVD method.

Figure 35A:
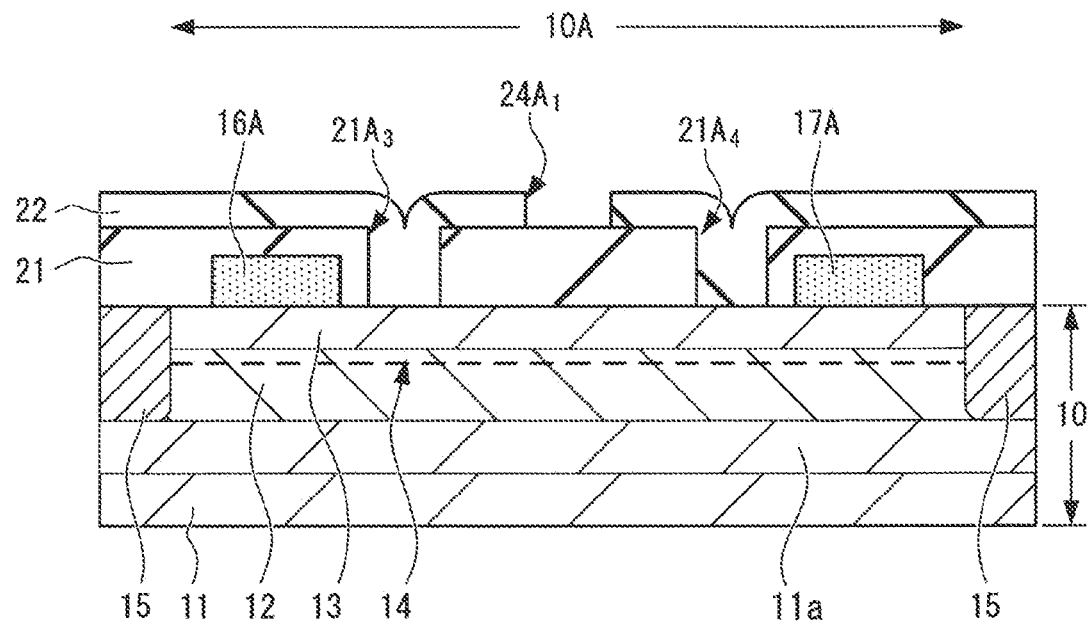
FIG. 35A is a process cross-sectional view continuing FIG. 34A.
Figure 35B:
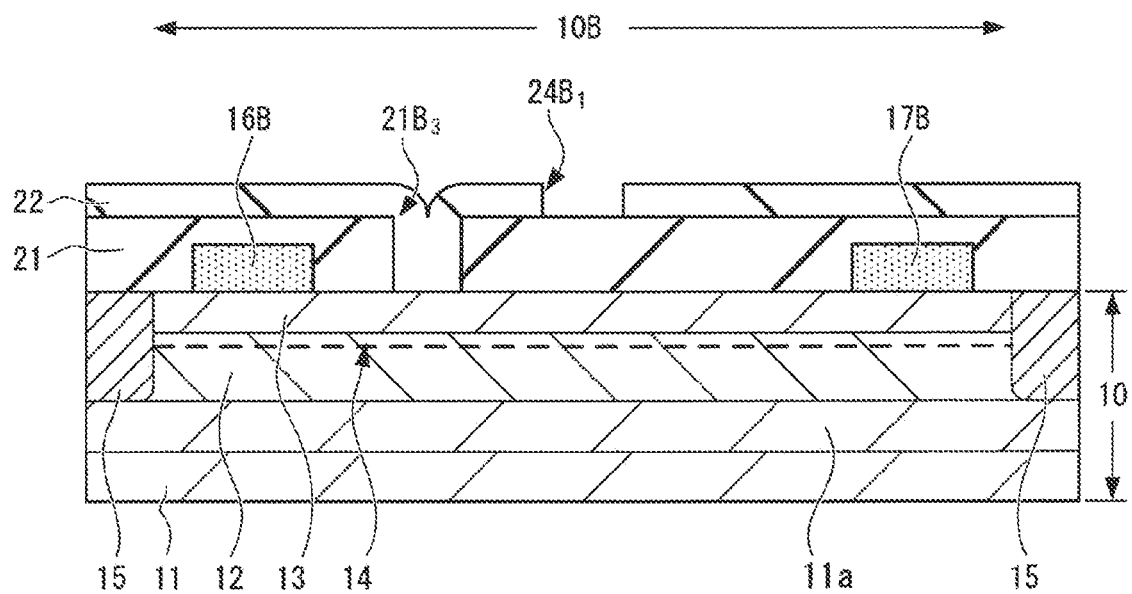
FIG. 35B is a process cross-sectional view continuing FIG. 34B.

Next, as shown in FIGS. 35A and 35B, the first opening 24A1 positioned between the pair of first stopper openings 21A3 and 21A4 in a plan view is formed in the second insulating film 22 on the first active region 10A of the main surface of the semiconductor substrate 10, and the second opening 24B1 adjacent to the second stopper opening 21B3 is formed in the second insulating film 22 on the second active region 10B of the main surface of the semiconductor substrate 10. The first opening 24A1 and the second opening 24B1 are formed by etching the second insulating film 22 using a well-known photolithography technique and a well-known dry etching technique having high directivity.

The first opening 24A1 is formed at the center position between the pair of first main electrodes 16A and 17A, in other words, the pair of first stopper openings 21A3 and 21A4 in a plan view, and formed with a long plane pattern in the longitudinal direction of the pair of first main electrodes 16A and 17A. The second opening 24B1 is formed eccentric toward the second stopper opening 21B3 between the pair of second main electrodes 16B and 17B, in other words, between the second stopper opening 21B3 and the other second main electrode 17B in a plan view, and formed with a long plane pattern in the longitudinal direction of the pair of second main electrodes 16B and 17B.

Figure 36A:
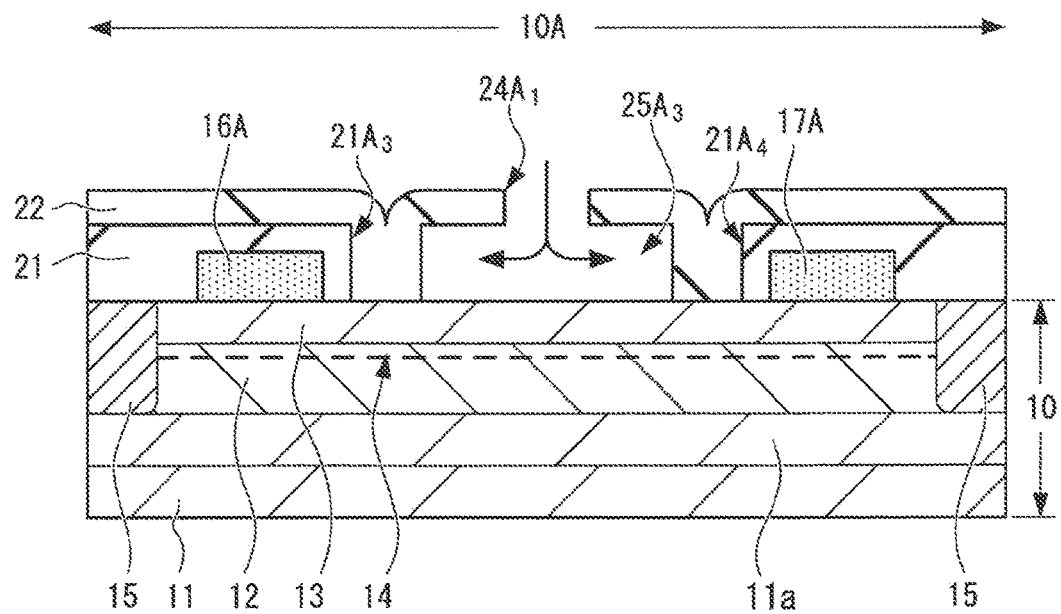
FIG. 36A is a process cross-sectional view continuing FIG. 35A.
Figure 36B:
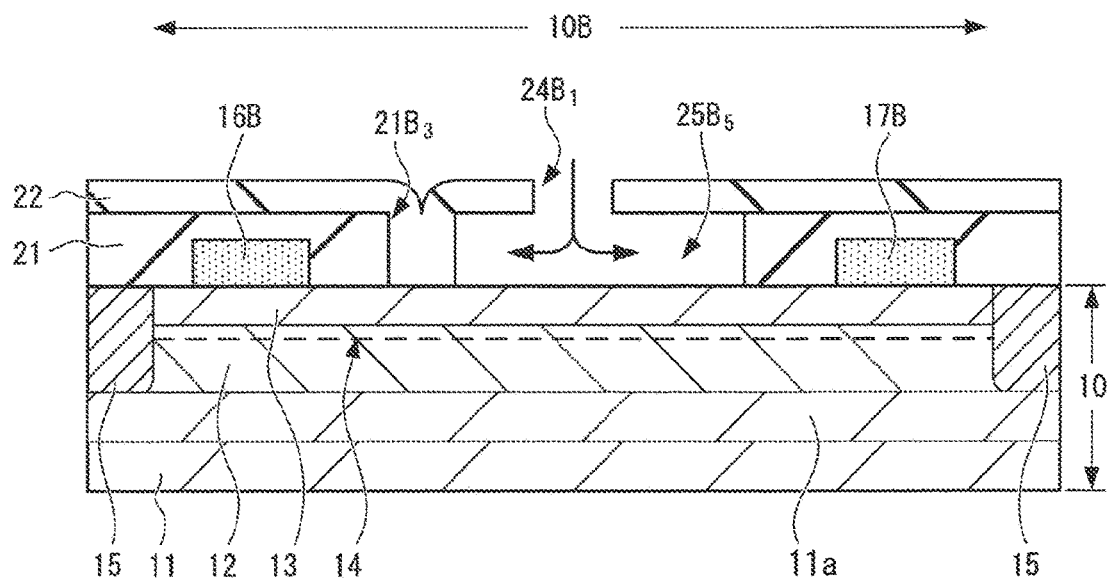
FIG. 36B is a process cross-sectional view continuing FIG. 35B.

Next, as shown in FIGS. 36A and 36B, the first cavity part 25A3 wider than the first opening 24A1 is formed by etching the first insulating film 21 on the first active region 10A of the semiconductor substrate 10 through the first opening 24A1, and the second cavity part 25B5 wider than the first cavity part 25A3 is formed by etching the first insulating film 21 on the second active region 10B of the semiconductor substrate 10 through the second opening 24B1.

The first cavity part 25A3 and the second cavity part 25B5 are formed by etching the first insulating film 21 by performing isotropic wet etching with less damage on the main surface of the semiconductor substrate 10, that is, the surface of the barrier layer 13. Wet etching of the first insulating film 21 is performed under conditions in which an etching selectivity with respect to the second insulating film 22 is obtained as in the above first embodiment.

In this process, since the second insulating film 22 having a high etching selectivity with respect to the first insulating film 21 is provided forward in the direction in which the first cavity part 25A3 extends, it is possible to prevent excessive extension of the first cavity part 25A3 in the width direction (lateral direction). In addition, since the second insulating film 22 having a high etching selectivity with respect to the first insulating film 21 is provided forward in the direction in which the second cavity part 25B5 extends, it is possible to prevent excessive extension of the second cavity part 25B5 in the width direction (lateral direction). That is, the width of the first cavity part 25A3 can be controlled according to the second insulating film 22 embedded into each of the pair of first stopper openings 21A3 and 21A4, and the width of the second cavity part 25B5 can be controlled according to the second insulating film 22 embedded into the second stopper opening 21B3.

Figure 37A:
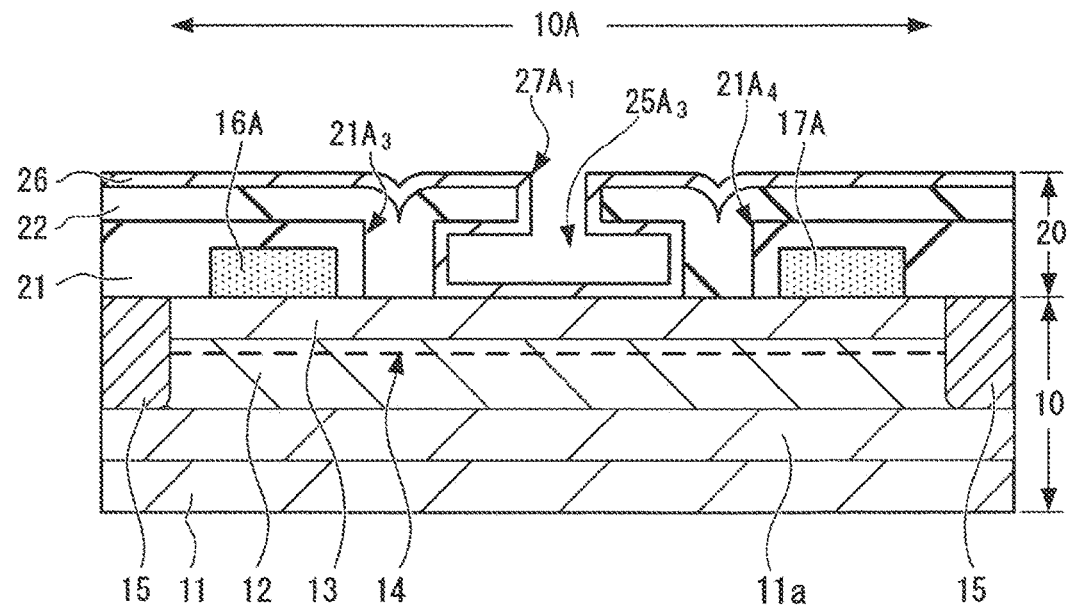
FIG. 37A is a process cross-sectional view continuing FIG. 36A.
Figure 37B:
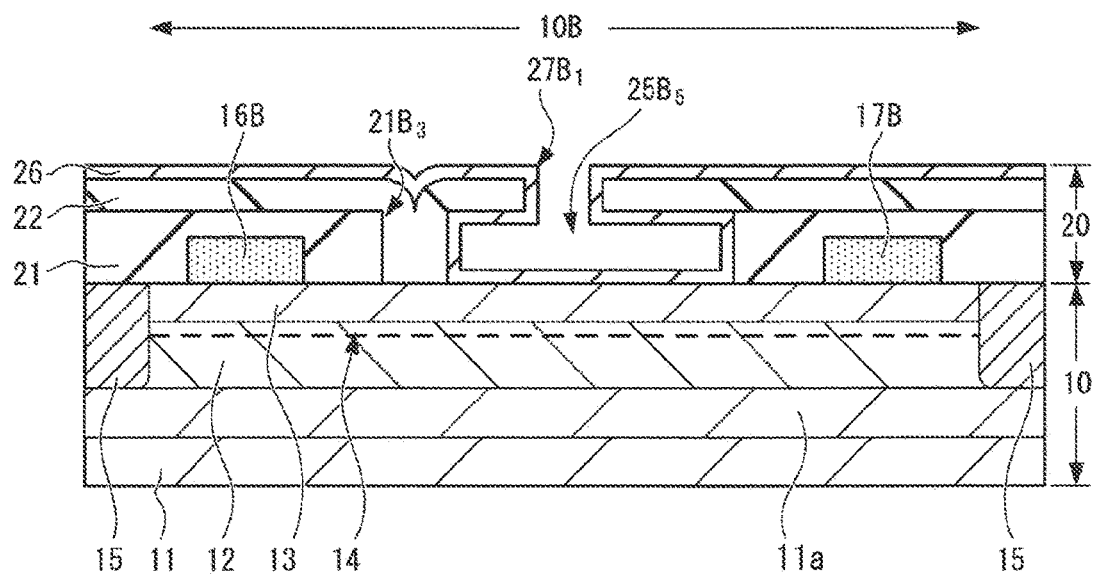
FIG. 37B is a process cross-sectional view continuing FIG. 36B.

Next, the same processes as the processes shown in FIGS. 14A and 14B in the above first embodiment 1 are performed, and as shown in FIGS. 37A and 37B, the third insulating film 26 that covers the first insulating film 21, the second insulating film 22, and the main surface of the semiconductor substrate 10 (the surface of the barrier layer 13) in the first cavity part 25A3 and the second cavity part 25B5, covers respective side walls in the first opening 24A1 and the second opening 24B1 of the second insulating film 22, and covers the second insulating film 22 is formed.

In this process, the insulating layer 20 including the first insulating film 21, the second insulating film 22 and the third insulating film 26 is formed on the first active region 10A and the second active region 10B of the semiconductor substrate 10.

In addition, in this process, since respective side walls in the first opening 24A1 and the second opening 24B2 of the second insulating film 22 are covered with the third insulating film 26, the first gate opening 27A1 having a narrower opening width than the first opening 24A1 is formed, and the second gate opening 27B1 having a narrower opening width than the second opening 24B1 is formed.

In addition, in this process, the first cavity part 25A3 and the second cavity part 25B5 are surrounded by the third insulating film 26. Here, since the third insulating film 26 is formed with an almost uniform film thickness, in the first cavity part 25A3 and the second cavity part 25B5 surrounded by the third insulating film 26, the width W2 (refer to FIG. 37B) of the second cavity part 25B5 is wider than the width W1 (refer to FIG. 37A) of the first cavity part 25A3.

Then, the same processes as in the above first embodiment are performed and the first gate electrode 31A and the second gate electrode 31B are formed, and thus the first field effect transistor Q7 shown in FIG. 32A is almost completed, and the second field effect transistor Q8 shown in FIG. 32B is almost completed.

After that, as in the above first embodiment, a wiring layer and other insulating layers are formed on the insulating layer 20, and thus the semiconductor device 1 according to the fifth embodiment is almost completed.

According to the method of producing the semiconductor device 1D of the fifth embodiment, the same effects as in the method of producing the semiconductor device 1 according to the first embodiment described above can be obtained.

In addition, according to the method of producing the semiconductor device 1D of the fifth embodiment, it is possible to form the bilaterally asymmetrical second cavity part $25B_5$ in which the width of the second part $25B_5$-R is wider than the width of the first part $25B_5$-L.

In addition, since the second cavity part $25B_5$ wider than the first cavity part $25A_3$ can be formed without using an etching mask, it is possible to reduce the number of production processes as compared with the above first embodiment and second embodiment, and it is possible to reduce the production cost of the semiconductor device 1D.

In addition, since the width of the first cavity part $25A_3$ can be controlled according to the separation distance of the second insulating film 22 embedded in each of the pair of first stopper openings $21A_3$ and $21A_4$, and the width of the second cavity part $25B_5$ can be controlled according to the second stopper opening $21B_3$, it is possible to freely set the widths of the first cavity part $25A_3$ and the second cavity part $25B_5$.

Here, in the above first embodiment to fifth embodiment, a case in which the pair of gate electrodes 16A and 17A and the pair of gate electrodes 16B and 17B are formed before the insulating layer 20 is formed has been described. However, the present technology is not limited thereto. For example, the present technology can also be applied to a case in which the pair of gate electrodes 16A and 17A, and the pair of gate electrodes 16B and 17B are formed after the insulating layer 20 is formed.

In addition, in the above first embodiment to fifth embodiment, the insulating layer 20, the first insulating layer 20A and the second insulating layer 20B which include the first insulating film 21, the second insulating film 22 and the third insulating film 23 have been described. However, the present technology is not limited thereto. For example, the present technology can be applied to a case in which the insulating layer includes the first insulating film 21 and the second insulating film 22 except for the third insulating film 23.

In addition, in the above first embodiment to fifth embodiment, respective layers on the upper part of the substrate 10 are formed of an AaN-based compound semiconductor. However, the present technology is not limited to such a configuration. For example, a compound semiconductor such as GaAs may be used or a semiconductor layer formed of silicon may be used.

Application Examples

Figure 38:
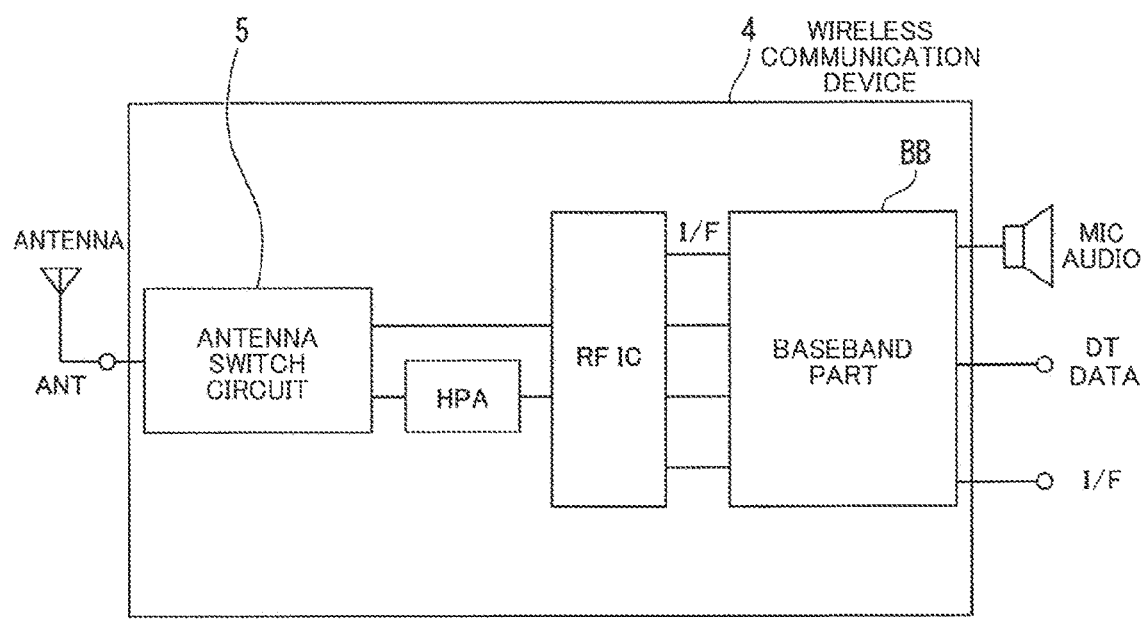
FIG. 38 is a block diagram showing an example of a configuration of a wireless communication device to which the semiconductor device of the present technology is applied.

FIG. 38 shows an example of a configuration of wireless communication device (a wireless communication device 4). The wireless communication device 4 is, for example, a mobile phone system having a plurality of functions such as audio and data communication and LAN connection. The wireless communication device 4 includes, for example, an antenna ANT, an antenna switch circuit 5, a high power amplifier HPA, a high frequency integrated circuit radio frequency integrated circuit (RFIC), a baseband part BB, an audio output unit MIC, a data output unit DT, and an interface part I/F (for example, wireless LAN (W-LAN; wireless local area network), and Bluetooth (registered trademark)). The high frequency integrated circuit RFIC and the baseband part BB are connected via an interface part I/F. For example, the antenna switch circuit 5 or the high power amplifier HPA includes any of the semiconductor devices 1, 1A, and 1B.

In the wireless communication device 4, during transmission, that is, when a transmission signal is output from a transmission system of the wireless communication device 4 to the antenna ANT, the transmission signal output from the baseband part BB is output to the antenna ANT via the high frequency integrated circuit RFIC, the high power amplifier HPA, and the antenna switch circuit 5.

During reception, that is, when a signal received by the antenna ANT is input to a reception system of the wireless communication device, the received signal is input to the baseband part BB via the antenna switch circuit 5 and the high frequency integrated circuit RFIC. The signal processed by the baseband part BB is output from an output unit such as an audio output unit MIC, a data output unit DT, and an interface part I/F.

The wireless communication device 4 includes at least any of the above semiconductor devices 1, and 1A to 1D.

Here, the present technology may have the following configurations.

(1)
A semiconductor device including,
a first field effect transistor and a second field effect transistor mounted on a semiconductor substrate, and an insulating layer provided on a main surface of the semiconductor substrate,
wherein each of the first field effect transistor and the second field effect transistor includes
a pair of main electrodes which are separated from each other and provided on the main surface of the semiconductor substrate,
a cavity part which is provided in the insulating layer between the pair of main electrodes, and
a gate electrode which has a head part positioned on the insulating layer and a body part that penetrates the insulating layer from the head part and protrudes toward the cavity part and in which the head part is wider than the body part, and
wherein the width of the cavity part of the second field effect transistor is different from the width of the cavity part of the first field effect transistor.

(2)
The semiconductor device according to (1),
wherein the cavity part is provided on both sides of the gate electrode in a gate length direction.

(3)
The semiconductor device according to (1) or (2),
wherein the cavity part is provided bilaterally symmetrically on both sides of the gate electrode in a gate length direction.

(4)
The semiconductor device according to (1) or (2),
wherein the cavity part of the first field effect transistor is provided bilaterally symmetrically on both sides of the gate electrode in a gate length direction, and
wherein the cavity part of the second field effect transistor is provided bilaterally asymmetrically on both sides of the gate electrode in the gate length direction.

(5)
The semiconductor device according to any one of (1) to (4),
wherein the insulating layer includes a first insulating film provided on the main surface of the semiconductor substrate, a second insulating film provided on the first insulating film, and a third insulating film that covers the first insulating film, the second insulating film, and the main surface of the semiconductor substrate in the cavity part, and
wherein the gate electrode is arranged on the main surface of the semiconductor substrate with the third insulating film therebetween.

(6)
The semiconductor device according to any one of (1) to (5),
wherein a separation distance between the pair of main electrodes of the second field effect transistor is longer than a separation distance between the pair of main electrodes of the first field effect transistor.

(7)
An electronic device, including,
a semiconductor device which includes
a first field effect transistor and a second field effect transistor mounted on a semiconductor substrate, and an insulating layer provided on a main surface of the semiconductor substrate,
wherein each of the first field effect transistor and the second field effect transistor includes
a pair of main electrodes which are separated from each other and provided on the main surface of the semiconductor substrate,
a cavity part which is provided in the insulating layer between the pair of main electrodes, and
a gate electrode which has a head part positioned on the insulating layer and a body part that penetrates the insulating layer from the head part and protrudes toward the cavity part and in which the head part is wider than the body part,
wherein the width of the cavity part of the second field effect transistor is different from the width of the cavity part of the first field effect transistor.

(8)

A method of producing a semiconductor device, including:

forming a second insulating film on a first active region on a main surface of a semiconductor substrate and on a second active region different from the first active region with a first insulating film therebetween;

forming a first opening in the second insulating film on the first active region and forming a second opening in the second insulating film on the second active region;

forming a first cavity part wider than the first opening by etching the first insulating film through the first opening, and forming a second cavity part wider than the second opening by etching the first insulating film through the second opening; and extending the width of the second cavity part by selectively etching the first insulating film through the second opening.

(9)

The method of producing a semiconductor device according to (8), wherein the first insulating film is etched through the second opening when the first opening is selectively covered with a mask.

(10)

The method of producing a semiconductor device according to (8), wherein the second insulating film is etched through the second opening when the first opening is covered with a mask and a part of each of the second opening and the second cavity part in a width direction is filled with the mask.

(11)

The method of producing a semiconductor device according to any one of (8) to (10), wherein the second insulating film is an insulating film having a high etching selectivity with respect to the first insulating film.

(12)

The method of producing a semiconductor device according to any one of (8) to (11), wherein etching of the first insulating film is performed by wet etching in which an etching selectivity with respect to the second insulating film is obtained.

(13)

A method of producing a semiconductor device, including:

forming a second insulating film on a first active region of a main surface of a semiconductor substrate and on a second active region different from the first active region with a first insulating film therebetween;

forming a first opening in the second insulating film on the first active region and forming a second opening and a third opening adjacent to each other in the second insulating film on the second active region;

forming a first cavity part wider than the first opening by etching the first insulating film through the first opening, and forming a second cavity part wider than the first cavity part by etching the first insulating film through the second opening and the third opening.

(14)

The method of producing a semiconductor device according to (13), wherein the second insulating film is an insulating film having a high etching selectivity with respect to the first insulating film.

(15)

The method of producing a semiconductor device according to (13) or (14), wherein etching of the first insulating film is performed by wet etching in which a selectivity with respect to the second insulating film is obtained.

(16)

A method of producing a semiconductor device, including forming a second insulating film on a first active region on a main surface of a semiconductor substrate and on a second active region different from the first active region with a first insulating film therebetween;

forming a pair of first etching stopper parts on one end side and the other end side of the first insulating film on the first active region in a width direction, and forming a pair of second etching stopper parts which are provided on one end side and the other end side of the first insulating film on the second active region in the width direction and between which a separation distance is longer than a separation distance between the pair of first etching stopper parts;

forming a first opening in the second insulating film on the first active region and forming a second opening in the second insulating film on the second active region; and forming a first cavity part wider than the first opening by etching the first insulating film through the first opening, and forming a second cavity part wider than the first cavity part by etching the first insulating film through the second opening.

(17)

The method of producing a semiconductor device according to (16), wherein the pair of first etching stopper parts and the pair of second etching stopper parts are formed by performing a heat treatment on the first insulating film.

(18)

The method of producing a semiconductor device according to (16) or (17), wherein the second insulating film is an insulating film having a high etching selectivity with respect to the first insulating film.

(19)

The method of producing a semiconductor device according to any one of (16) to (18), wherein etching of the first insulating film is performed by wet etching in which a selectivity with respect to the second insulating film is obtained.

(20)

A method of producing a semiconductor device, including:

forming a first insulating film on a first active region of a main surface of a semiconductor substrate and on a second active region different from the first active region;

forming a pair of first stopper openings that are separated from each other in the first insulating film on the first active region, and forming a second stopper opening in the first insulating film on the second active region;

forming a second insulating film on the first active region and on the second active region with the first insulating film therebetween to embed the insides of the pair of first stopper openings and the inside of the second stopper opening;

forming a first opening in the insulating film between the pair of stopper openings, and forming a second opening adjacent to the second stopper opening in the second insulating film on the second active region; and forming a first cavity part wider than the first opening by etching the first insulating film through the first opening, and forming a second cavity part wider than the first cavity part by etching the second insulating film through the second opening.

(21)

The method of producing a semiconductor device according to (20), wherein the second insulating film is an insulating film having a high etching selectivity with respect to the first insulating film.

(22)

The method of producing a semiconductor device according to (20) or (21), wherein etching of the first insulating film is performed by wet etching in which a selectivity with respect to the second insulating film is obtained.

The scope of the present technology is not limited to the illustrated and described exemplary embodiments, but includes all embodiments that provide equivalent effects sought after with the present technology. In addition, the scope of the present technology is not limited to combinations of features of the invention defined by the claims, but can be defined by any desired combination of specific features among all disclosed features.

REFERENCE SIGNS LIST

1 Semiconductor device
2 Semiconductor chip
10 Semiconductor substrate
11 Substrate
12 Buffer layer
13 Barrier layer
14 Two dimensional electron gas layer
15 Inactive region
16A, 17A Pair of first main electrodes (source electrode and drain electrode)
16B, 17B Pair of second main electrodes (source electrode and drain electrode)
20 Insulating layer
20A First insulating layer
20B Second insulating layer
21 First insulating film
$21A_1$, $21A_2$ First etching stopper part
$21B_1$, $21B_2$ Second etching stopper part
$21A_3$, $21A_4$ Opening for first stopper
$21B_3$ Opening for second stopper
22 Second insulating film
23 Third insulating film
$24A_1$ First opening
$24B_1$ Second opening
$24C_1$ Third opening
$25A_1$, $25A_2$, $25A_3$ First cavity part
$25B_1$, $25B_2$, $25B_3$, $25B_4$, $25B_5$ Second cavity part
26 Third insulating film
$27A_1$ First gate opening
27B1 Second gate opening
30 Gate material
31A First gate electrode
31B Second gate electrode
$31a_1$, $31b_1$ Head part
$31a_2$, $31b_2$ Body part
SW High frequency switch part
BPF High frequency filter part
PA High frequency power amplifier part
LNA Low noise amplifier part
Q1, Q5, Q7 First field effect transistor
Q2, Q3, Q4, Q6, Q8 Second field effect transistor
RM1, RM2 Mask

The invention claimed is:

1. A semiconductor device, comprising
a first field effect transistor and a second field effect transistor mounted on a semiconductor substrate; and
an insulating layer provided on a main surface of the semiconductor substrate,
wherein each of the first field effect transistor and the second field effect transistor includes
a pair of main electrodes which are separated from each other and provided on the main surface of the semiconductor substrate,
a cavity part which is provided in the insulating layer between the pair of main electrodes, and
a gate electrode which has a head part positioned on the insulating layer and a body part that penetrates the insulating layer from the head part and protrudes toward the cavity part and in which the head part is wider than the body part, and
wherein a width of the cavity part of the second field effect transistor is different from a width of the cavity part of the first field effect transistor.

2. The semiconductor device according to claim 1, wherein the cavity part is provided on both sides of the gate electrode in a gate length direction.

3. The semiconductor device according to claim 1, wherein the cavity part is provided bilaterally symmetrically on both sides of the gate electrode in a gate length direction.

4. The semiconductor device according to claim 1, wherein the cavity part of the first field effect transistor is provided bilaterally symmetrically on both sides of the gate electrode in a gate length direction, and
wherein the cavity part of the second field effect transistor is provided bilaterally asymmetrically on both sides of the gate electrode in the gate length direction.

5. The semiconductor device according to claim 1, wherein the insulating layer includes a first insulating film provided on the main surface of the semiconductor substrate, a second insulating film provided on the first insulating film, and a third insulating film that covers the first insulating film, the second insulating film, and the main surface of the semiconductor substrate in the cavity part, and
wherein the gate electrode is arranged on the main surface of the semiconductor substrate with the third insulating film therebetween.

6. The semiconductor device according to claim 1, wherein a separation distance between the pair of main electrodes of the second field effect transistor is longer than a separation distance between the pair of main electrodes of the first field effect transistor.

7. An electronic device, comprising:
a semiconductor device which includes
a first field effect transistor and a second field effect transistor mounted on a semiconductor substrate; and
an insulating layer provided on a main surface of the semiconductor substrate, wherein each of the first field effect transistor and the second field effect transistor includes
a pair of main electrodes which are separated from each other and provided on the main surface of the semiconductor substrate,
a cavity part which is provided in the insulating layer between the pair of main electrodes, and
a gate electrode which has a head part positioned on the insulating layer and a body part that penetrates the insulating layer from the head part and protrudes toward the cavity part and in which the head part is wider than the body part, wherein a width of the cavity part of the second field effect transistor is different from a width of the cavity part of the first field effect transistor.

8. A method of producing a semiconductor device, the method comprising:
forming a second insulating film on a first active region on a main surface of a semiconductor substrate and on a second active region different from the first active region with a first insulating film therebetween;
forming a first opening in the second insulating film on the first active region and forming a second opening in the second insulating film on the second active region;
forming a first cavity part wider than the first opening by etching the first insulating film through the first opening, and forming a second cavity part wider than the second opening by etching the first insulating film through the second opening; and
extending a width of the second cavity part by selectively etching the first insulating film through the second opening.

9. The method of producing the semiconductor device according to claim 8,
wherein the first insulating film is etched through the second opening when the first opening is selectively covered with a mask.

10. The method of producing the semiconductor device according to claim 8, wherein the second insulating film is etched through the second opening when the first opening is covered with a mask and a part of each of the second opening and the second cavity part in a width direction is filled with the mask.

11. The method of producing the semiconductor device according to claim 8, wherein the second insulating film is an insulating film having a high etching selectivity with respect to the first insulating film.

12. The method of producing the semiconductor device according to claim 8, wherein etching of the first insulating film is performed by wet etching in which an etching selectivity with respect to the second insulating film is obtained.

13. A method of producing a semiconductor device, the method comprising:
forming a second insulating film on a first active region of a main surface of a semiconductor substrate and on a second active region different from the first active region with a first insulating film therebetween;
forming a pair of first etching stopper parts on one end side and the other end side of the first insulating film on the first active region in a width direction, and forming a pair of second etching stopper parts which are provided on one end side and the other end side of the first insulating film on the second active region in the width direction and between which a separation distance is longer than a separation distance between the pair of first etching stopper parts;
forming a first opening in the second insulating film on the first active region and forming a second opening in the second insulating film on the second active region; and
forming a first cavity part wider than the first opening by etching the first insulating film through the first opening, and forming a second cavity part wider than the first cavity part by etching the first insulating film through the second opening.

14. The method of producing the semiconductor device according to claim 13, wherein the pair of first etching stopper parts and the pair of second etching stopper parts are formed by performing a heat treatment on the first insulating film.

15. The method of producing the semiconductor device according to claim 13, wherein the second insulating film is formed of an insulation material having a high etching selectivity with respect to the first insulating film.

16. The method of producing the semiconductor device according to claim 13, wherein etching of the first insulating film is performed by wet etching in which a selectivity with respect to the second insulating film is obtained.

* * * * *